(12) United States Patent
Lin et al.

(10) Patent No.: US 12,027,521 B2
(45) Date of Patent: Jul. 2, 2024

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Shih-Yao Lin, New Taipei (TW); Chieh-Ning Feng, Taichung (TW); Hsiao Wen Lee, Hsinchu (TW); Chao-Cheng Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 10 days.

(21) Appl. No.: 17/199,566

(22) Filed: Mar. 12, 2021

(65) Prior Publication Data
US 2022/0293594 A1 Sep. 15, 2022

(51) Int. Cl.
*H01L 27/088* (2006.01)
*H01L 21/8234* (2006.01)
*H01L 29/423* (2006.01)
*H01L 29/66* (2006.01)
*H01L 29/78* (2006.01)

(52) U.S. Cl.
CPC .. *H01L 27/0886* (2013.01); *H01L 21/823431* (2013.01); *H01L 21/823481* (2013.01); *H01L 29/42372* (2013.01); *H01L 29/66545* (2013.01); *H01L 29/785* (2013.01)

(58) Field of Classification Search
CPC ............ H01L 29/66545; H01L 29/785; H01L 21/823481; H01L 21/823878; H01L 27/0886
See application file for complete search history.

(56) References Cited

U.S. PATENT DOCUMENTS

| | | | |
|---|---|---|---|
| 2016/0181425 A1* | 6/2016 | Bai | H01L 27/1211 |
| | | | 438/283 |
| 2016/0336320 A1* | 11/2016 | Lin | H01L 27/0924 |
| 2019/0067120 A1* | 2/2019 | Ching | H01L 21/823431 |
| 2020/0357896 A1* | 11/2020 | Cheng | H01L 27/0886 |

* cited by examiner

*Primary Examiner* — Tuan A Hoang
(74) *Attorney, Agent, or Firm* — FOLEY & LARDNER LLP

(57) ABSTRACT

A semiconductor device includes a dielectric fin between a first semiconductor channel and a second semiconductor channel. The semiconductor device includes a first gate structure. The first gate structure includes a first portion and a second portion separated from each other by the dielectric fin. The semiconductor device includes a first gate spacer that extends along sidewalls of the first portion of the first gate structure. The semiconductor device includes a second gate spacer that extends along sidewalls of the second portion of the first gate structure. At least one of the first gate spacer or second gate spacer has a first portion with a first thickness and a second portion with a second thickness less than the first thickness, and wherein the first portion is closer to the dielectric fin than the second portion.

20 Claims, 44 Drawing Sheets

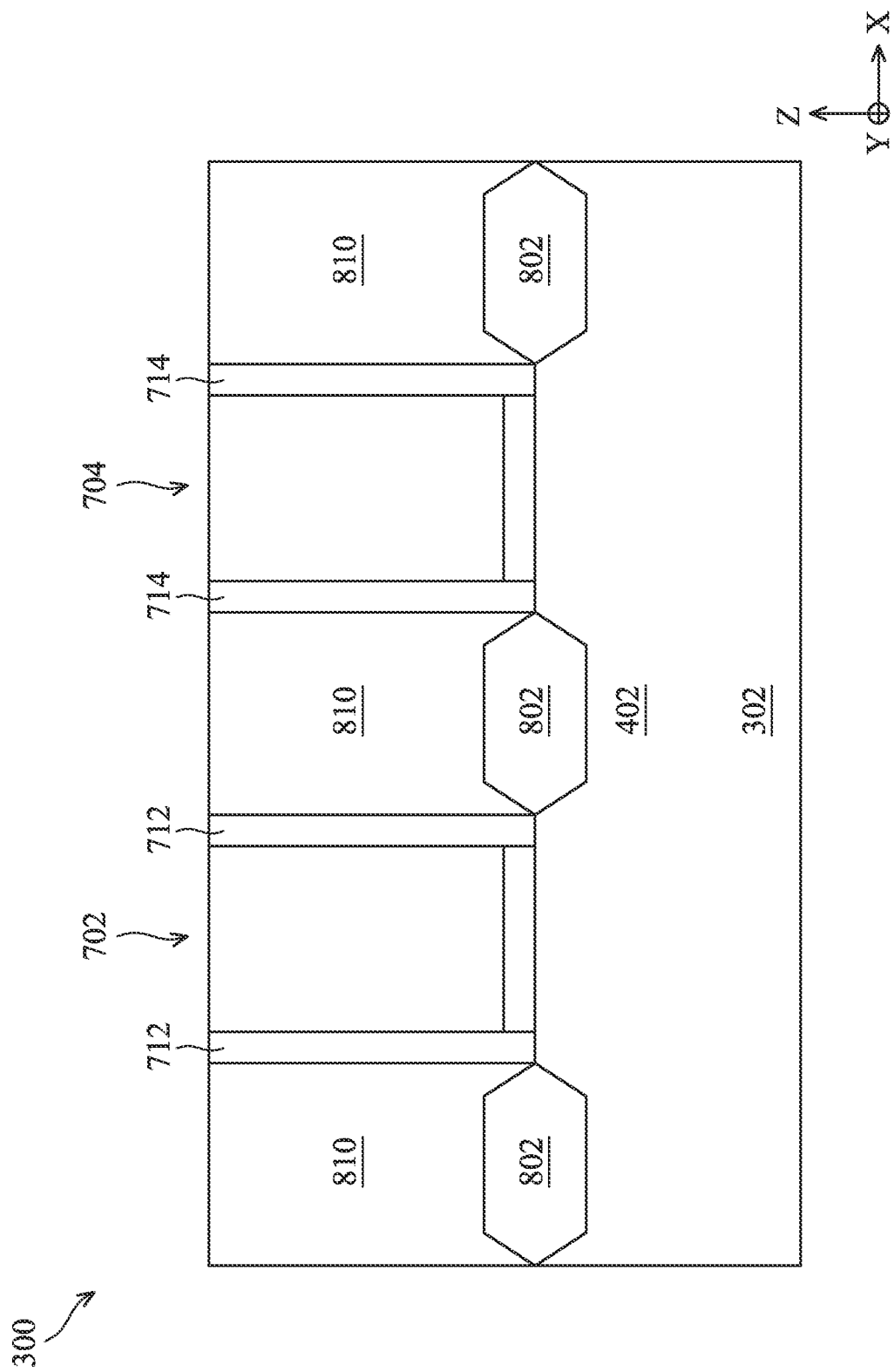

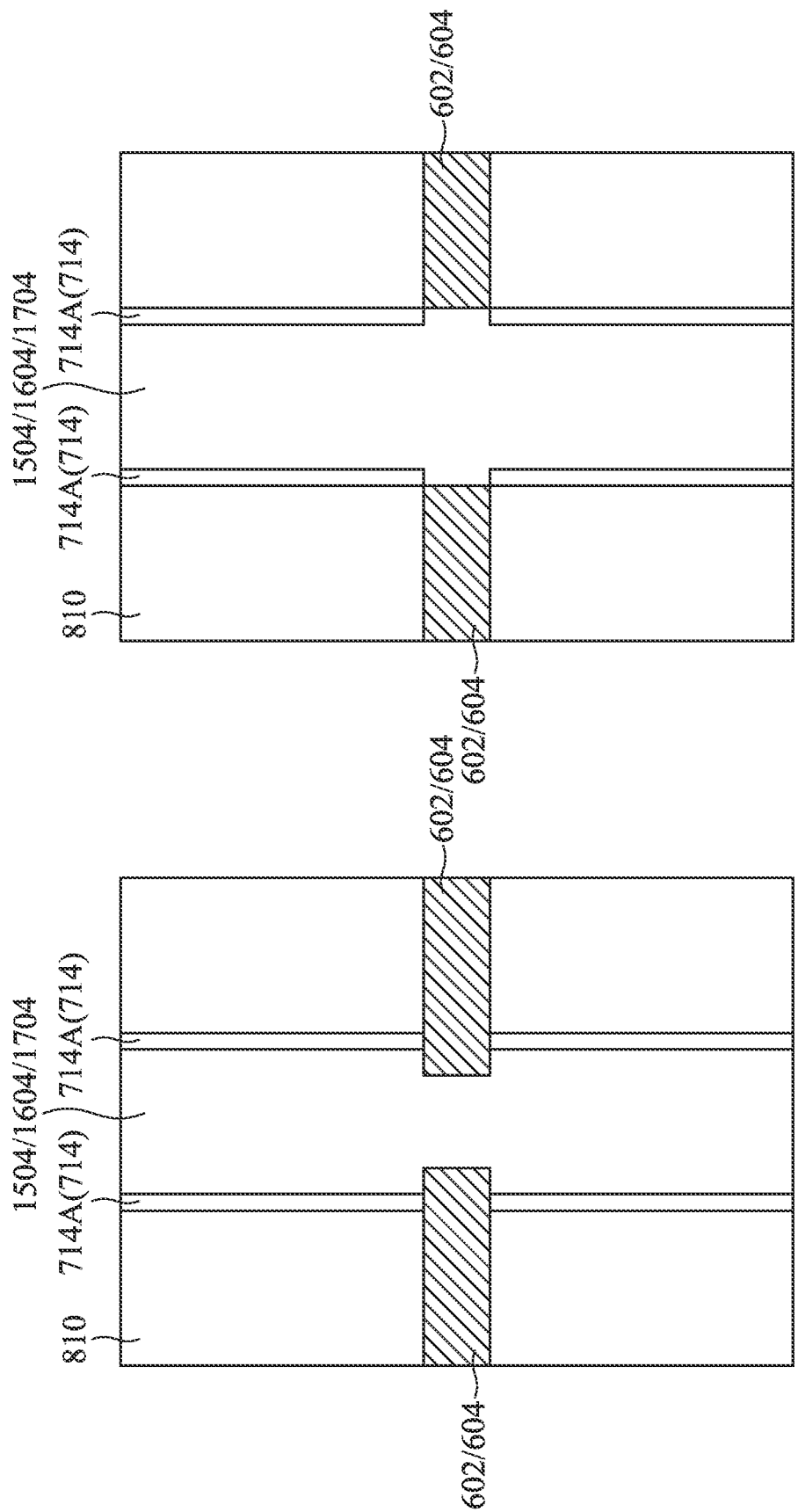

SEMICONDUCTOR DEVICES AND METHODS OF MANUFACTURING THEREOF

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 3B, 4A, 4B, 5A, 5B, 6A, 6B, 7A, 7B, 7C, 8A, 8B, 8C, 9A, 9B, 10A, 10B, 11A, 11B, 12A, 12B, 12C, 12D, 13A, 13B, 13C, 13D, 14A, 14B, 14C, 14D, 15A, 15B, 16A, 16B, 17A, and 17B illustrate cross-sectional views of an example FinFET device (or a portion of the example FinFET device) during various fabrication stages, made by the method of FIG. 2, in accordance with some embodiments.

FIGS. 18A, 18B, 19A, 19B, 20A, 20B, and 20C illustrate enlarged, cross-sectional views of the example FinFET device of FIGS. 3A-17B, in accordance with some other embodiments.

DETAILED DESCRIPTION

Figure 1:
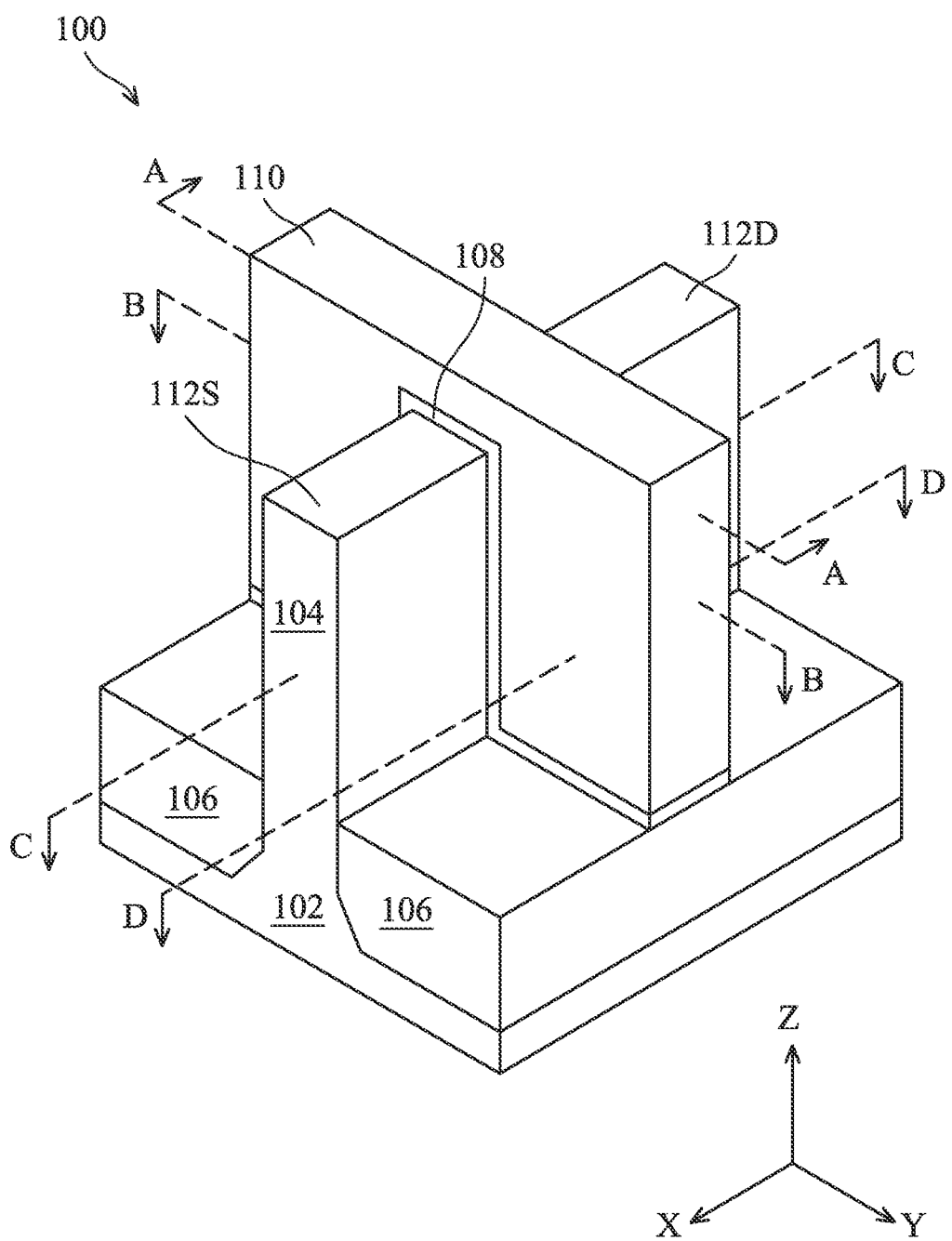
FIG. 1 illustrates a perspective view of a fin-based field-effect-transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In advanced technology nodes, a number of dummy fins can each be disposed next to one or more active channels (e.g., formed as a fin-like structure or a stack of channel layers) to improve the overall design and fabrication of an integrated circuit. The dummy fins generally stay inactive or electrically non-functional, when the integrated circuit is appropriately configured and powered. Over a substrate of the integrated circuit, some of the dummy fins can each be configured to electrically isolate the active (e.g., metal) gate structures of plural transistors that adopt respective active channels. Each of such transistors may have a single active gate structure (sometimes referred to as an "isolated gate") controlling a corresponding active channel. Some of the dummy fins can each be further patterned (e.g., cut), which allows the active gate structure (sometimes referred to as a "sharing gate") of a single transistor to control multiple channels.

In existing technologies, the dummy fin disposed below a sharing gate is typically patterned based on the opening of a mask layer, while the dummy fin disposed between isolated gates are covered by said mask layer. However, due to the continuously shrinking dimensions of device features, dimensions of the opening are forced to shrink accordingly. Consequently, a process window to form such sharing gates and isolated gates is disadvantageously reduced, which can significantly lower the fabrication yield. For example, line width roughness (LWR) and/or line edge roughness (LER) of the opening may be challenging to control within a desired threshold.

Embodiments of the present disclosure are discussed in the context of forming a non-planar field-effect-transistor (FET) device (e.g., a fin-based FET device, a gate-all-around (GAA) FET device, etc.), and in particular, in the context of forming active gates for a number of non-planar transistors. The active gates can be separated by one or more isolation structures (e.g., dummy fins). Different from the existing technologies, a mask layer, as disclosed herein, can cover the portions of a workpiece that are desired to form isolated gates, while exposing the portions of the workpiece that are desired to form sharing gates. The mask layer can be significantly less subjected to the overall shrinking dimensions of device features. In this way, a process window to form such sharing gates and isolated gates can be advantageously enlarged, which can in turn increase the fabrication yield. Further, without proportionally shrinking with the overall dimensions, the mask layer can have flat edges, and these flat edges can align with the portions of the dummy fins to be patterned. As such, various parameters (e.g., LWR, LER) of the mask layer can be well controlled within the desire thresholds.

FIG. 1 illustrates a perspective view of an example FinFET device 100, in accordance with various embodiments. The FinFET device 100 includes a substrate 102 and a semiconductor fin 104 protruding above the substrate 102. Isolation regions 106 are formed on opposing sides of the semiconductor fin 104, with the semiconductor fin 104 protruding from the isolation regions 106. A gate dielectric 108 is along sidewalls and over a top surface of the semiconductor fin 104, and a gate 110 is over the gate dielectric 108. Source region 112S and drain region 112D are in (or extended from) the semiconductor fin 104 and on opposing sides of the gate dielectric 108 and the gate 110.

FIG. 1 is provided as a reference to illustrate a number of cross-sections in subsequent figures. For example, cross-section A-A is cut across the gate 110 and above the source region 112S and drain region 112D; cross-section B-B is cut along a longitudinal direction of the gate 110; cross-section C-C is cut along a longitudinal direction of the semiconductor fin 104; and cross-section D-D, parallel with cross-section C-C, is cut along a longitudinal direction of an adjacent fin, e.g., a dummy fin, which will be discussed below. Cross-section A-A may expand over the X axis and Y axis; cross-section B-B may expand over the Y axis and Z axis; and cross-section C-C and D-D may each expand over the X axis and Z axis. At least some of the subsequent figures refer to these reference cross-sections and/or reference axes for clarity.

Figure 2:
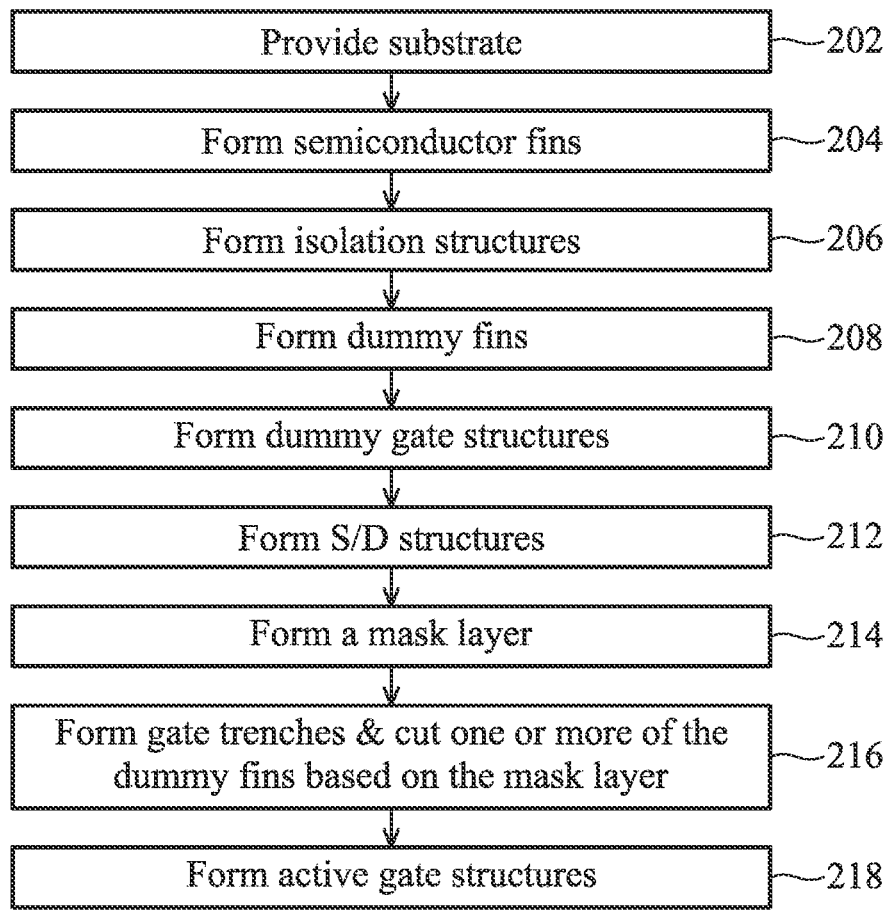
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device (e.g., FinFET device 100), a gate-all-around (GAA) FET device, a nanosheet transistor device, a nanowire transistor device, a vertical transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with top or cross-sectional views of an example FinFET device at various fabrication stages as shown in FIGS. 3A, 3B, 4A, 4B, 5A, 5B, 6A, 6B, 7A, 7B, 7C, 8A, 8B, 8C, 9A, 9B, 10A, 10B, 11A, 11B, 12A, 12B, 12C, 12D, 13A, 13B, 13C, 13D, 14A, 14B, 14C, 14D, 15A, 15B, 16A, 16B, 17A, and 17B, respectively, which will be discussed in further detail below.

In brief overview, the method 200 starts with operation 202 of providing a substrate. The method 200 continues to operation 204 of forming a number of semiconductor fins. The method 200 continues to operation 206 of forming one or more isolation structures. The method 200 continues to operation 208 of forming a number of dummy fins. The method 200 continues to operation 210 of forming a number of dummy gate structures. The method 200 continues to operation 212 of forming a number of source/drain structures. The method 200 continues to operation 214 of forming a mask layer covering a portion of at least one of the dummy fins that will remain. The method 200 continues to operation 216 of forming a number of gate trenches and cutting one or more of the dummy fins based on the mask layer. The method 200 continues to operation 218 of forming a number of active gate structures.

As mentioned above, FIGS. 3-17B each illustrate, in a top or cross-sectional view, a portion of a FinFET device 300 at various fabrication stages of the method 200 of FIG. 2. The FinFET device 300 is similar to the FinFET device 100 shown in FIG. 1, but with certain additional features/structures/regions. For example, the following figures of the FinFET device 300 include a number of dummy fin structures, more than one semiconductor fins, a number of dummy gate structures, etc. Further, it should be understood the FinFET device 300 may further include a number of other devices (not shown in the following figures) such as inductors, fuses, capacitors, coils, etc., while remaining within the scope of the present disclosure.

Figure 3A:
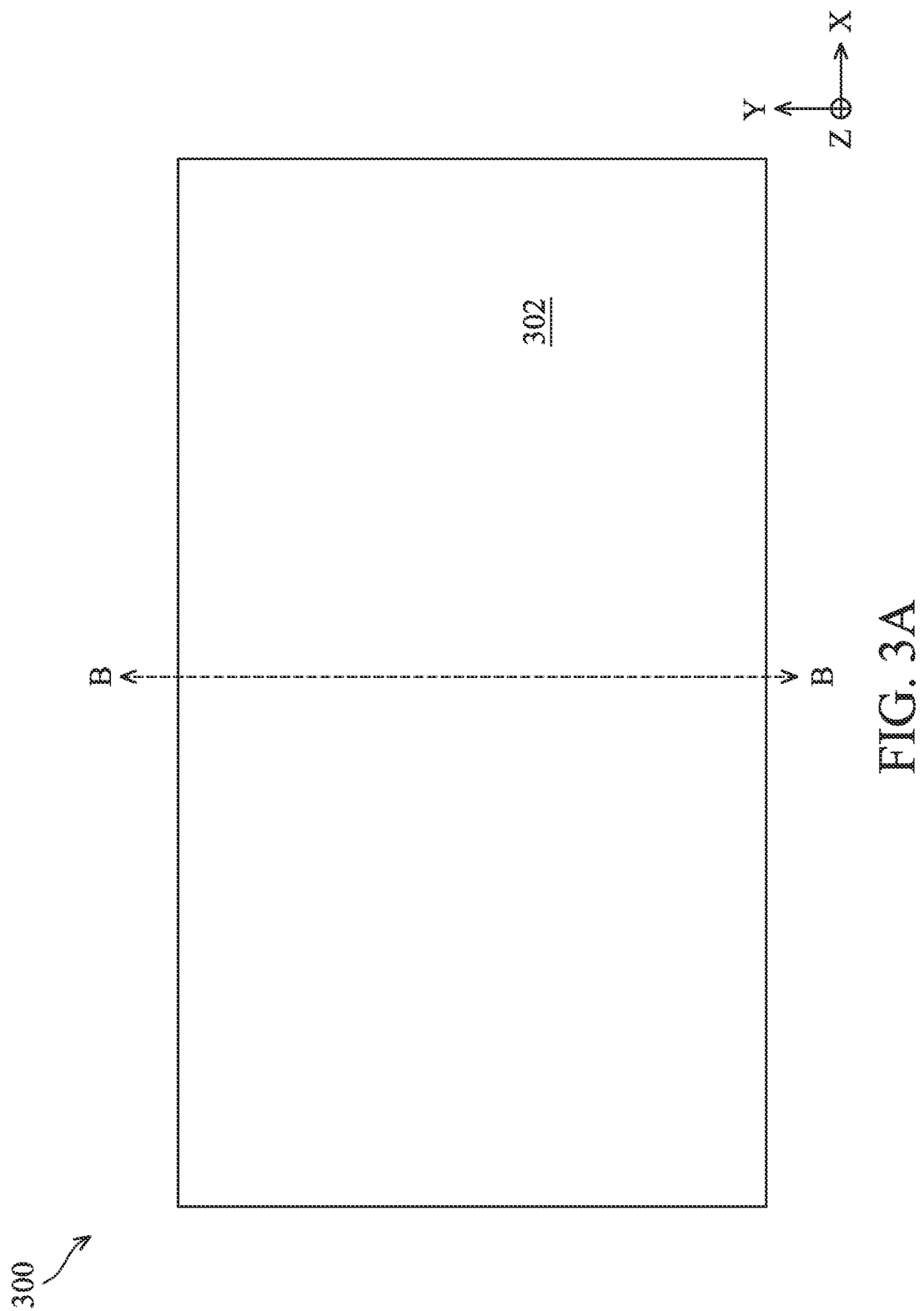
Figure 3B:
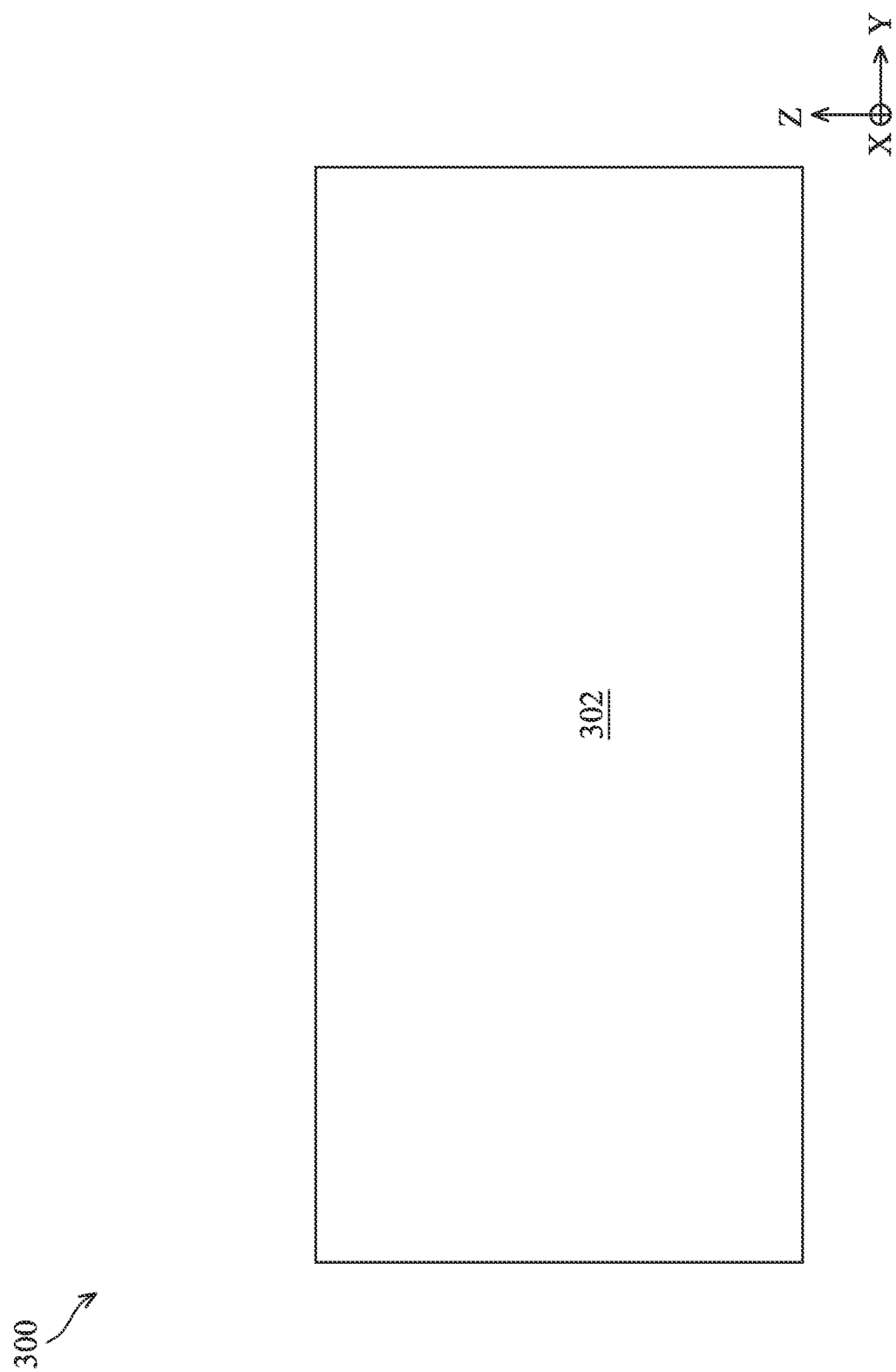

Corresponding to operation 202 of FIG. 2, FIG. 3A is a cross-sectional view of the FinFET device 300 including a semiconductor substrate 302 at one of the various stages of fabrication, in accordance with various embodiments. The cross-sectional view of FIG. 3A is cut along cross-section A-A, as indicated in FIG. 1. Further, FIG. 3B is a cross-sectional view of the FinFET device 300 cut in a direction along the lengthwise direction of an active/dummy gate structure of the FinFET device 300 (e.g., cross-section B-B indicated in FIG. 1 and FIG. 3A).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4A:
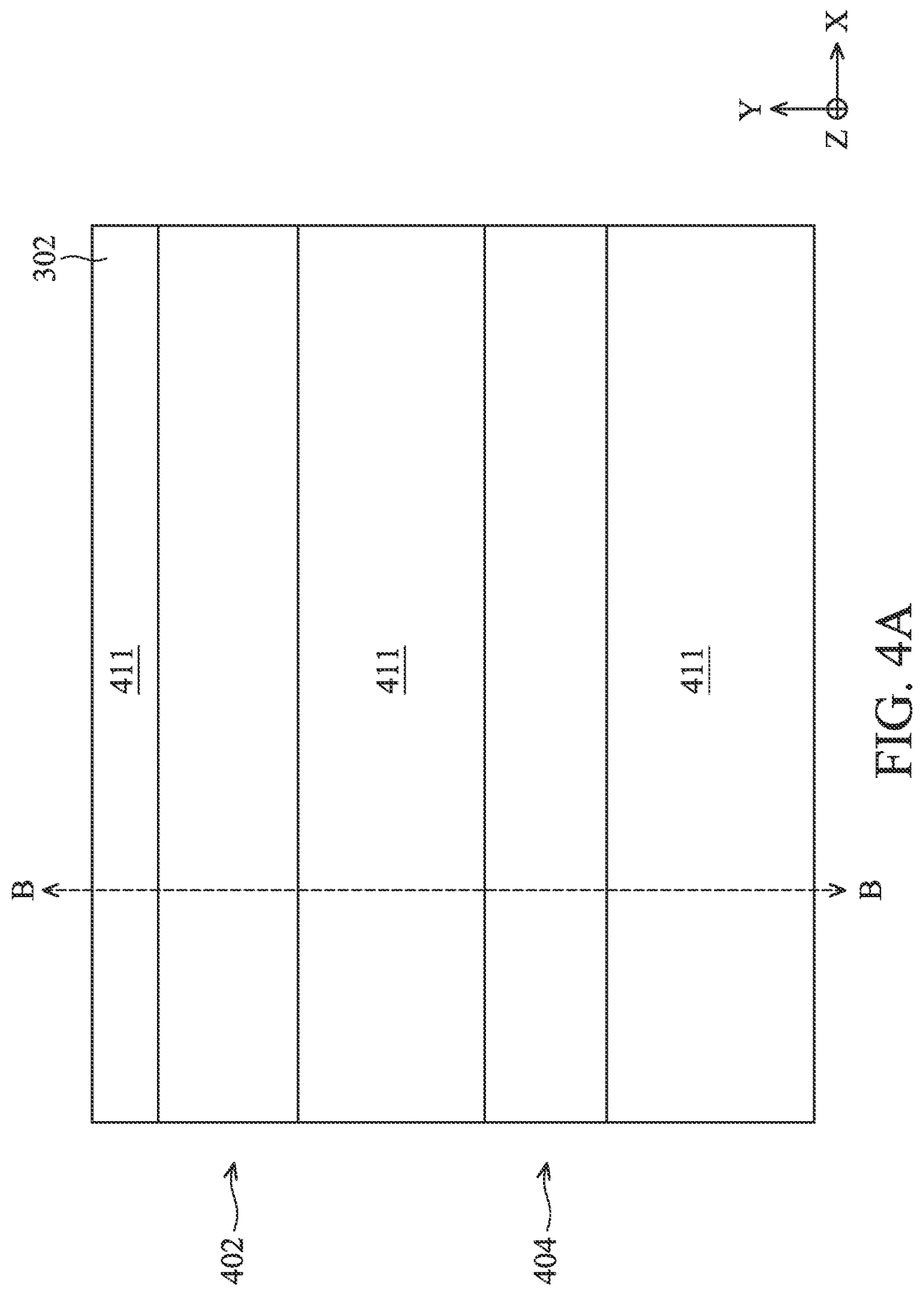
Figure 4B:
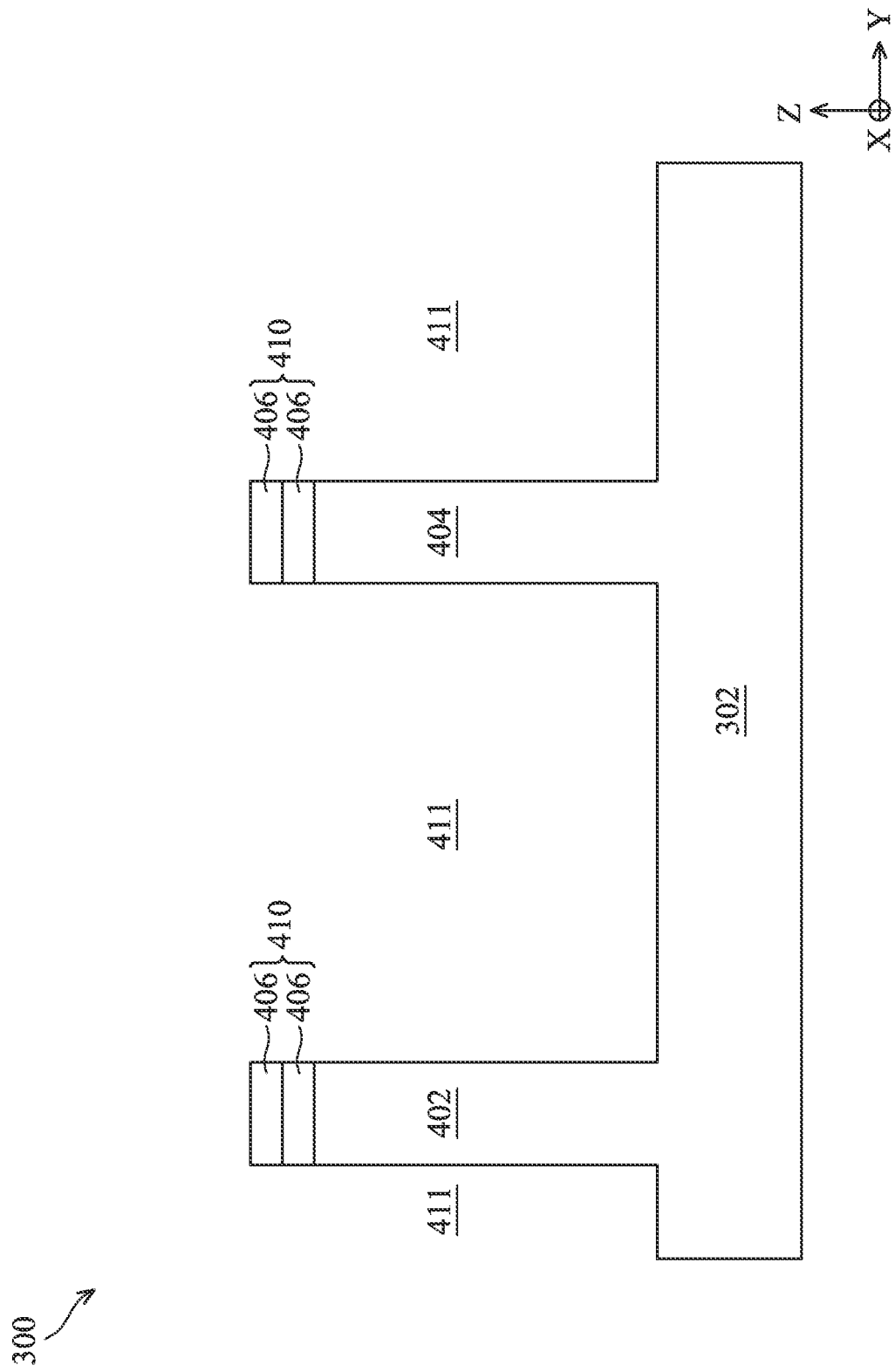

Corresponding to operation 204 of FIG. 2, FIG. 4A is a cross-sectional view of the FinFET device 300 including semiconductor fins 402 and 404 at one of the various stages of fabrication, in accordance with various embodiments. The cross-sectional view of FIG. 4A is cut along cross-section A-A, as indicated in FIG. 1. Further, FIG. 4B is a cross-sectional view of the FinFET device 300 cut in a direction along the lengthwise direction of an active/dummy gate structure of the FinFET device 300 (e.g., cross-section B-B indicated in FIG. 1 and FIG. 4A). Each of the semiconductor fins 402-404 may be configured as the channels of one or more active transistors. Accordingly, the semiconductor fins 402 and 404 may sometimes be referred to as semiconductor channels 402 and 404, respectively.

The semiconductor fin 402 and 404 are formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. Although only one pad nitride layer 408 is illustrated, a multilayer structure (e.g., a layer of silicon oxide on a layer of silicon nitride) may be formed as the pad nitride layer 408. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4B.

The patterned mask 410 is subsequently used to pattern exposed portions of the substrate 302 to form trenches (or openings) 411, thereby defining the semiconductor fin 402 and 404 between adjacent trenches 411 as illustrated in FIGS. 4A-B. When multiple fin structures are formed, such a trench may be disposed between any adjacent ones of the fin structures. In some embodiments, the semiconductor fins 402-404 are formed by etching trenches in the substrate 302 using, for example, reactive ion etch (ME), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the semiconductor fins 402-404.

The semiconductor fins 402-404 may be patterned by any suitable method. For example, the semiconductor fins 402-404 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

FIGS. 3A through 4B illustrate an embodiment of forming the semiconductor fins 402-404, but a semiconductor fin (structure) may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the semiconductor fins 402-404 that include the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more semiconductor fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more semiconductor fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the semiconductor fins 402-404 may include silicon germanium ($Si_xGe_{1-x}$, where x can be between 0 and 1), silicon carbide, pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5A:
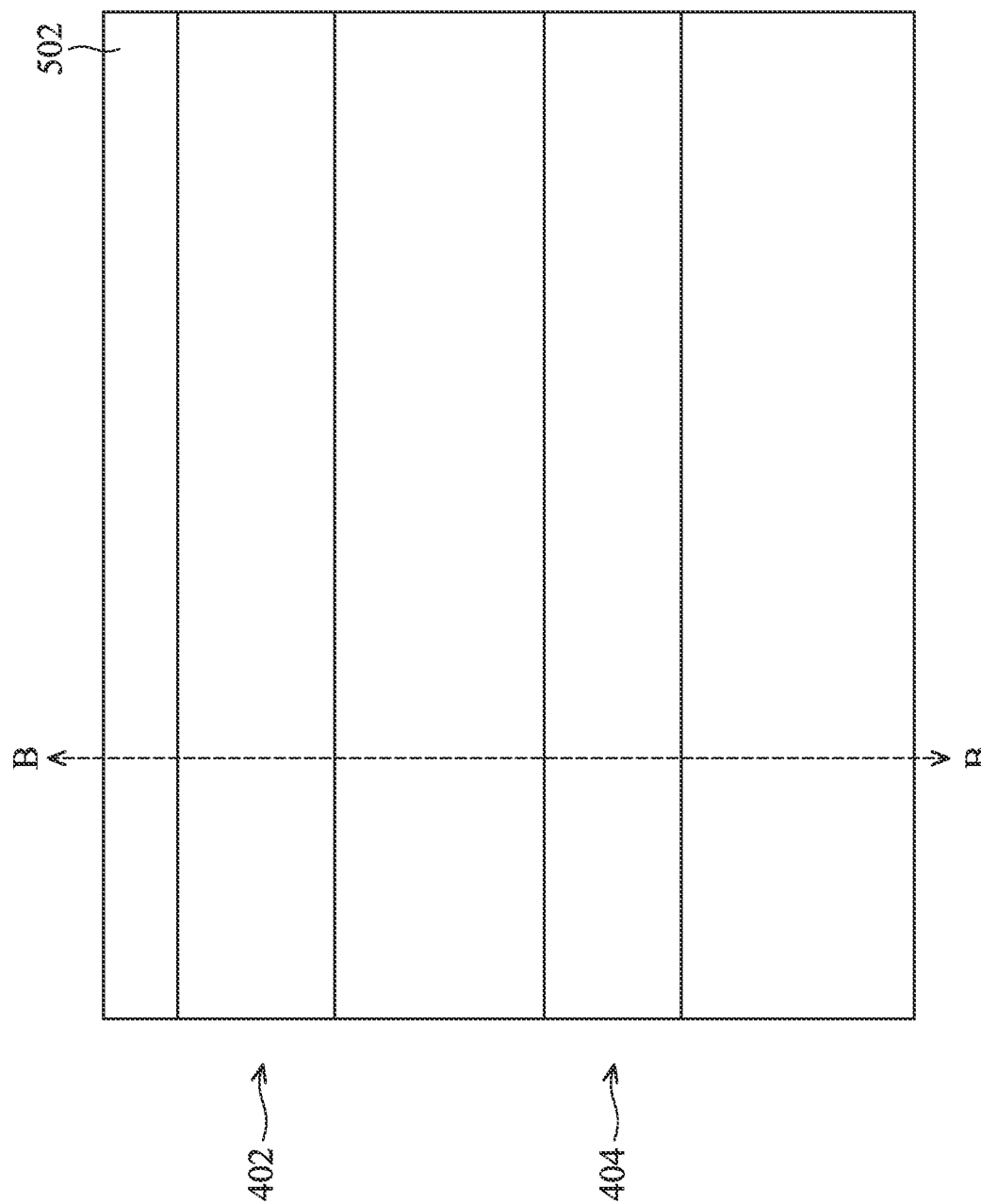

Corresponding to operation 206 of FIG. 2, FIG. 5A is a cross-sectional view of the FinFET device 300 including one or more isolation structures 502 at one of the various stages of fabrication, in accordance with various embodiments. The cross-sectional view of FIG. 5A is cut along cross-section A-A, as indicated in FIG. 1. Further, FIG. 5B is a cross-sectional view of the FinFET device 300 cut in a direction along the lengthwise direction of an active/dummy gate structure of the FinFET device 300 (e.g., cross-section B-B indicated in FIG. 1 and FIG. 5A).

To form the isolation structures 502, an insulation material may be universally deposited over the workpiece, which includes the semiconductor fins 402-404. For example, the insulation material may overlay the semiconductor fins by extending along their respective sidewalls and overlaying their respective top surfaces. In some embodiments, the insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP) process, may remove any excess insulation material and form a top surface of the insulation material and a top surface of a patterned mask (not shown) defining the semiconductor fins. The patterned mask may also be removed by the planarization process, in various embodiments.

Figure 5B:
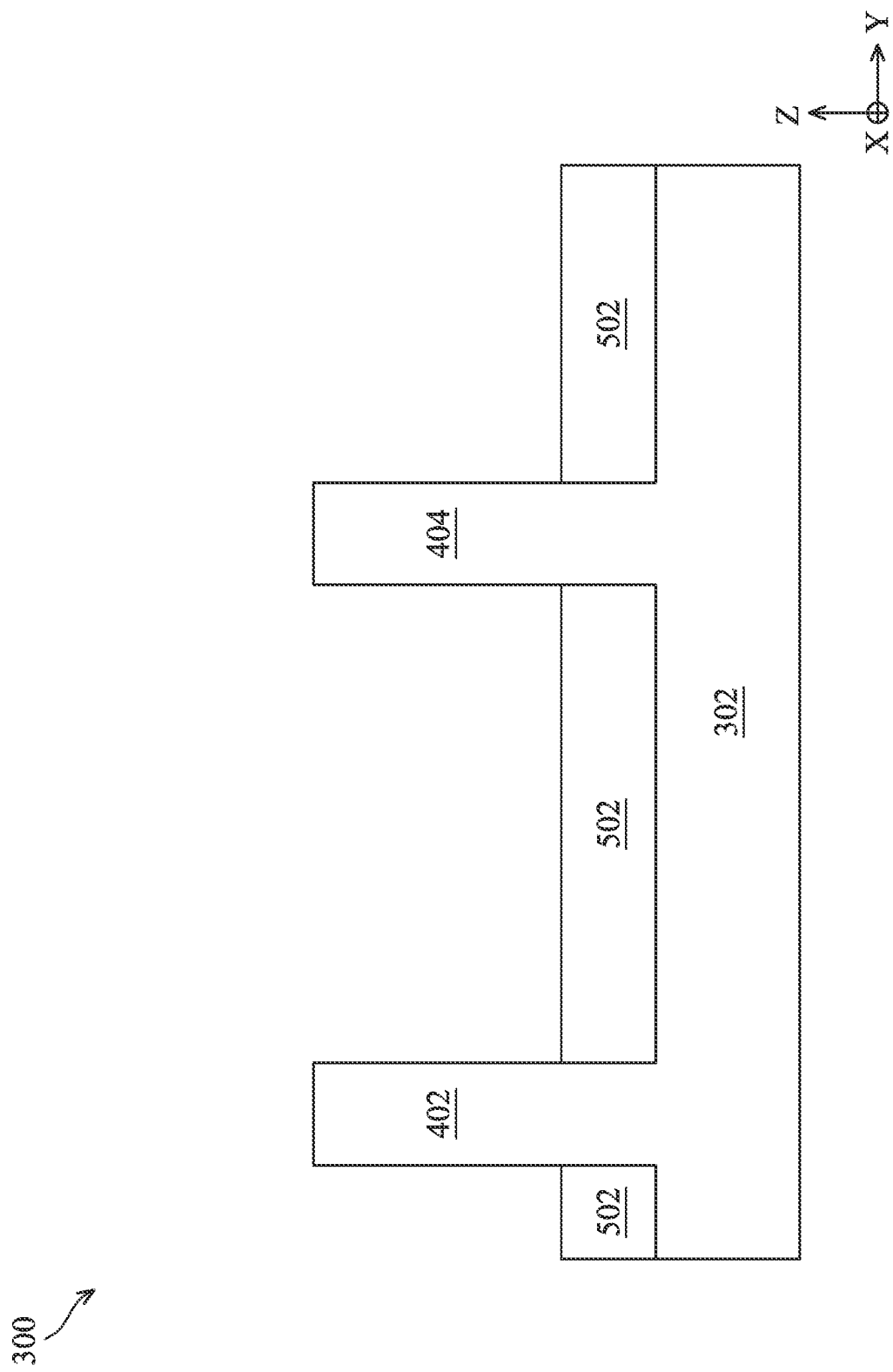

Next, the insulation material is recessed to form the isolation structure 502, as shown in FIGS. 5A-B. The isolation structure 502 is sometimes referred to as a shallow trench isolation (STI) structure 502. The isolation structure 502 is recessed such that the semiconductor fins 402-404 each protrude from between neighboring portions of the isolation structure 502. The top surface of the isolation structure 502 may have a flat surface (as illustrated), a convex surface, a concave surface (such as dishing), or combinations thereof. The top surface of the isolation structure 502 may be formed flat, convex, and/or concave by an appropriate etch. The isolation structure 502 may be recessed using an acceptable etching process, such as one that is selective to the insulation material of the isolation structure 502. For example, a dry etch or a wet etch using dilute hydrofluoric (DHF) acid may be performed to form the isolation structure 502.

Figure 6A:
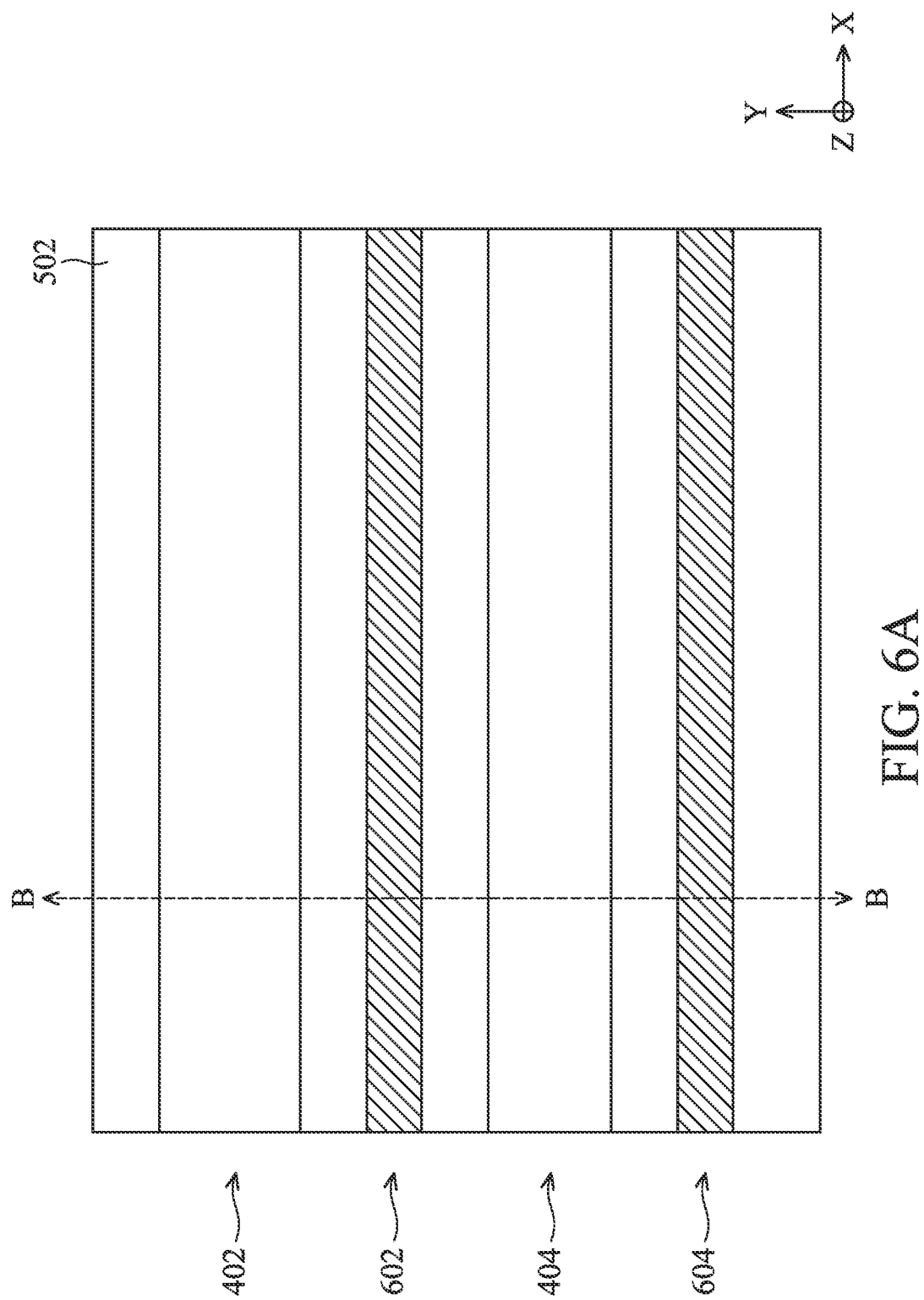
Figure 6B:
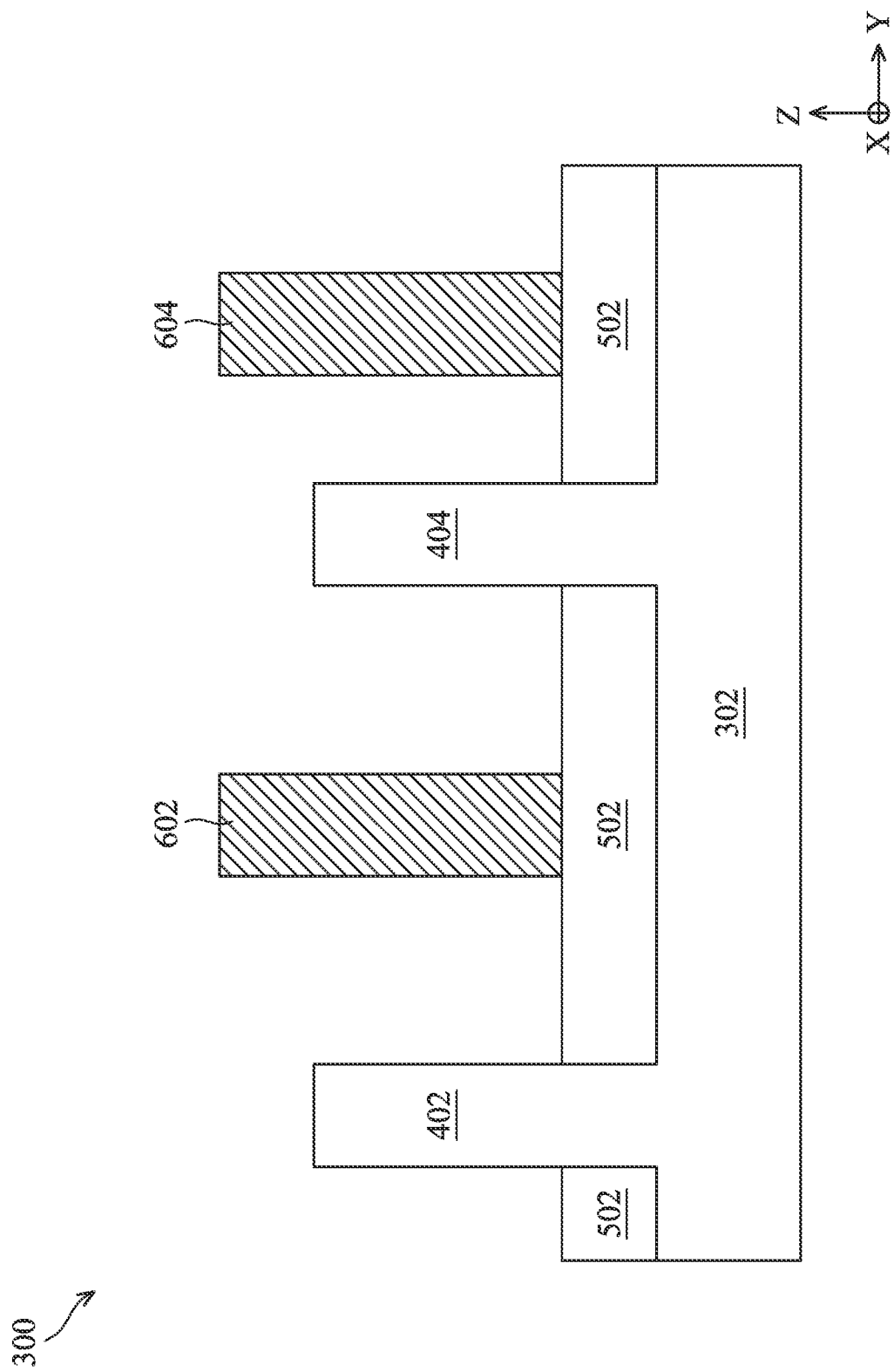

Corresponding to operation 208 of FIG. 2, FIG. 6A is a cross-sectional view of the FinFET device 300 including dummy fins 602 and 604 at one of the various stages of fabrication, in accordance with various embodiments. The cross-sectional view of FIG. 6A is cut along cross-section A-A, as indicated in FIG. 1. Further, FIG. 6B is a cross-sectional view of the FinFET device 300 cut in a direction along the lengthwise direction of an active/dummy gate structure of the FinFET device 300 (e.g., cross-section B-B indicated in FIG. 1 and FIG. 6A).

In some embodiments, each of the dummy fins 602-604 may extend along the same lengthwise direction of the semiconductor fins 402-404. When viewed from the top (e.g., FIG. 6A), the semiconductor fins and dummy fins may be parallel to one another. The dummy fin 602 is formed between the semiconductor fins 402 and 404; and the dummy fin 604 is formed between the semiconductor fin 404 and another semiconductor fin (not shown). Further, the dummy fins 602 and 604 may be formed higher than the semiconductor fins 402-404, in various embodiments, as shown in FIG. 6B. Although the dummy fins 602-604 are each formed as a continuous one-piece structure in the illustrated embodiments of FIG. 6B, it should be understood that each of the dummy fins can include a number of dielectric layers stacked on top of one another, while remaining within the scope of the present disclosure. For example, each of the dummy fins 602-604 can include a U-shaped lower layer that forms the dummy fin's bottom surface and sidewalls, and at least one upper layer disposed above the U-shaped lower layer.

The dummy fins 602-604 can include a dielectric material. The dummy fins 602-604 may sometimes be referred to as dielectric fins 602 and 604, respectively. For example, the dielectric material may include silicon oxide, silicon nitride, silicon oxynitride, silicon carbide, silicon carbonitride, silicon oxycarbonitride, silicon oxycarbide, or combinations thereof. In another example, the dielectric material may include an oxide-based or nitride-based material, e.g., aluminum oxide, tantalum nitride, tantalum oxide, hafnium oxide, or combinations thereof.

The dummy fins 602-604 may be formed prior to, concurrently with, or subsequently to the formation of the isolation structure 502. Details of various example methods to form the dummy fins 602-604 will be respectively discussed as follows.

As an example, upon forming the semiconductor fins 402-404, the above-mentioned dielectric material (of the dummy fins) may be universally deposited over the workpiece as a blanket dummy channel layer, using low-pressure chemical vapor deposition (LPCVD) or plasma enhanced chemical vapor deposition (PECVD), for example. The dummy fins 602-604 can be formed by patterning the dummy channel layer using, for example, photolithography and etching techniques. For example, a patterned mask (not shown) may be formed over the dummy channel layer to mask portions of the dummy channel layer to form the dummy fins 602-604. Subsequently, unmasked portions of the dummy channel layer may be etched using, for example, reactive ion etch (RIE), neutral beam etch (NBE), the like, or combinations thereof, thereby defining the dummy fins 602-604, each of which is disposed between adjacent one of the semiconductor fins 402-404. The etch may be anisotropic, in some embodiments. In such embodiments, the dummy fins 602-604 may each have a lower portion extending through the isolation structure 502.

As another example, when forming the semiconductor fins 402-404 (FIGS. 4A-B), one or more other semiconductor fins may also be formed in each of the trenches between the adjacent semiconductor fins. Next, the insulation material of the isolation structure 502 may be deposited over the semiconductor fins, followed by a CMP process to planarize the top surfaces of the insulation material and the semiconductor fins. Next, an upper portion of each of the semiconductor fins formed in the trenches may be partially removed to form a cavity. The cavity is then filled with the dielectric material (of the dummy fins), followed by another CMP process to form the dummy fins 602-604. The insulation material is then recessed to form the isolation structure 502. Using such a method to form the dummy fins, the dummy fins 602-604 may not be disposed over the isolation structure 502, but over the substrate 302 (e.g., a remaining portion of the semiconductor fin formed in the trench between the adjacent semiconductor fins 402-404).

As yet another example, after forming the semiconductor fins 402-404 (FIGS. 4A-B), the insulation material of the isolation structure 502 may be deposited over the semiconductor fins 402-404 in a controlled deposition rate, thereby causing a cavity to be spontaneously formed in the trenches. The cavity is then filled with the dielectric material (of the dummy fins), followed by a CMP process to form the dummy fins 602-604. The insulation material is then recessed to form the isolation structure 502, as shown in FIG. 6B. In particular, the dummy fins 602-604 are formed over the isolation structure 502. Depending on an amount of the insulation material being recessed, a bottom surface of each of the dummy fins may embed in the isolation structure 502.

Figure 7A:
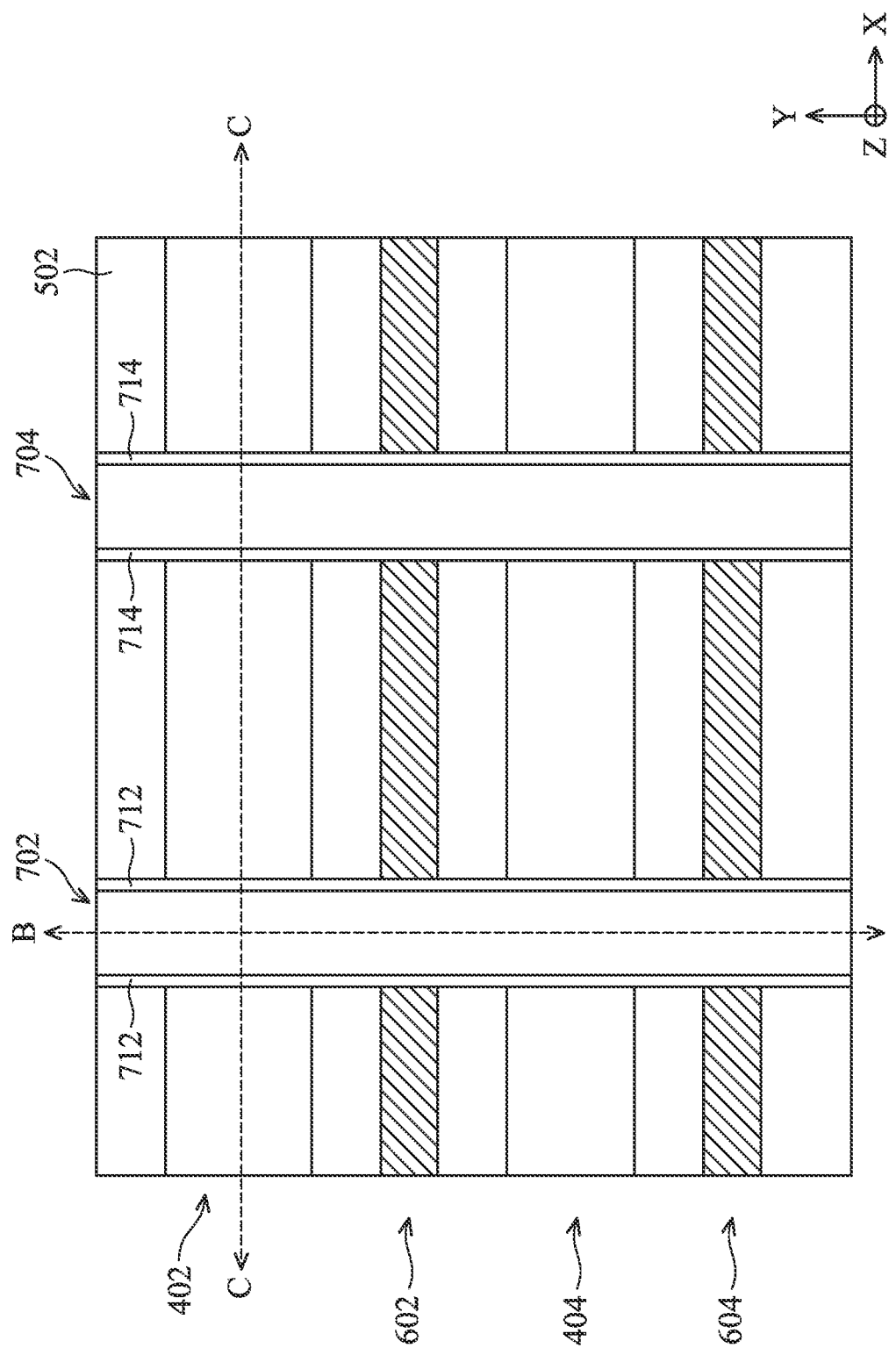
Figure 7B:
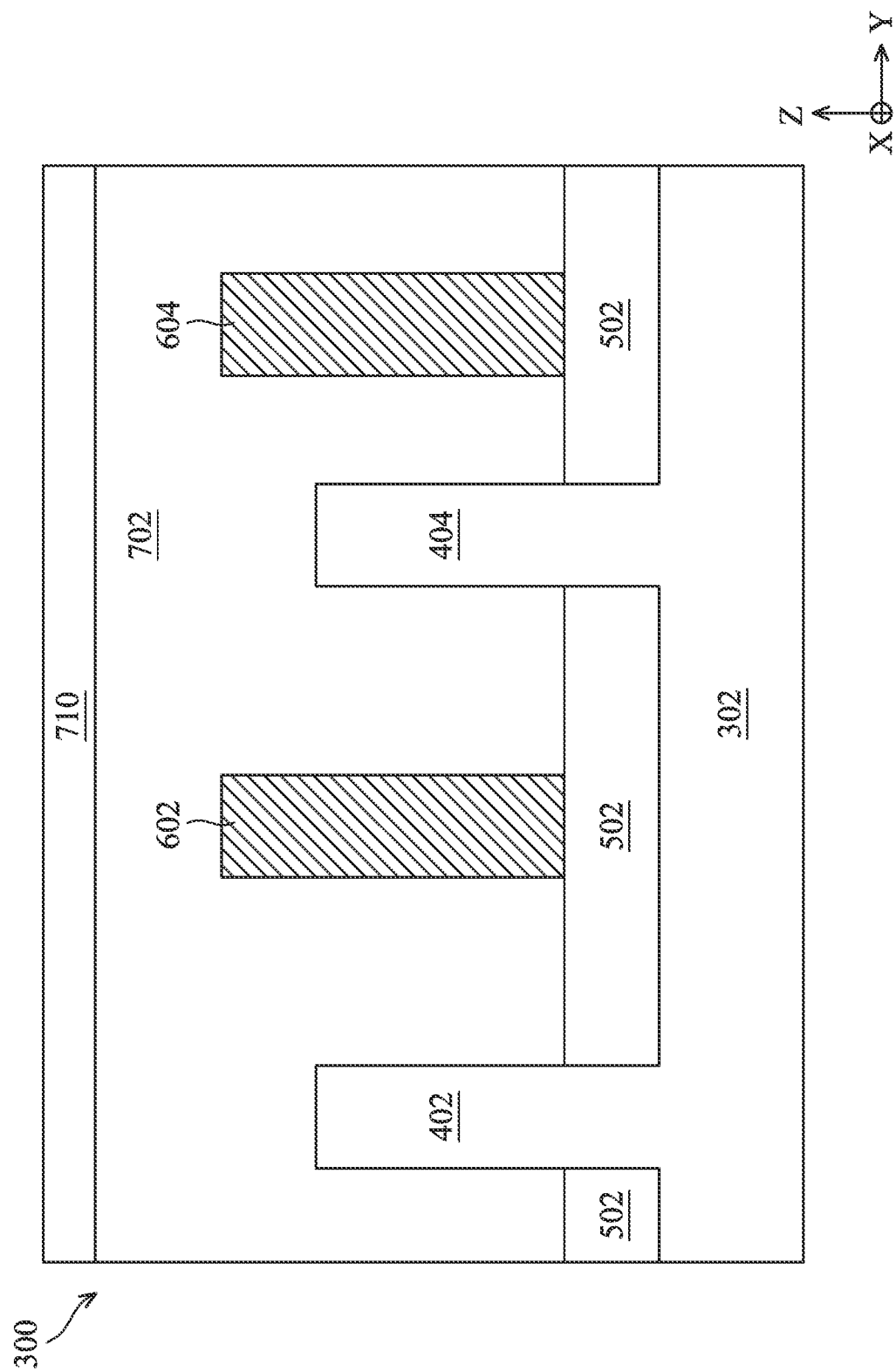

Corresponding to operation 210 of FIG. 2, FIG. 7A is a cross-sectional view of the FinFET device 300 including dummy gate structures 702 and 704 at one of the various stages of fabrication, in accordance with various embodiments. The cross-sectional view of FIG. 7A is cut along cross-section A-A, as indicated in FIG. 1. Further, FIG. 7B is a cross-sectional view of the FinFET device 300 cut in a direction along the lengthwise direction of an active/dummy gate structure of the FinFET device 300 (e.g., cross-section B-B indicated in FIG. 1 and FIG. 7A), and FIG. 7C is a cross-sectional view of the FinFET device 300 cut in a direction along the lengthwise direction of a semiconductor fin of the FinFET device 300 (e.g., cross-section C-C indicated in FIG. 1 and FIG. 7A).

The dummy gate structures 702-704 may have a lengthwise direction (e.g., along direction B-B in FIG. 1) perpendicular to the lengthwise direction of the semiconductor/dummy fins. As shown, the dummy gate structure 702 may straddle portions of the semiconductor fin 402, dummy fin 602, semiconductor fin 404, and dummy fin 604, respectively; and the dummy gate structure 704 may straddle portions of the semiconductor fin 402, dummy fin 602, semiconductor fin 404, and dummy fin 604, respectively.

Figure 7C:
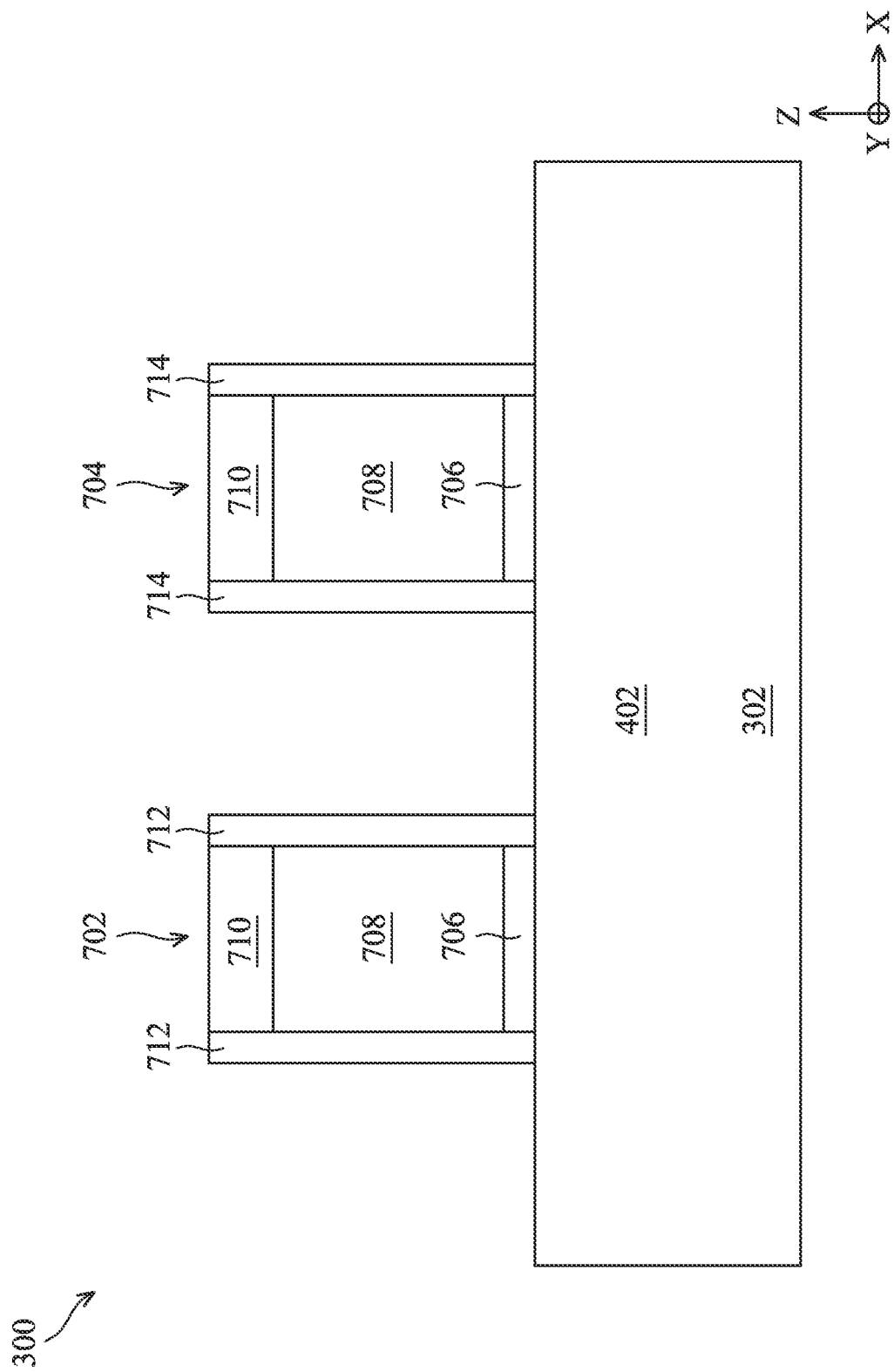

The dummy gate structures 702-704 may each include a dummy gate dielectric 706 and a dummy gate 708, as shown in FIG. 7C. A mask 710 may be formed over the dummy gate 708. To form the dummy gate structures 702-704, a dielectric layer is formed on the semiconductor fins 402-404 and dummy fins 602-604. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques. Next, the pattern of the mask layer may be transferred to the gate layer and the dielectric layer by a suitable etching technique to form the dummy gate structures 702-704.

Upon forming the dummy gate structures 702-704, a gate spacer 712 may be formed on opposing sidewalls of the dummy gate structures 702, and a gate spacer 714 may be formed on opposing sidewalls of the dummy gate structures 704, as shown in FIGS. 7A and 7C. Such sidewalls can face along or away from the lengthwise direction of the semiconductor/dummy fins. The gate spacers 712-714 may each be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacers 712-714.

Figure 8A:
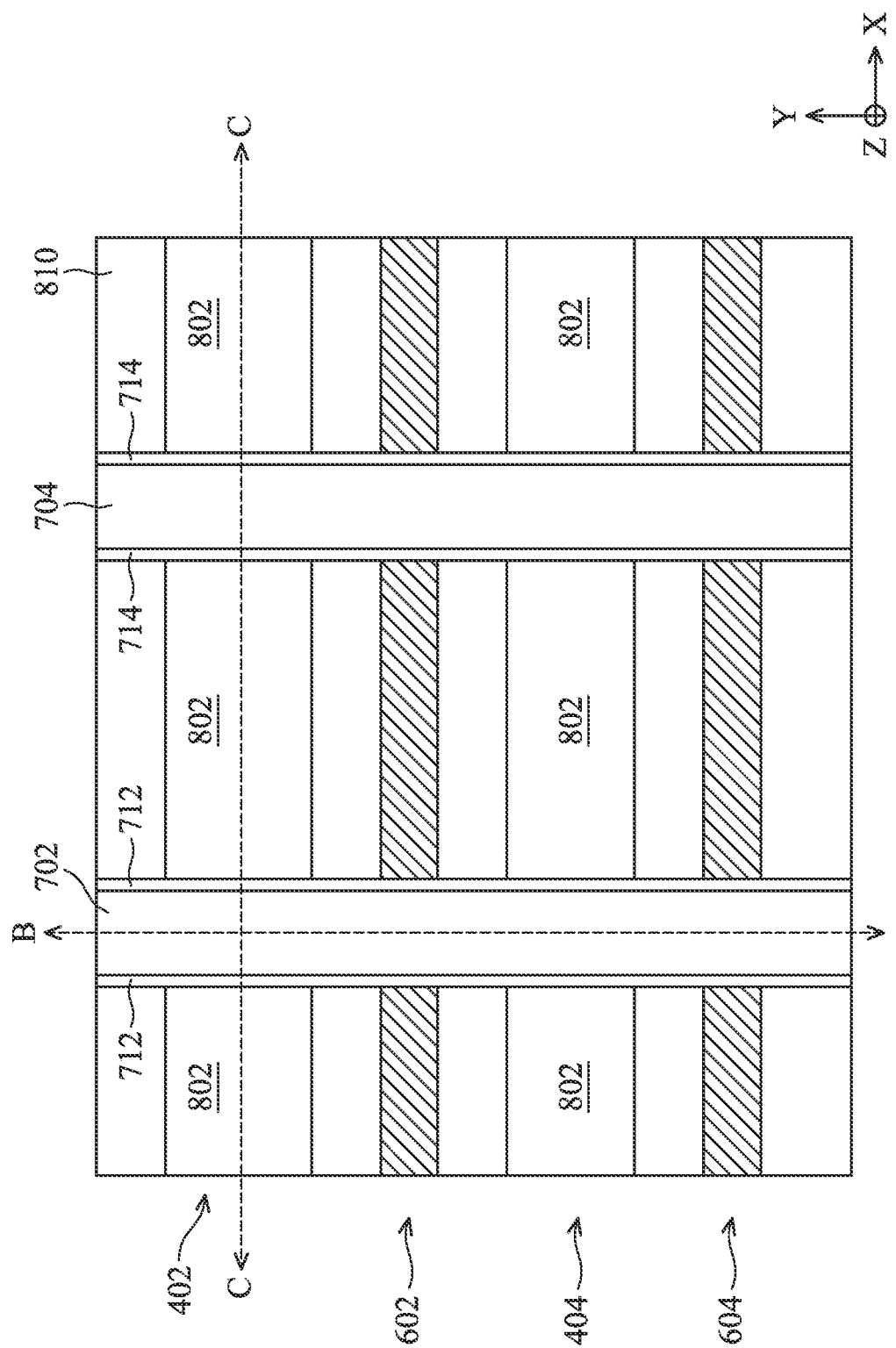
Figure 8B:
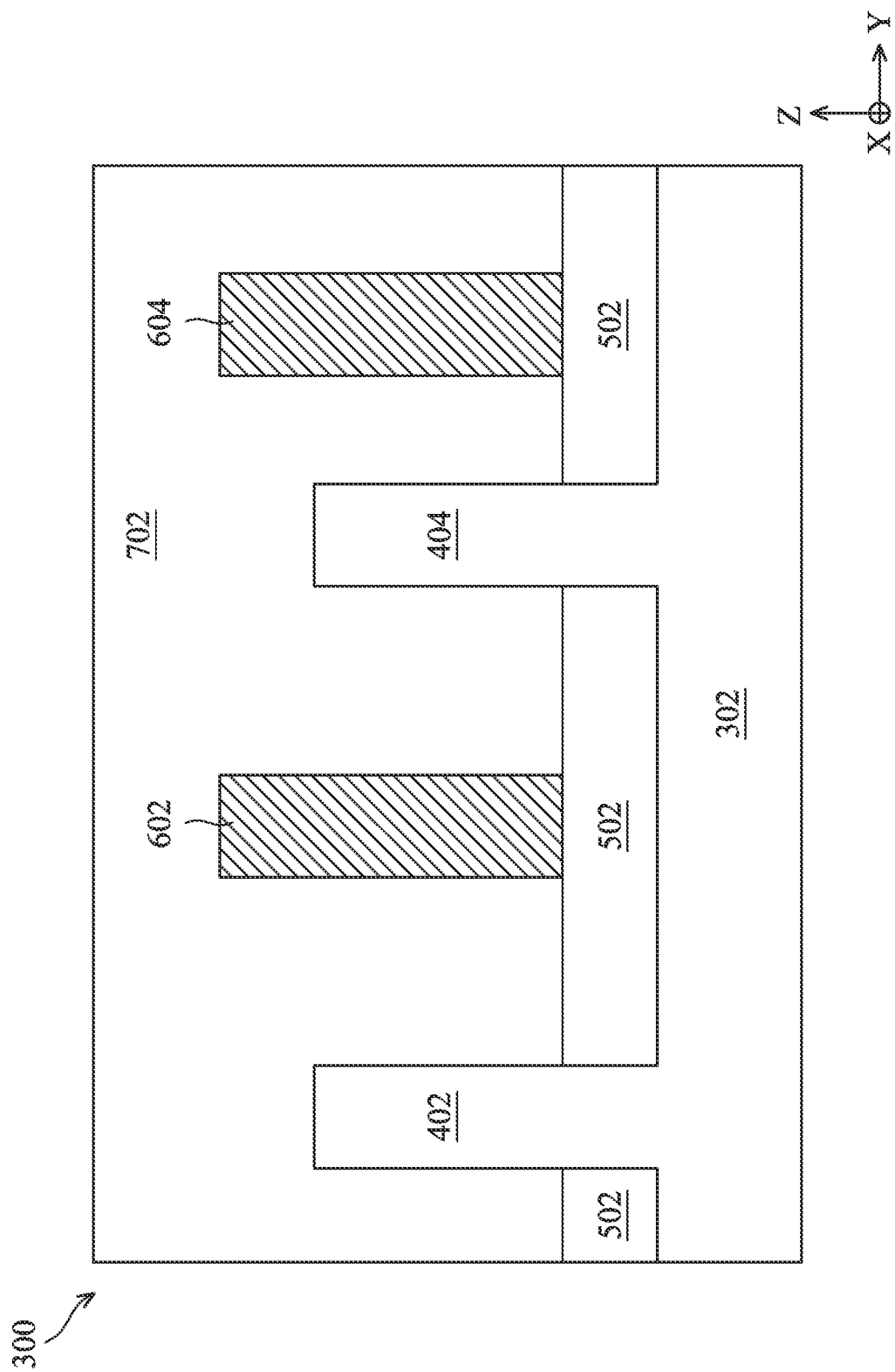

Corresponding to operation 212 of FIG. 2, FIG. 8A is a cross-sectional view of the FinFET device 300 including a number of source/drain structures (regions) 802 at one of the various stages of fabrication, in accordance with various embodiments. The cross-sectional view of FIG. 8A is cut along cross-section A-A, as indicated in FIG. 1. Further, FIG. 8B is a cross-sectional view of the FinFET device 300 cut in a direction along the lengthwise direction of an active/dummy gate structure of the FinFET device 300 (e.g., cross-section B-B indicated in FIG. 1 and FIG. 8A), and FIG. 8C is a cross-sectional view of the FinFET device 300 cut in a direction along the lengthwise direction of a semiconductor fin of the FinFET device 300 (e.g., cross-section C-C indicated in FIG. 1 and FIG. 8A).

The source/drain structures 802 are formed in recesses of the semiconductor fins 402-404 adjacent to the dummy gate structures 702-704. For example in FIG. 8A, a pair of source/drain structures 802 are formed in the semiconductor fin 402 next to the dummy gate structure 702; a pair of source/drain structures 802 are formed in the semiconductor fin 402 next to the dummy gate structure 704; a pair of source/drain structures 802 are formed in the semiconductor fin 404 next to the dummy gate structure 702; and a pair of source/drain structures 802 are formed in the semiconductor fin 404 next to the dummy gate structure 704. The recesses are formed by, e.g., an anisotropic etching process using the dummy gate structures 702 and 704 (together with the corresponding gate spacers) as an etching mask, although any other suitable etching process may also be used. The source/drain structures 802 are formed by epitaxially growing a semiconductor material in the recesses, respectively, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in the cross-sectional view of FIG. 8C, the epitaxial source/drain structures 802 may have surfaces raised from top surfaces of the semiconductor fins (e.g. raised above the non-recessed portions of the semiconductor fin 402) and may have facets. In some embodiments, when the resulting FinFET device is an n-type FinFET, the source/drain structures 802 can include silicon carbide (SiC), silicon phosphorous (SiP), phosphorous-doped silicon carbon (SiCP), or the like. In some embodiments, when the resulting FinFET device is a p-type FinFET, the source/drain structures 802 can include SiGe, and a p-type impurity such as boron or indium.

The epitaxial source/drain structures 802 may be implanted with dopants to form source/drain structures 802 followed by an annealing process. The implanting process may include forming and patterning masks such as a photoresist to cover the regions of the FinFET device 300 that are to be protected from the implanting process. The source/drain structures 802 may have an impurity (e.g., dopant) concentration in a range from about $1\times10^{19}$ cm$^{-3}$ to about $1\times10^{21}$ cm$^{-3}$. P-type impurities, such as boron or indium, may be implanted in the source/drain structures 802 of a P-type transistor. N-type impurities, such as phosphorous or arsenide, may be implanted in the source/drain structures 802 of an N-type transistor. In some embodiments, the epitaxial source/drain structures 802 may be in situ doped during their growth.

Next, an interlayer dielectric (ILD) 810 is formed over the source/drain structures 802. In some embodiments, the ILD 810 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 810 is formed, a dielectric layer is optionally formed over the ILD 810. The dielectric layer can function as a protection layer to prevent or reduces the loss of the ILD 810 in subsequent etching processes. The dielectric layer may be formed of a suitable material, such as silicon nitride, silicon carbonitride, or the like, using a suitable method such as CVD, PECVD, or FCVD. After the ILD 810 or the dielectric layer is formed, a planarization process, such as a CMP process, may be performed to achieve a level upper surface for the ILD 810 or the dielectric layer (if any). The CMP may also remove the mask 710 (FIGS. 7B-C). After the planarization process, the upper surface of the dielectric layer (if any) or the ILD 810 is level with the upper surface of the dummy gate structures 702-704, in some embodiments.

Figure 9A:
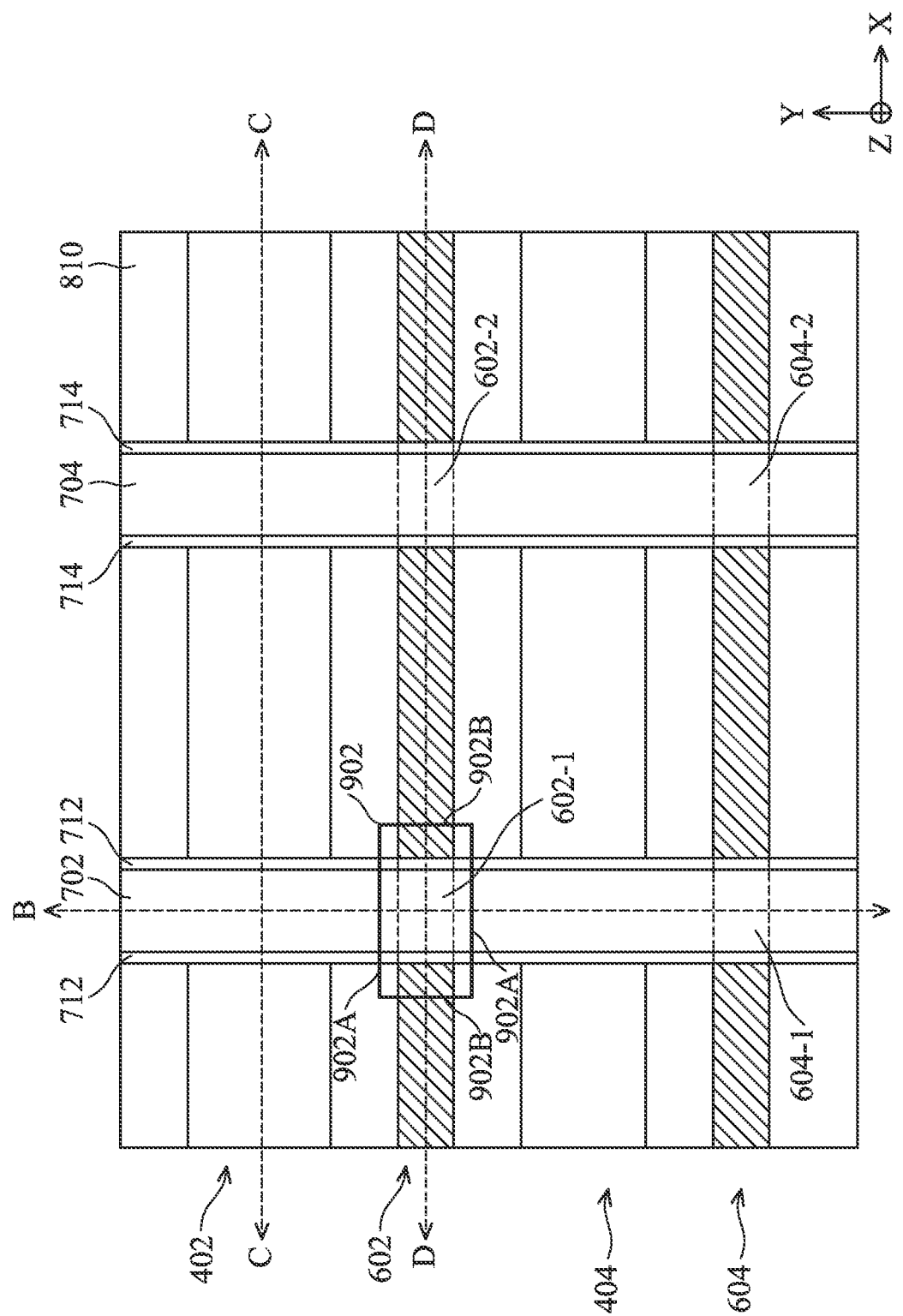
Figure 9B:
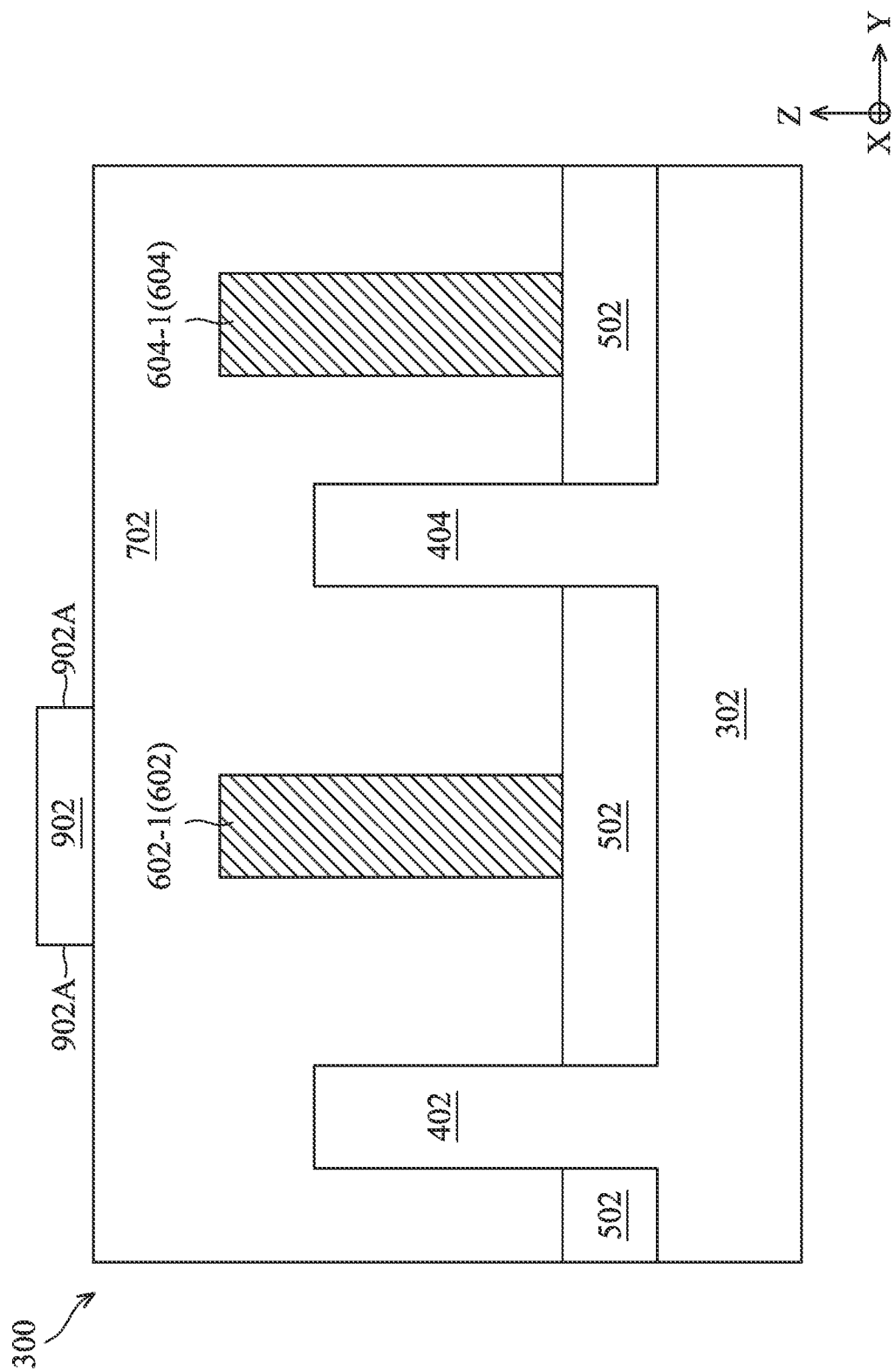

Corresponding to operation 214 of FIG. 2, FIG. 9A is a cross-sectional view of the FinFET device 300 including a mask layer 902 at one of the various stages of fabrication, in accordance with various embodiments. The cross-sectional view of FIG. 9A is cut along cross-section A-A, as indicated in FIG. 1. Further, FIG. 9B is a cross-sectional view of the FinFET device 300 cut in a direction along the lengthwise direction of an active/dummy gate structure of the FinFET device 300 (e.g., cross-section B-B indicated in FIG. 1 and FIG. 9A).

In some embodiments, the mask layer 902 can cover a portion of the dummy fin 602, e.g., 602-1, that is configured to remain, with a portion of the dummy gate structure 702 and a portion of the gate spacer 712 disposed between such a portion of the dummy fin 602 and the mask layer 902. Such a remaining portion of the dummy fin 602-1 is configured to cut (or otherwise separate) an active gate structure that will replace the dummy gate structure 702 into multiple portions. These separated portions of the active gate structure are each configured to straddle a respective semiconductor fin (e.g., functioning as the channel of a respective transistor). Such separated portions of an active gate structures may sometimes be referred to as isolated gates. On the other hand, the mask layer 902 can expose at least another portion of the dummy fin 602 and portions of the dummy fin 604, e.g., 602-2, 604-1, and 604-2, that are configured to be removed, with portions of the dummy gate structures 702-704 and portions of the gate spacers 712-714 disposed above such portions of the dummy fins 602-604. With these portions of the dummy fins 602-604 removed, at least one of the active gate structures that will replace the dummy gate structures 702-704 can straddle multiple semiconductor fins (e.g., collectively functioning as the channel of a respective transistor). Such an active gate structure may sometimes be referred to as a sharing gate.

By forming the mask layer 902 that covers the portion that is desired to keep, dimensions of the mask layer 902 can be less subjected to the shrinking dimensions of other active features such as, for example, a distance between the semiconductor fins 402-404, a width of the dummy gate structures 702-704 extending along the X axis, etc. Further, the mask layer 902 can have its edges 902A that are each formed relatively flat or straight to align with cut edges of the later formed active gate structure, while its edges 902B may be allowed to be formed relatively round. With the edges 902A formed as relatively flat, the LWR and/or LER of a feature formed by the mask layer 902 can be significantly improved.

Figure 10A:
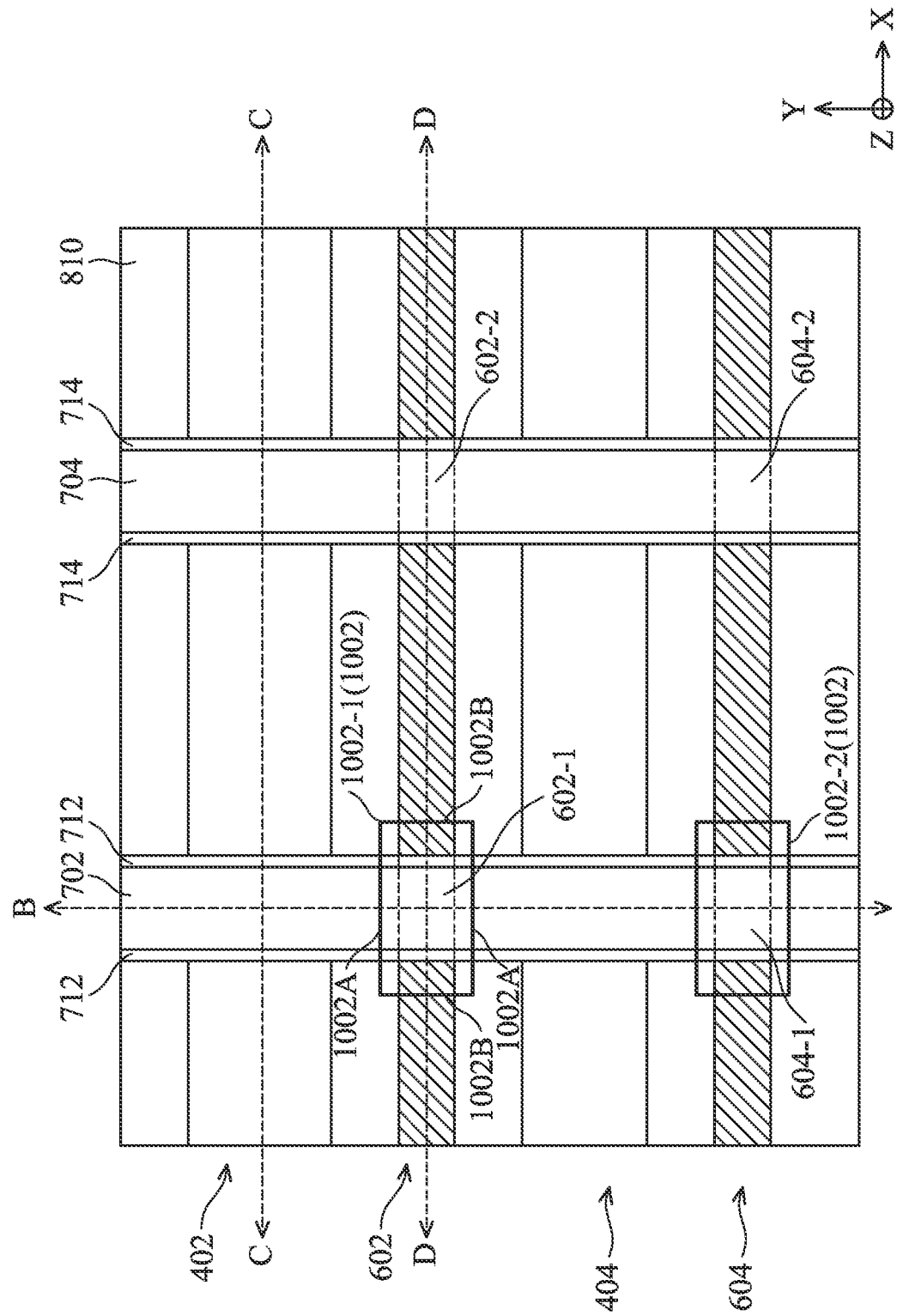
Figure 10B:
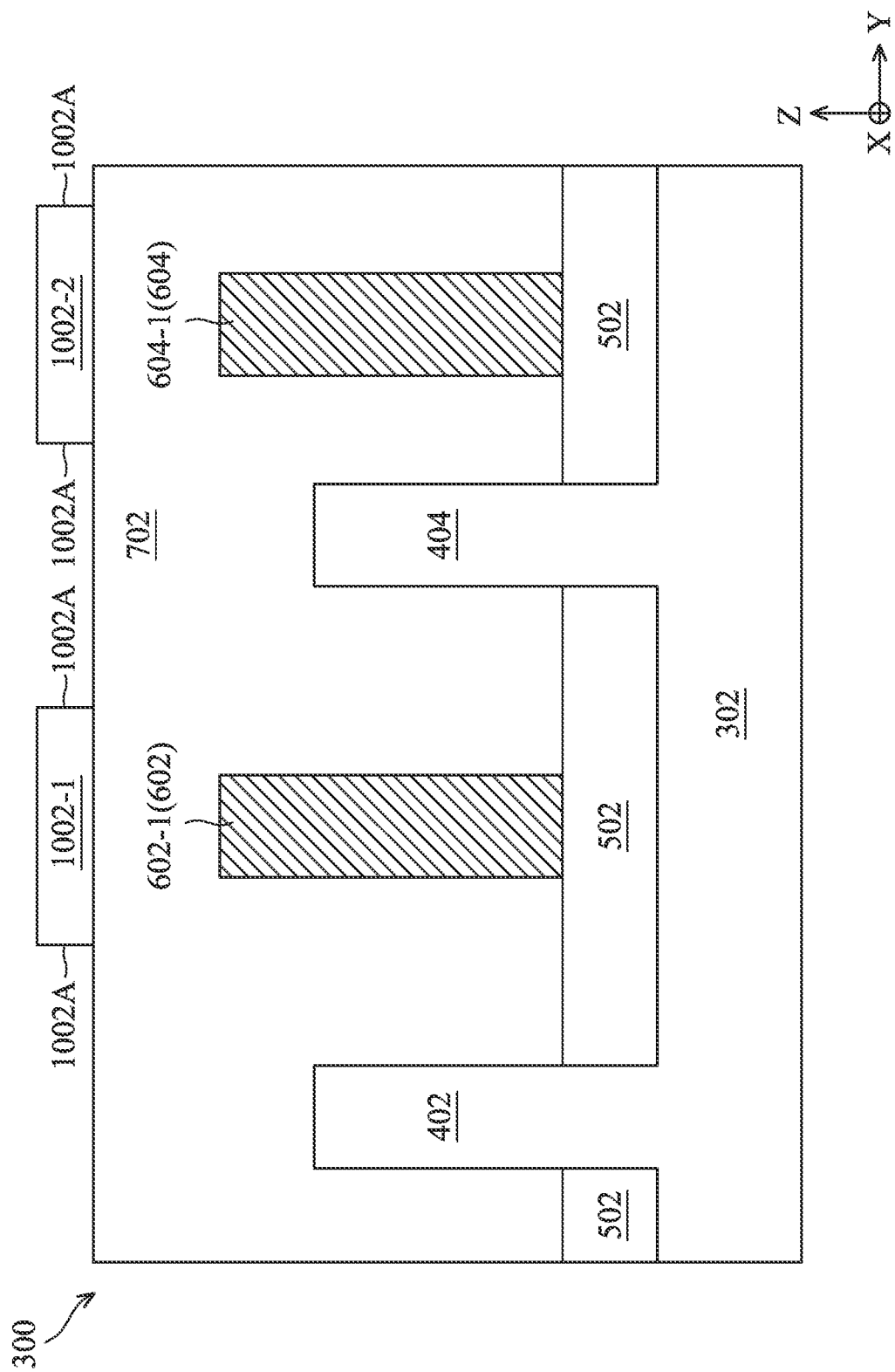

Also corresponding to operation 214 of FIG. 2, FIG. 10A is a cross-sectional view of the FinFET device 300 including a mask layer 1002 at one of the various stages of fabrication, in accordance with various embodiments. The cross-sectional view of FIG. 10A is cut along cross-section A-A, as indicated in FIG. 1. Further, FIG. 10B is a cross-sectional view of the FinFET device 300 cut in a direction along the lengthwise direction of an active/dummy gate structure of the FinFET device 300 (e.g., cross-section B-B indicated in FIG. 1 and FIG. 10A).

In some embodiments, the mask layer 1002 can include a number of portions, e.g., 1002-1 and 1002-2, to cover a number of portions of the dummy fins 602 and 604, e.g., 602-1 and 604-1, that are configured to remain, with portions of the dummy gate structure 702 and portions of the gate spacer 712 disposed between such portions of the dummy fins 602-604 and the mask layer 1002. Further, the portions 1002-1 and 1002-2 may be separate from each other, which exposes a portion of the dummy gate structure 702 (and a corresponding portion of the gate spacer 712) that are disposed between the dummy fins 602 and 604. Such remaining portions of the dummy fins 602-1 and 604-1 are configured to cut (or otherwise separate) an active gate structure that will replace the dummy gate structure 702 into multiple portions. These separated portions of the active gate structure are each configured to straddle a respective semiconductor fin (e.g., functioning as the channel of a respective transistor). Such separated portions of an active gate structures may sometimes be referred to as isolated gates. On the other hand, the mask layer 1002 can expose at least another portion of the dummy fin 602 and another portion of the dummy fin 604, e.g., 602-2 and 604-2, that are configured to be removed, with portions of the dummy gate structure 704 and portions of the gate spacer 714 disposed above such portions of the dummy fins 602 and 604. With these portions of the dummy fins 602-604 removed, the active gate structure that will replace the dummy gate structure 704 can straddle multiple semiconductor fins (e.g., collectively functioning as the channel of a respective transistor). Such an active gate structure may sometimes be referred to as a sharing gate.

By forming the mask layer 1002 that covers the portion that is desired to keep, dimensions of the mask layer 1002 can be less subjected to the shrinking dimensions of other active features such as, for example, a distance between the semiconductor fins 402-404, a width of the dummy gate structures 702-704 extending along the X axis, etc. Further, the mask layer 1002 can have its edges 1002A that are each formed relatively flat or straight to align with cut edges of the later formed active gate structure, while its edges 1002B may be allowed to be formed relatively round. With the edges 1002A formed as relatively flat, the LWR and/or LER of a feature formed by the mask layer 1002 can be significantly improved.

Figure 11A:
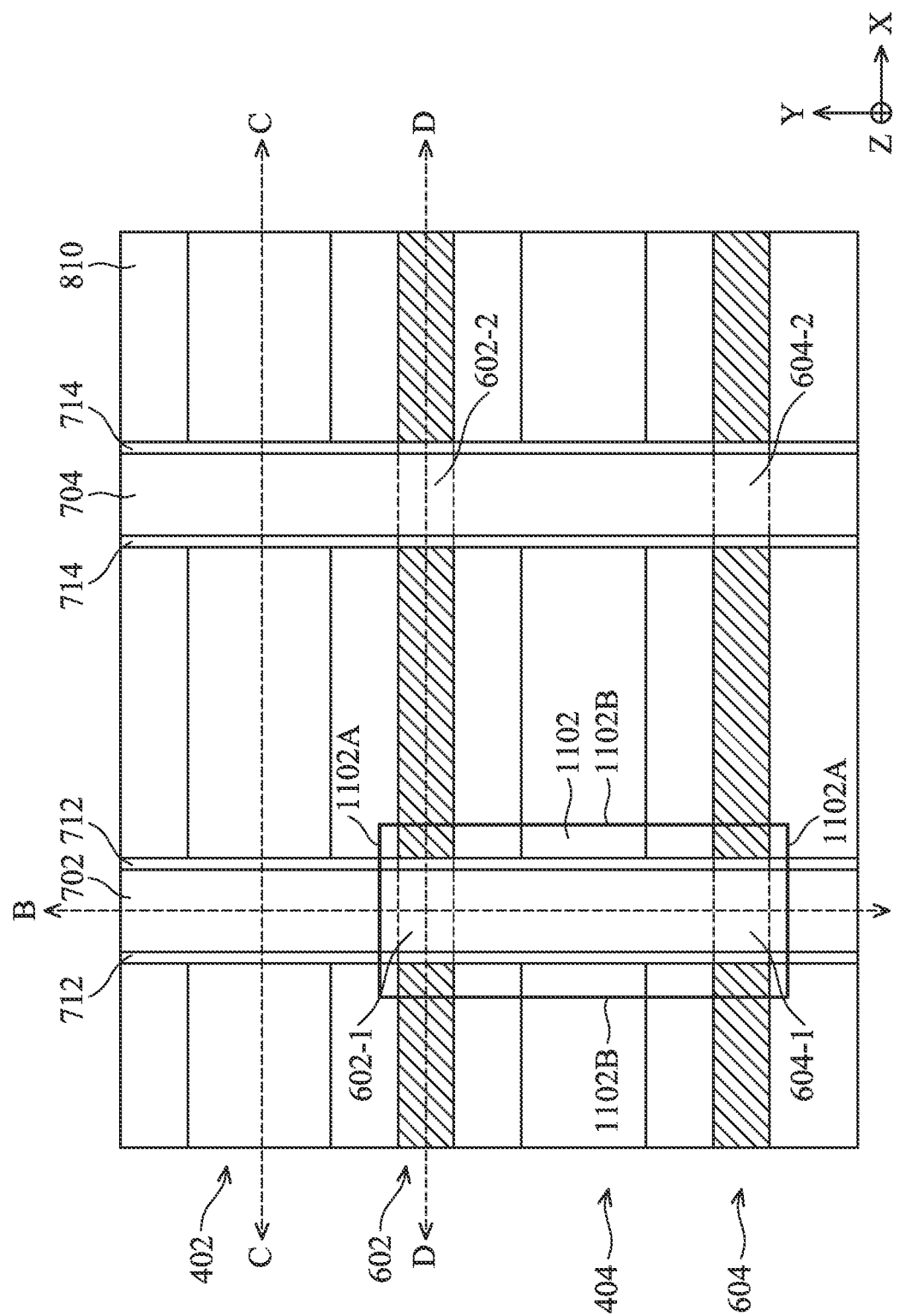
Figure 11B:
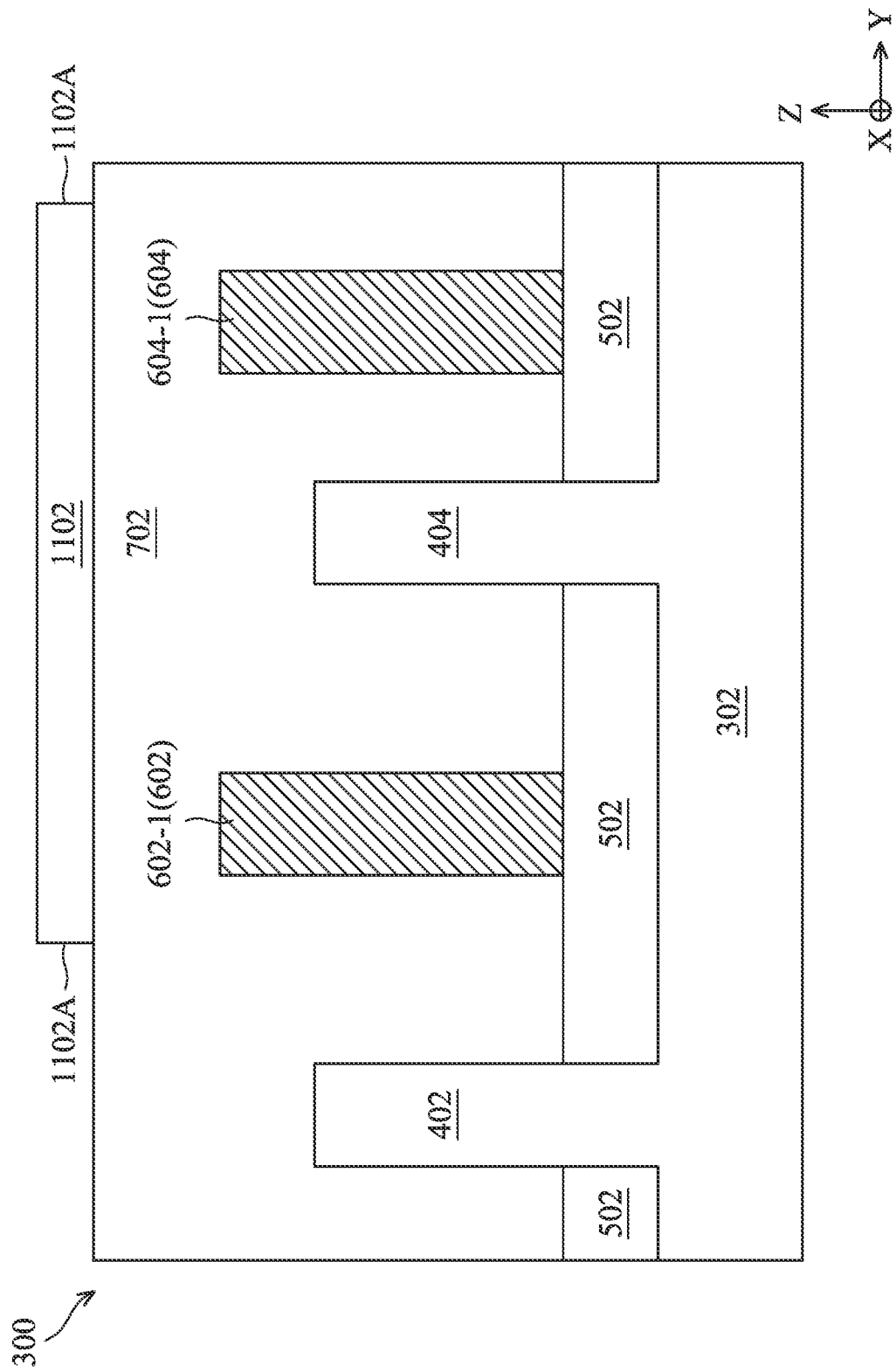

Also corresponding to operation 214 of FIG. 2, FIG. 11A is a cross-sectional view of the FinFET device 300 including a mask layer 1102 at one of the various stages of fabrication, in accordance with various embodiments. The cross-sectional view of FIG. 11A is cut along cross-section A-A, as indicated in FIG. 1. Further, FIG. 11B is a cross-sectional view of the FinFET device 300 cut in a direction along the lengthwise direction of an active/dummy gate structure of the FinFET device 300 (e.g., cross-section B-B indicated in FIG. 1 and FIG. 11A).

In some embodiments, the mask layer 1102 can cover a number of portions of the dummy fins 602 and 604, e.g., 602-1 and 604-1, that are configured to remain, with portions of the dummy gate structure 702 and portions of the gate spacer 712 disposed between such portions of the dummy fins 602-604 and the mask layer 1102. Further, the mask layer 1102 may extend across a portion of the dummy gate structure 702 (and a corresponding portion of the gate spacer 712) that are disposed between the dummy fins 602 and 604. Such remaining portions of the dummy fins 602-1 and 604-1 are configured to cut (or otherwise separate) an active gate structure that will replace the dummy gate structure 702 into multiple portions. These separated portions of the active gate structure are each configured to straddle a respective semiconductor fin (e.g., functioning as the channel of a respective transistor). Such separated portions of an active gate structures may sometimes be referred to as isolated gates. On the other hand, the mask layer 1102 can expose at least another portion of the dummy fin 602 and another portion of the dummy fin 604, e.g., 602-2 and 604-2, that are configured to be removed, with portions of the dummy gate structure 704 and portions of the gate spacer 714 disposed above such portions of the dummy fins 602 and 604. With these portions of the dummy fins 602-604 removed, the active gate structure that will replace the dummy gate structure 704 can straddle multiple semiconductor fins (e.g., collectively functioning as the channel of a respective transistor). Such an active gate structure may sometimes be referred to as a sharing gate.

By forming the mask layer 1102 that covers the portion that is desired to keep, dimensions of the mask layer 1102 can be less subjected to the shrinking dimensions of other active features such as, for example, a distance between the semiconductor fins 402-404, a width of the dummy gate structures 702-704 extending along the X axis, etc. Further, the mask layer 1102 can have its edges 1102A that are each formed relatively flat or straight to align with cut edges of the later formed active gate structure, while its edges 1102B may be allowed to be formed relatively round. With the edges 1102A formed as relatively flat, the LWR and/or LER of a feature formed by the mask layer 1102 can be significantly improved.

Figure 12A:
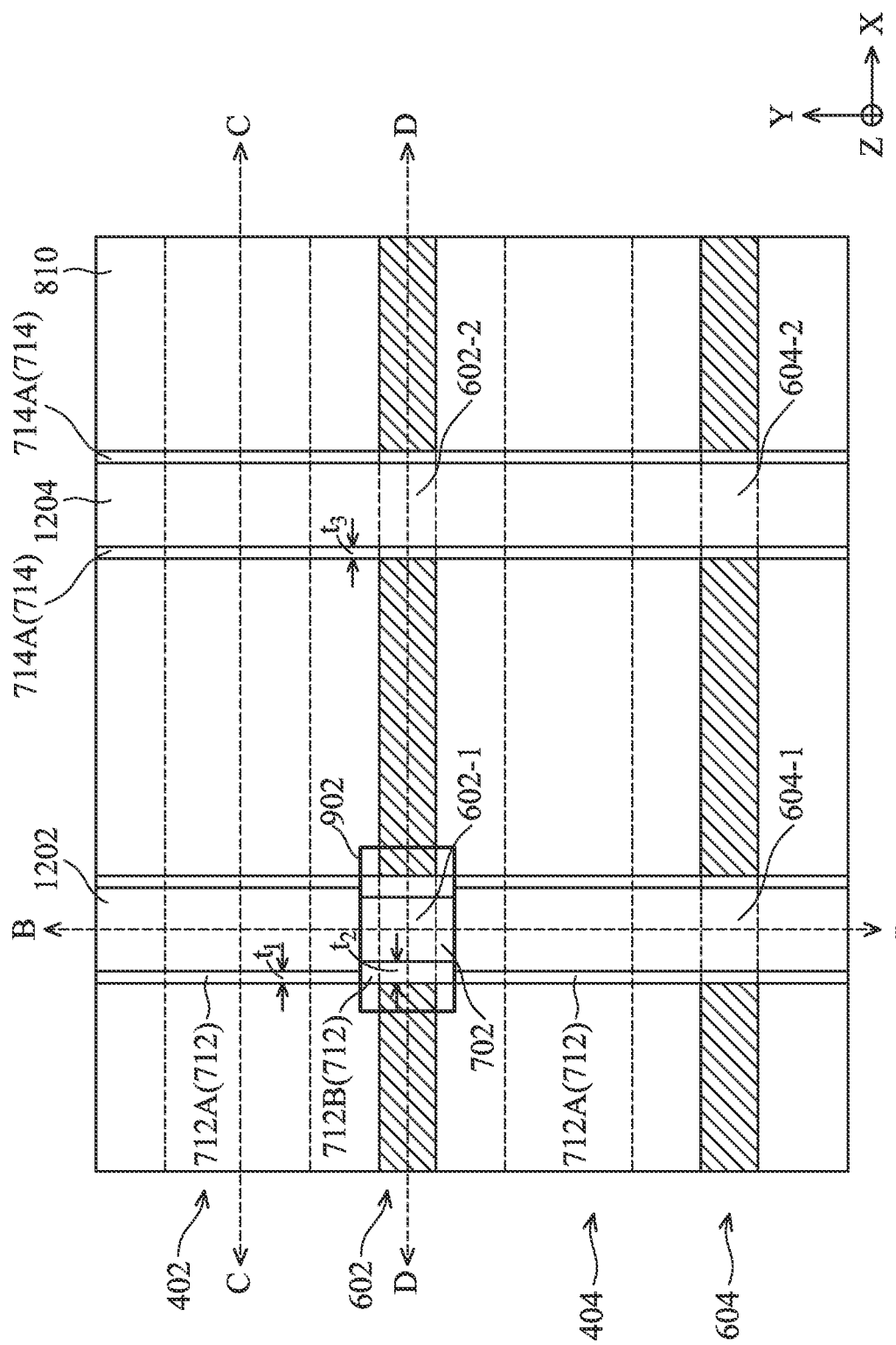
Figure 12B:
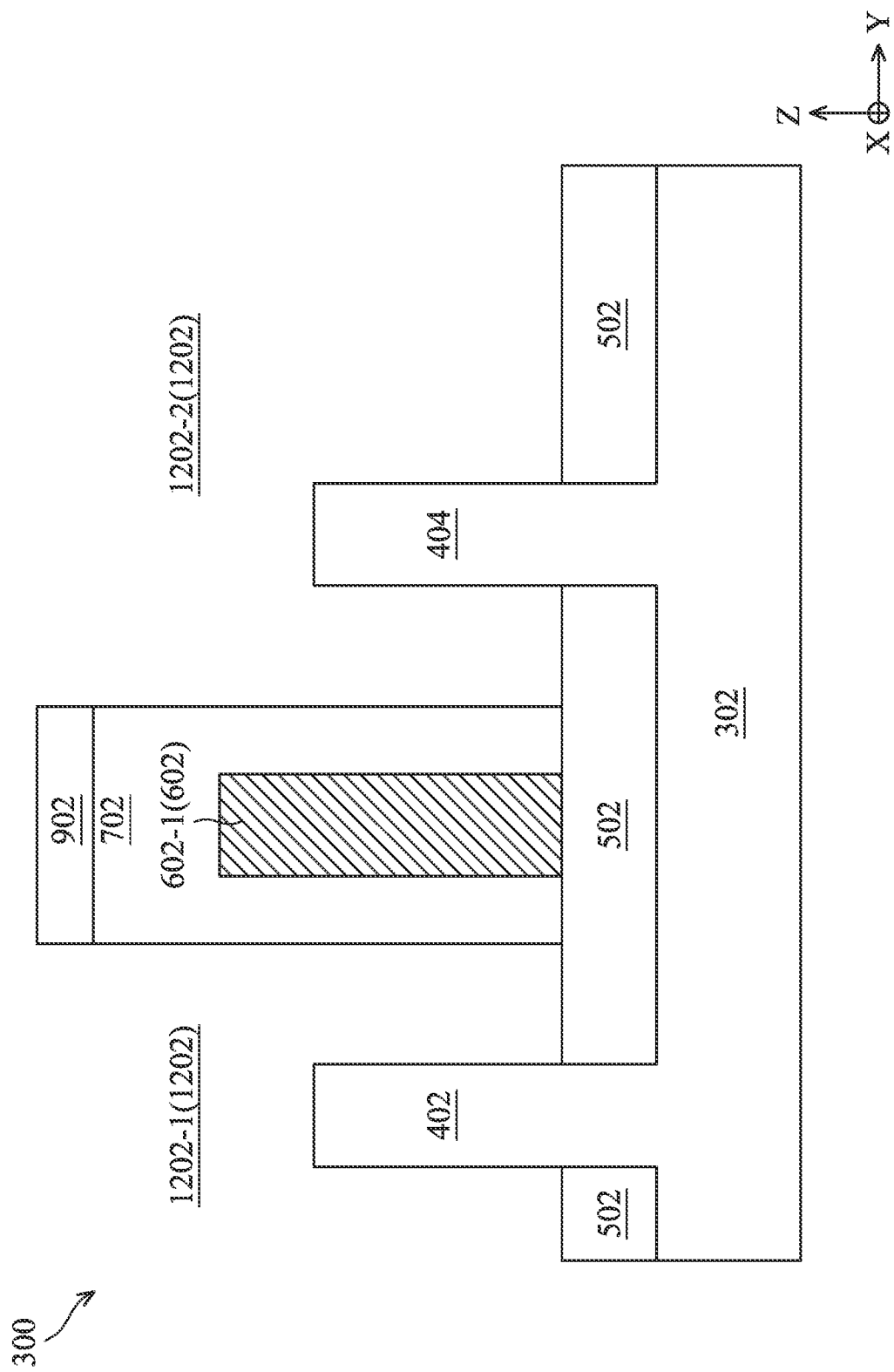
Figure 12C:
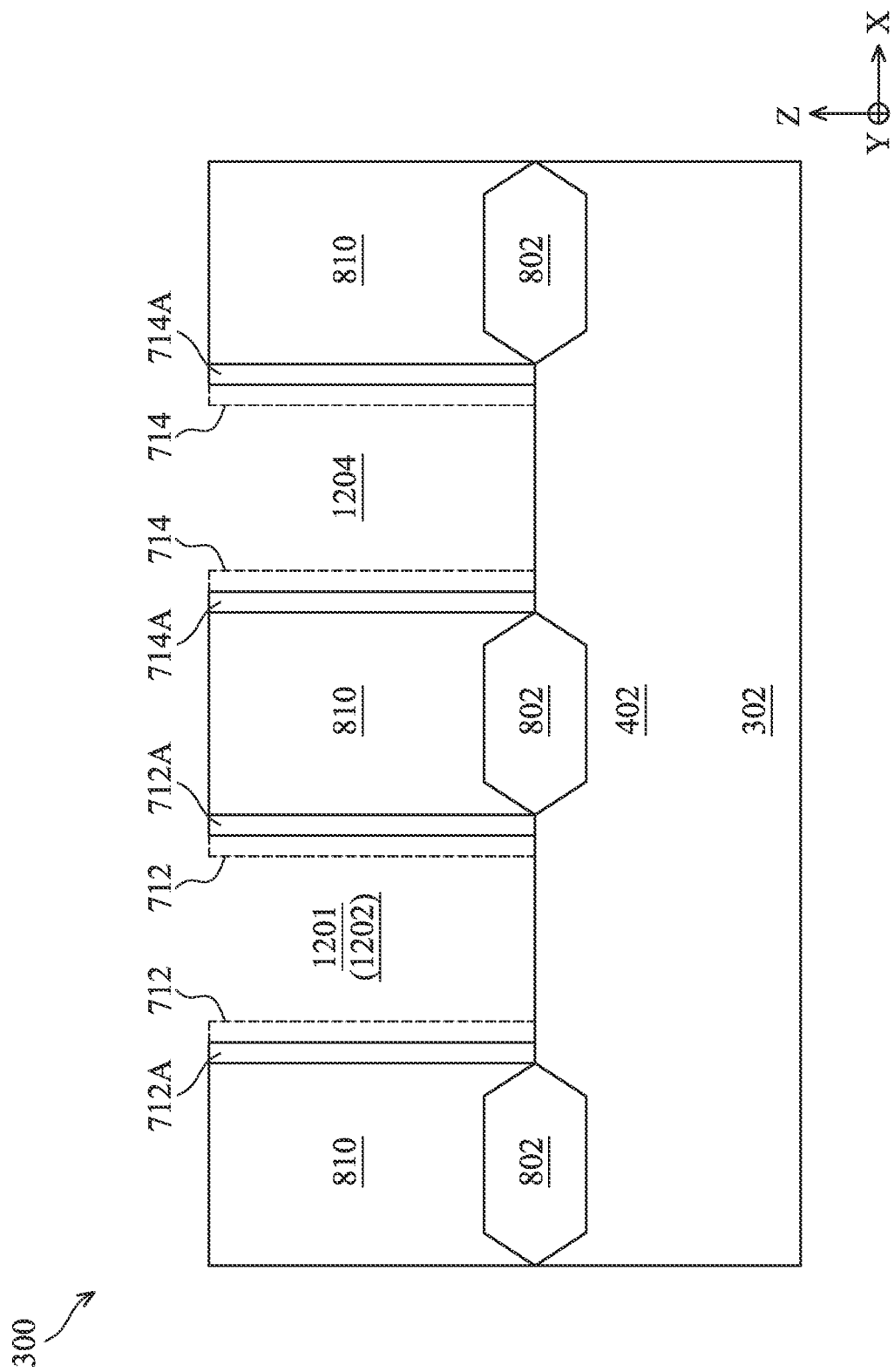
Figure 12D:
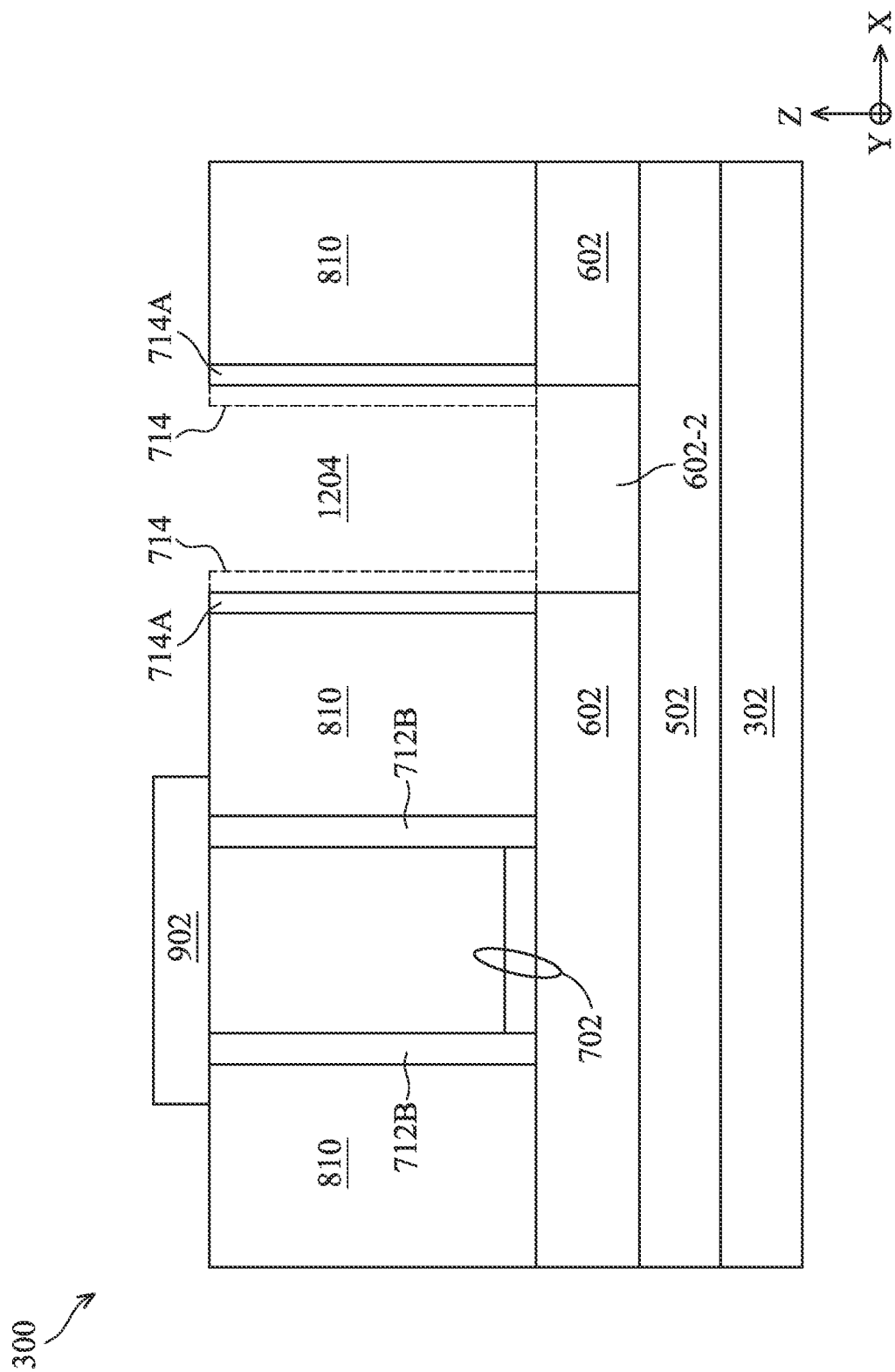

Corresponding to operation 216 of FIG. 2, FIG. 12A is a cross-sectional view of the FinFET device 300 in which the dummy fins 602 and 604 are cut (or otherwise patterned) based on the mask layer 902 (shown in FIGS. 9A-B) at one of the various stages of fabrication, in accordance with various embodiments. The cross-sectional view of FIG. 12A is cut along cross-section A-A, as indicated in FIG. 1. Further, FIG. 12B is a cross-sectional view of the FinFET device 300 cut in a direction along the lengthwise direction of an active/dummy gate structure of the FinFET device 300 (e.g., cross-section B-B indicated in FIG. 1 and FIG. 12A); FIG. 12C is a cross-sectional view of the FinFET device 300 cut in a direction along the lengthwise direction of a semiconductor fin of the FinFET device 300 (e.g., cross-section C-C indicated in FIG. 1 and FIG. 12A); and FIG. 12D is a cross-sectional view of the FinFET device 300 cut in a direction along the lengthwise direction of a dummy fin of the FinFET device 300 (e.g., cross-section D-D indicated in FIG. 1 and FIG. 12A).

With the mask layer 902 covering the workpiece, the dummy gate structure 704 and portions of the dummy gate structure 702 (that are not covered by the mask layer 902)

are first etched by a first etching process, which can at least partially form gate trenches 1202 and 1204. Upon etching the dummy gate structures 702-704 (with a remaining portion of the dummy gate structure 702 covering the dummy fin portion 602-1, as shown in FIG. 12B), the gate trenches 1202 and 1204 can expose the dummy fin portions, 602-2, 604-1, and 604-2. Next, such exposed dummy fin portions, 602-2, 604-1, and 604-2, can be removed by a second etching process, with the dummy fin portion 602-1 remaining covered. As such, the gate trenches 1202 and 1204 can further extend toward the substrate 302. For example in FIG. 12D, the gate trench 1204 further extends toward the substrate 302 by removing the dummy fin portion 602-2. With the dummy fin portion 602-1 remaining substantially intact, the gate trench 1202 may be separated into a number of portions, 1202-1 and 1202-2, that are located over the semiconductor fins 402 and 404, respectively (as shown in FIGS. 12A-B), while the gate trench 1204 can continuously extend across the semiconductor fins 402 and 404 (as shown in FIG. 12A).

In accordance with various embodiments, during the formation of gate trenches 1202-1204, the gate spacers 712 and 714 may be consumed. As such, the gate spacer 714 and at least portions of the gate spacer 712 (that are not covered by the mask layer 902) may be formed thinner. As illustrated in FIGS. 12's, portions of the gate spacer 712 that are not covered by the mask layer 902 may be consumed (sometimes referred to as "gate spacer portion 712A") to present a thickness, $t_1$, (extending along the X axis), while the portion of the gate spacer 712 that is covered by the mask layer 902 may not be consumed (sometimes referred to as "gate spacer portion 712B") to present a thickness, $t_2$, (extending along the X axis). The gate spacer 714 may be consumed (sometimes referred to as "gate spacer portion 714A") to present a universal thickness, $t_3$, (extending along the X axis). The thickness ($t_2$) is greater than any of the thicknesses ($t_1$ or $t_3$).)

As a non-limiting example, each of $t_1$ through $t_3$ may range between about 1 nanometer (nm) and about 30 nm, while a difference between $t_1$ and $t_2/t_3$ may be between about 0.3 nm and about 20 nm. In some embodiments, the gate spacer 712 can present a step-like sidewall at a junction between the gate spacer portions 712A and 712B, and the gate spacer 714 (or gate spacer portion 714A) can present a relatively smooth sidewall, as shown in FIG. 12A. However, it should be understood that the sidewalls of the gate spacers 712 and 714 can have any of various other profiles, which will be discussed with respect to FIGS. 18A-B, 19A-B, and 20A-C, while remaining within the scope of the present disclosure.

Figure 13A:
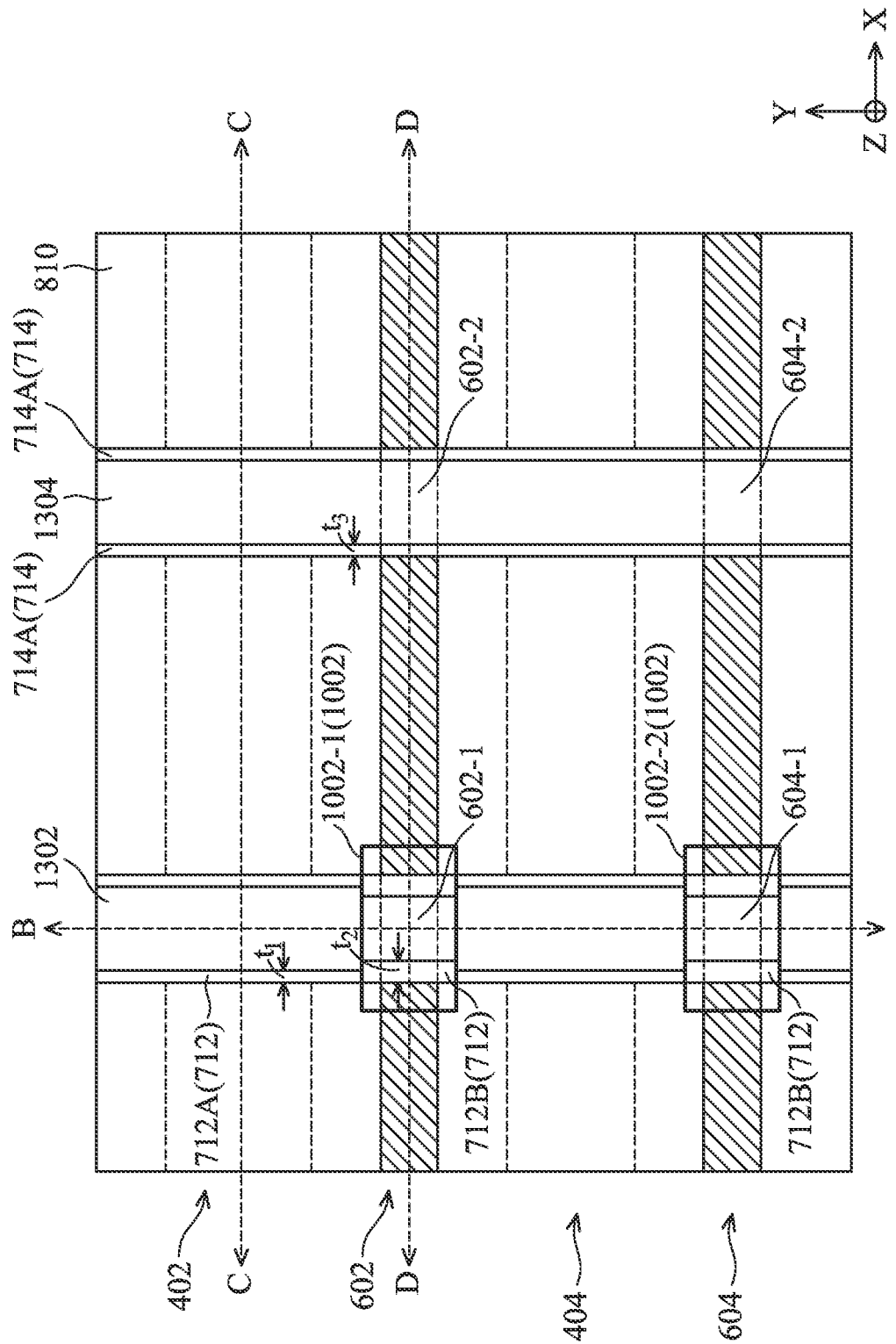
Figure 13B:
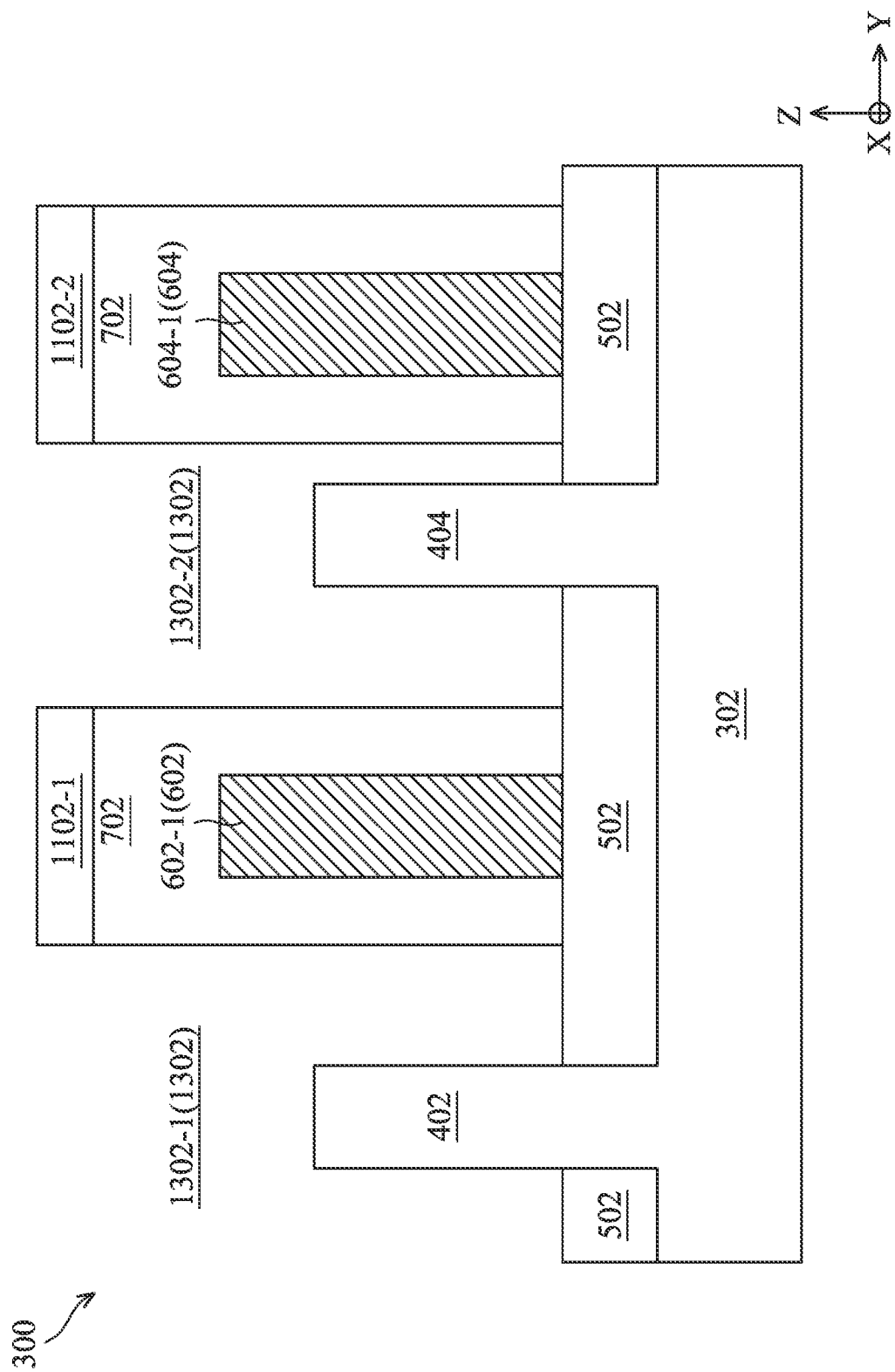
Figure 13C:
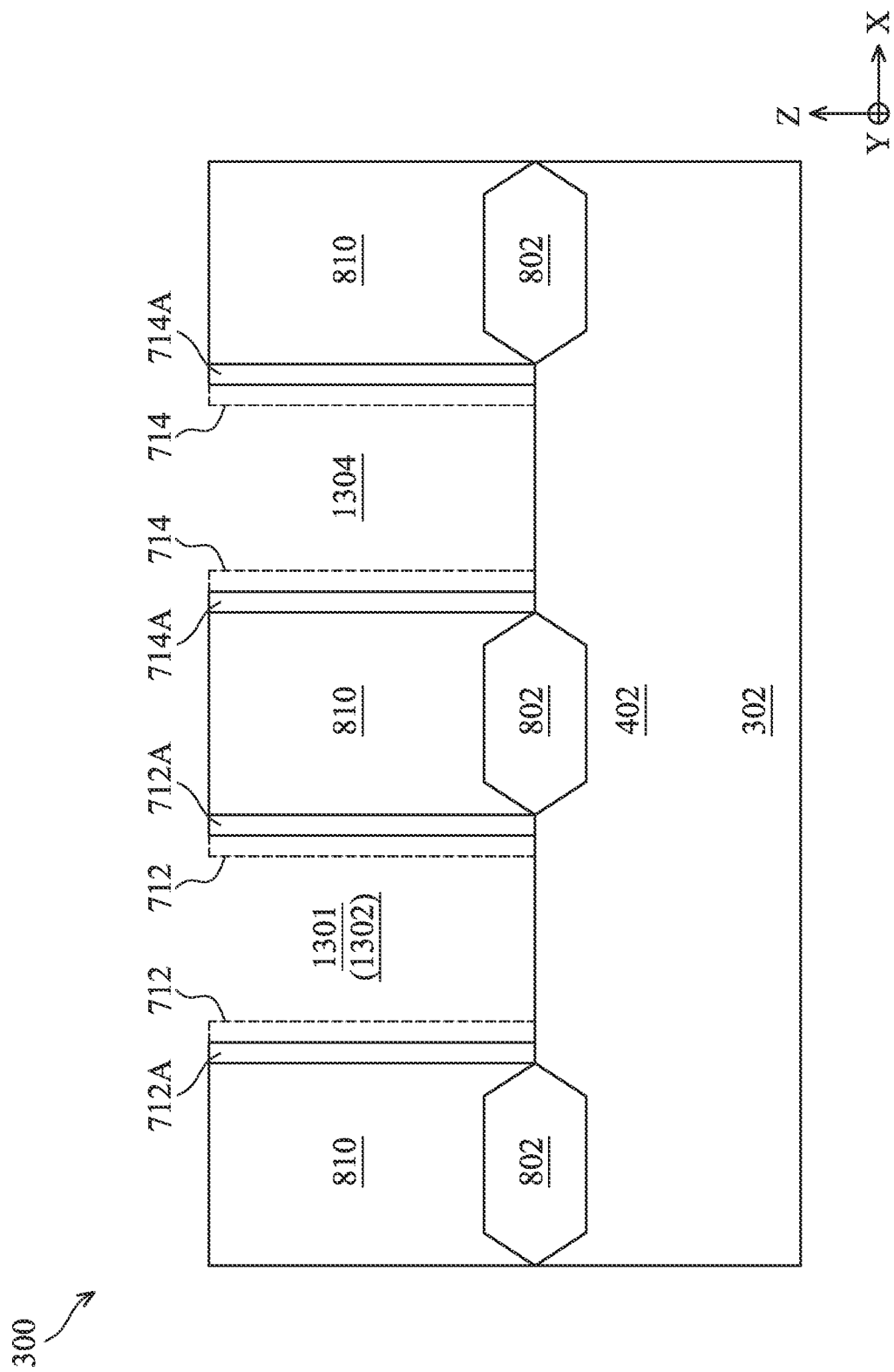
Figure 13D:
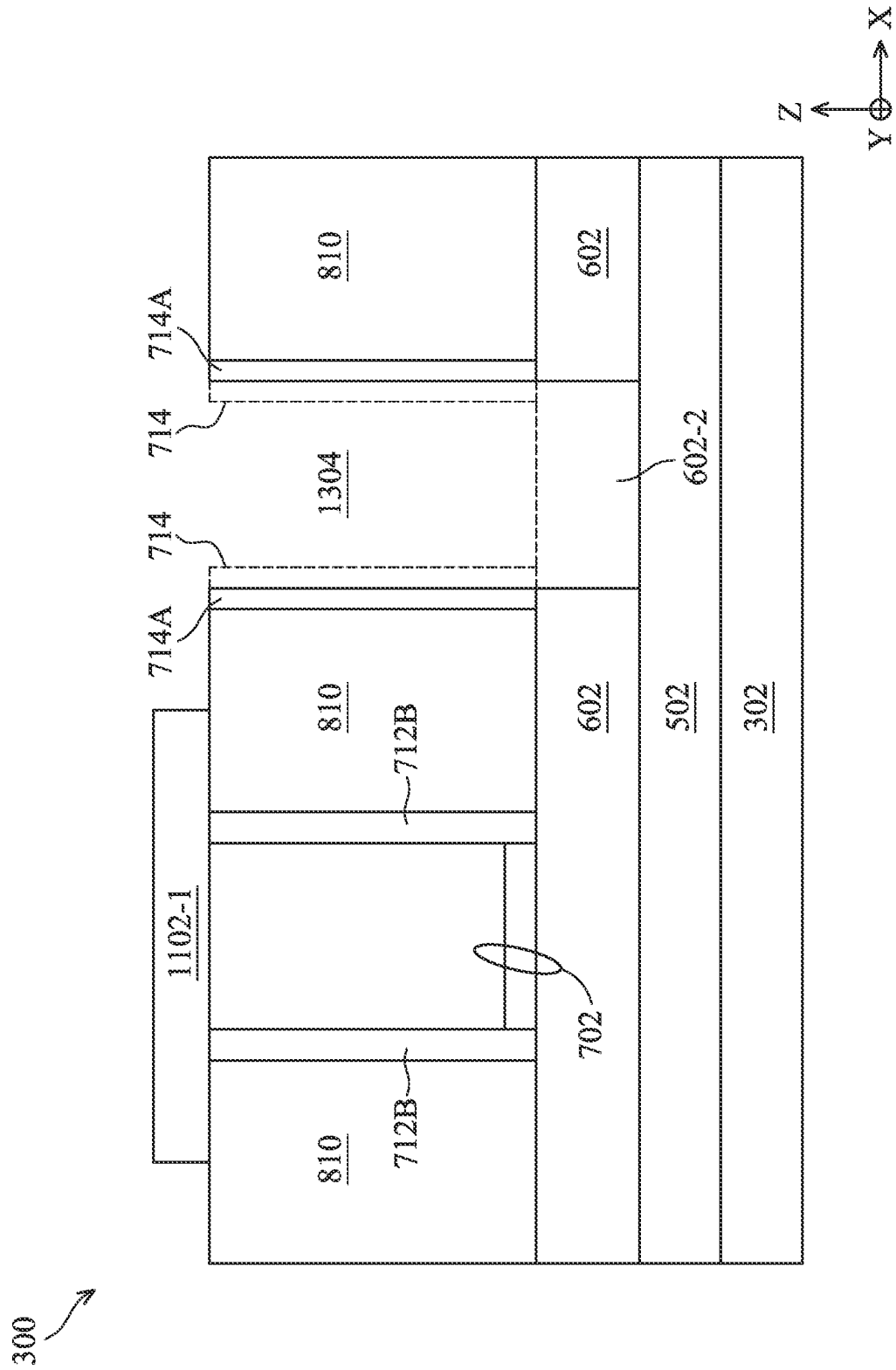

Also corresponding to operation 216 of FIG. 2, FIG. 13A is a cross-sectional view of the FinFET device 300 in which the dummy fins 602 and 604 are cut (or otherwise patterned) based on the mask layer 1002 (shown in FIGS. 10A-B) at one of the various stages of fabrication, in accordance with various embodiments. The cross-sectional view of FIG. 13A is cut along cross-section A-A, as indicated in FIG. 1. Further, FIG. 13B is a cross-sectional view of the FinFET device 300 cut in a direction along the lengthwise direction of an active/dummy gate structure of the FinFET device 300 (e.g., cross-section B-B indicated in FIG. 1 and FIG. 13A); FIG. 13C is a cross-sectional view of the FinFET device 300 cut in a direction along the lengthwise direction of a semiconductor fin of the FinFET device 300 (e.g., cross-section C-C indicated in FIG. 1 and FIG. 13A); and FIG. 13D is a cross-sectional view of the FinFET device 300 cut in a direction along the lengthwise direction of a dummy fin of the FinFET device 300 (e.g., cross-section D-D indicated in FIG. 1 and FIG. 13A).

With the mask layer 1002 (1002-1 and 1002-2) covering the workpiece, the dummy gate structure 704 and portions of the dummy gate structure 702 (that are not covered by the mask layer 1002) are first etched by a first etching process, which can at least partially form gate trenches 1302 and 1304. Upon etching the dummy gate structures 702-704 (with remaining portions of the dummy gate structure 702 covering the dummy fin portions 602-1 and 604-1, respectively, as shown in FIG. 13B), the gate trench 1304 can expose the dummy fin portions, 602-2 and 604-2. Next, such exposed dummy fin portions, 602-2 and 604-2, can be removed by a second etching process, with the dummy fin portions 602-1 and 604-1 remaining covered. As such, the gate trenches 1302 and 1304 can further extend toward the substrate 302. For example in FIG. 13D, the gate trench 1304 further extends toward the substrate 302 by removing the dummy fin portion 602-2. With the dummy fin portions 602-1 and 604-1 remaining substantially intact, the gate trench 1302 may be separated into a number of portions, 1302-1 and 1302-2, that are located over the semiconductor fins 402 and 404, respectively (as shown in FIGS. 13A-B), while the gate trench 1304 can continuously extend across the semiconductor fins 402 and 404 (as shown in FIG. 13A).

In accordance with various embodiments, during the formation of gate trenches 1302-1304, the gate spacers 712 and 714 may be consumed. As such, the gate spacer 714 and at least portions of the gate spacer 712 (that are not covered by the mask layer 1002) may be formed thinner. As illustrated in FIGS. 13's, portions of the gate spacer 712 that are not covered by the mask layer 1002 may be consumed (sometimes referred to as "gate spacer portion 712A") to present a thickness, $t_1$, (extending along the X axis), while the portion of the gate spacer 712 that is covered by the mask layer 1002 may not be consumed (sometimes referred to as "gate spacer portion 712B") to present a thickness, $t_2$, (extending along the X axis). The gate spacer 714 may be consumed (sometimes referred to as "gate spacer portion 714A") to present a universal thickness, $t_3$, (extending along the X axis). The thickness ($t_2$) is greater than any of the thicknesses ($t_1$ or $t_3$).

As a non-limiting example, each of $t_1$ through $t_3$ may range between about 1 nanometer (nm) and about 30 nm, while a difference between $t_1$ and $t_2/t_3$ may be between about 0.3 nm and about 20 nm. In some embodiments, the gate spacer 712 can present a step-like sidewall at a junction between the gate spacer portions 712A and 712B, and the gate spacer 714 (or the gate spacer portion 714A) can present a relatively smooth sidewall, as shown in FIG. 13A. However, it should be understood that the sidewalls of the gate spacers 712 and 714 can have any of various other profiles, which will be discussed with respect to FIGS. 18A-B, 19A-B, and 20A-C, while remaining within the scope of the present disclosure.

Figure 14A:
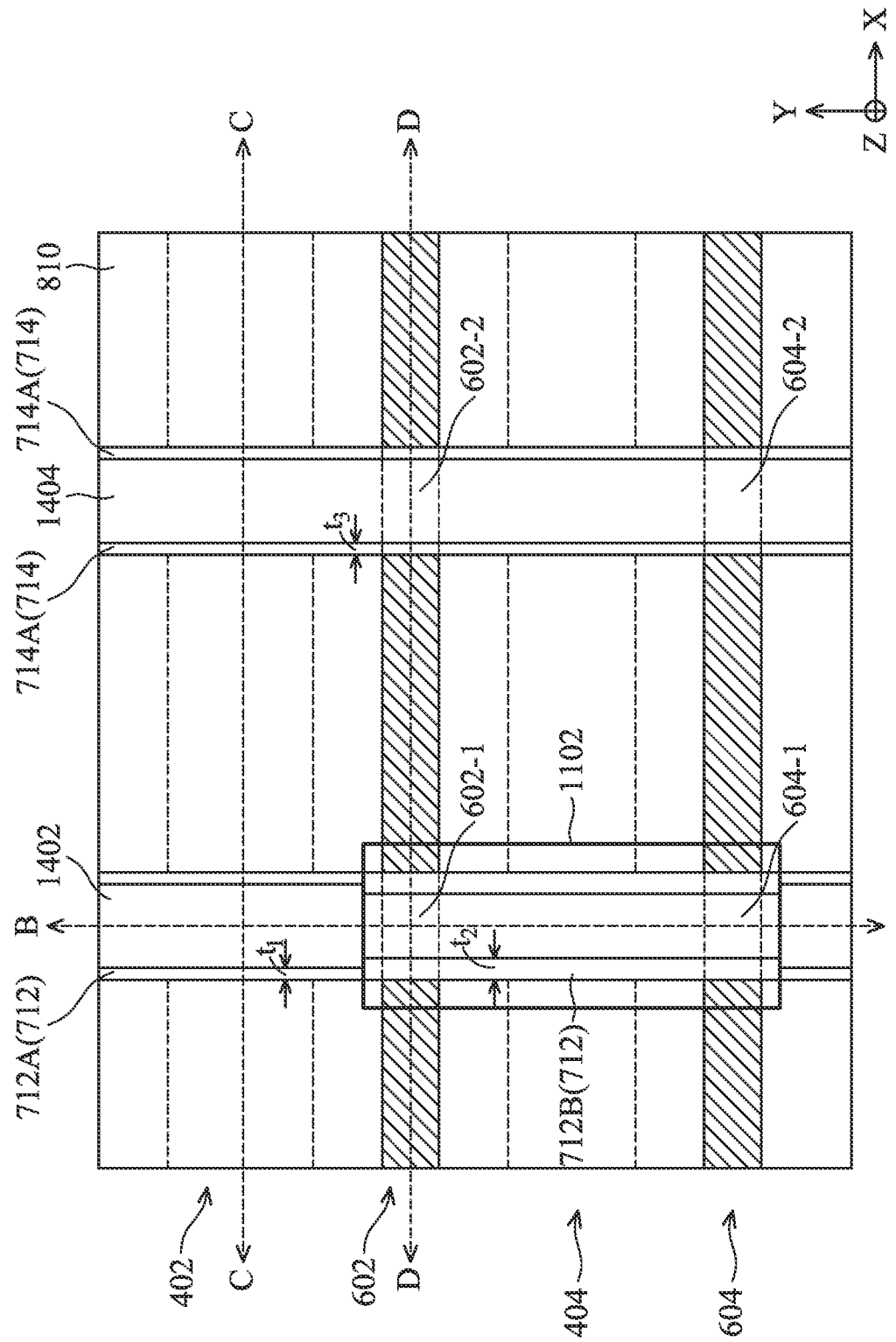
Figure 14B:
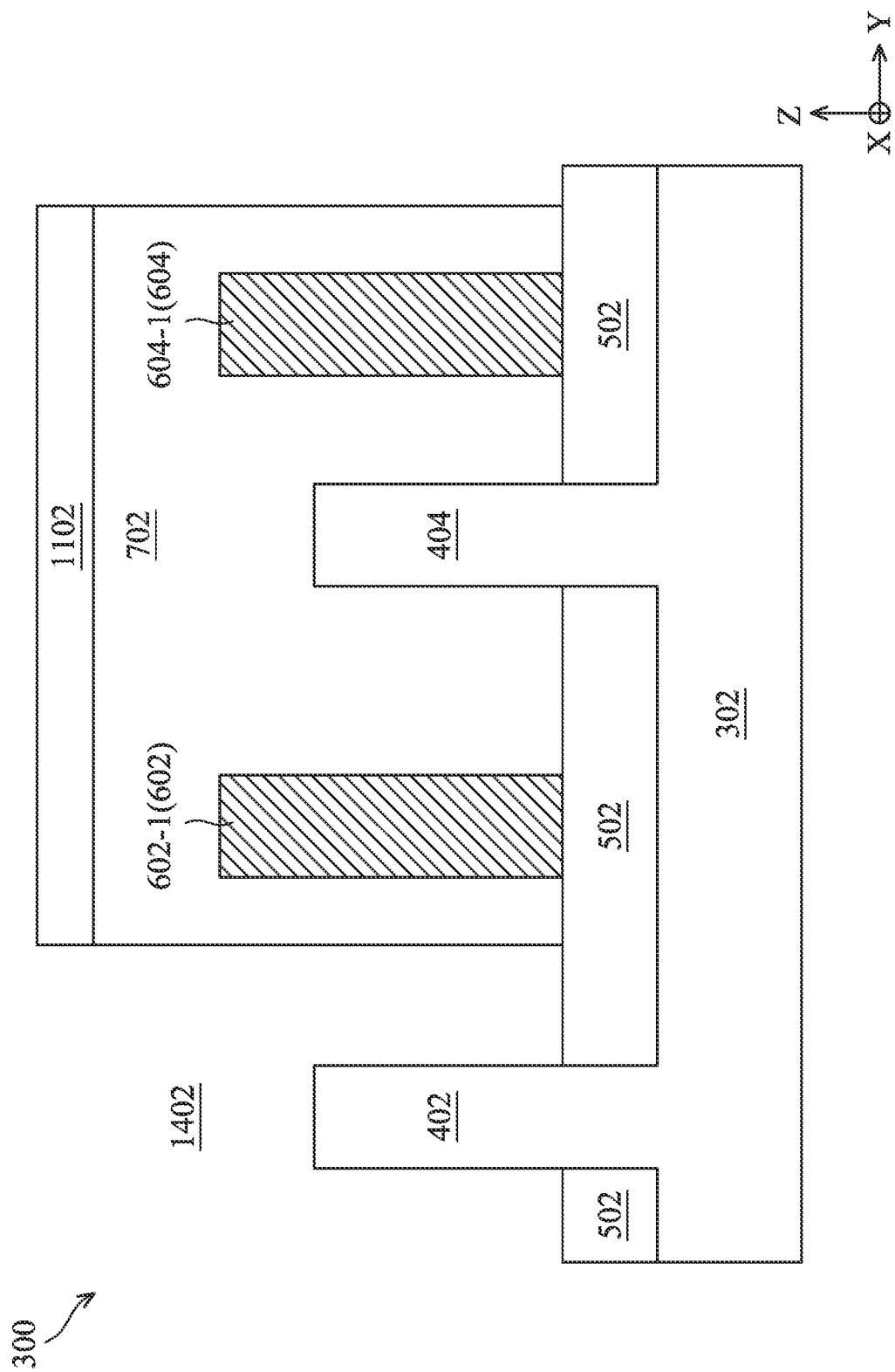
Figure 14C:
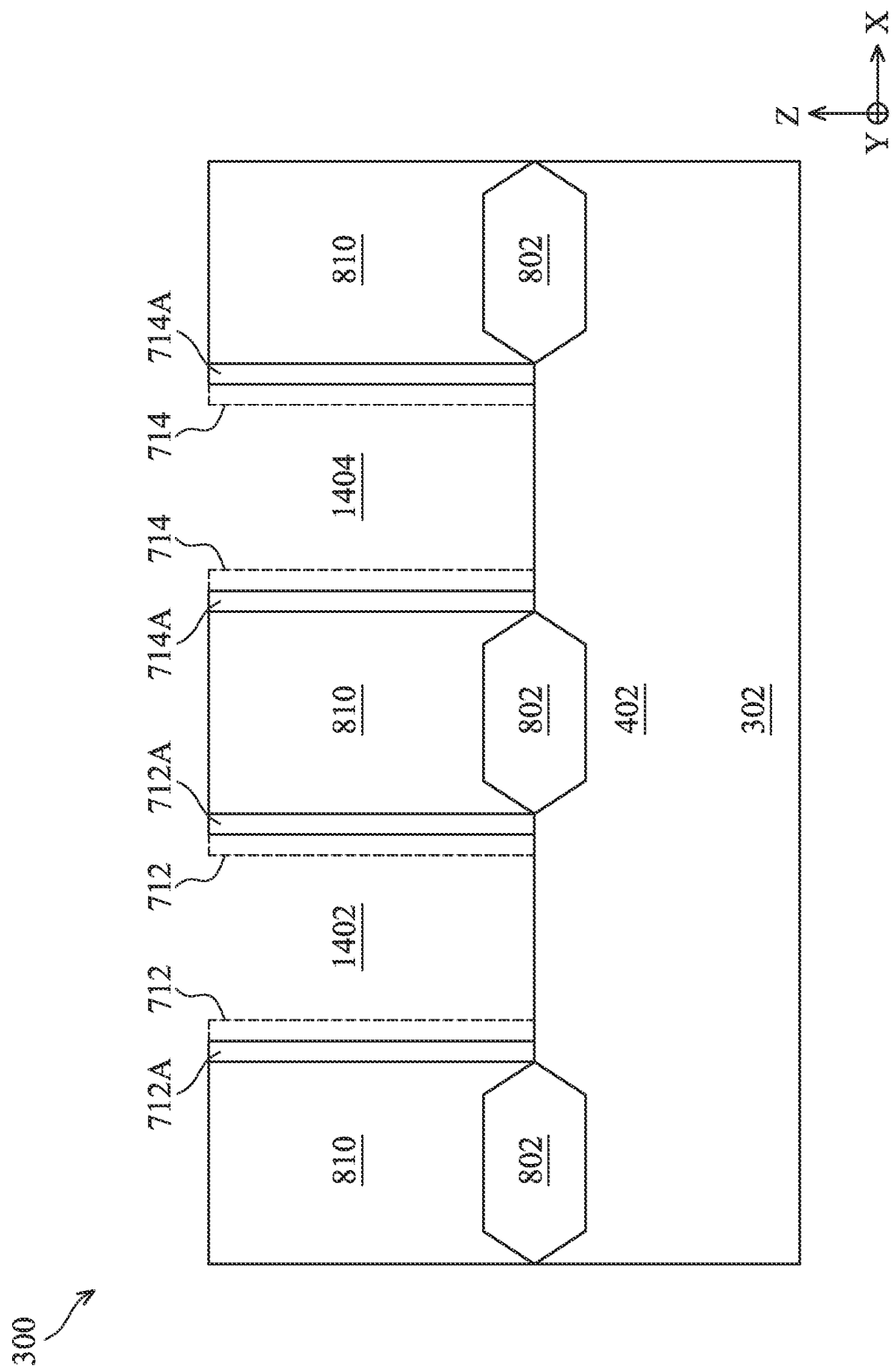
Figure 14D:
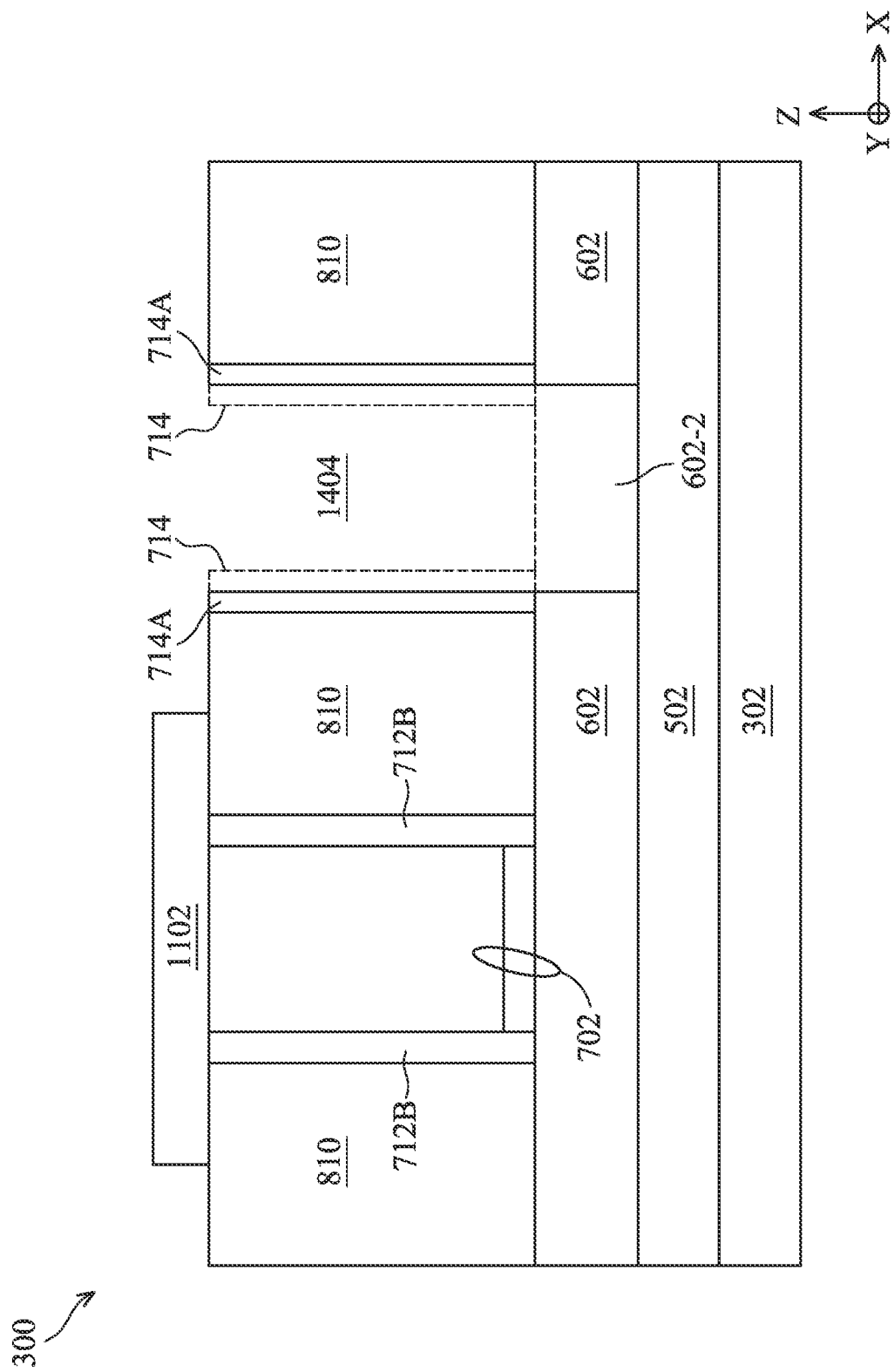

Also corresponding to operation 216 of FIG. 2, FIG. 14A is a cross-sectional view of the FinFET device 300 in which the dummy fins 602 and 604 are cut (or otherwise patterned) based on the mask layer 1102 (shown in FIGS. 11A-B) at one of the various stages of fabrication, in accordance with various embodiments. The cross-sectional view of FIG. 14A is cut along cross-section A-A, as indicated in FIG. 1. Further, FIG. 14B is a cross-sectional view of the FinFET device 300 cut in a direction along the lengthwise direction of an active/dummy gate structure of the FinFET device 300 (e.g., cross-section B-B indicated in FIG. 1 and FIG. 14A);

FIG. 14C is a cross-sectional view of the FinFET device 300 cut in a direction along the lengthwise direction of a semiconductor fin of the FinFET device 300 (e.g., cross-section C-C indicated in FIG. 1 and FIG. 14A); and FIG. 14D is a cross-sectional view of the FinFET device 300 cut in a direction along the lengthwise direction of a dummy fin of the FinFET device 300 (e.g., cross-section D-D indicated in FIG. 1 and FIG. 14A).

With the mask layer 1102 covering the workpiece, the dummy gate structure 704 and portions of the dummy gate structure 702 (that are not covered by the mask layer 1102) are first etched by a first etching process, which can at least partially form gate trenches 1402 and 1404. Upon etching the dummy gate structures 702-704 (with a remaining portion of the dummy gate structure 702 covering the dummy fin portions 602-1 and 604-1 and a portion of the semiconductor fin 404, as shown in FIG. 14B), the gate trench 1404 can expose the dummy fin portions, 602-2 and 604-2. Next, such exposed dummy fin portions, 602-2 and 604-2, can be removed by a second etching process, with the dummy fin portions 602-1 and 604-1 remaining covered. As such, the gate trenches 1402 and 1404 can further extend toward the substrate 302. For example in FIG. 14D, the gate trench 1404 further extends toward the substrate 302 by removing the dummy fin portion 602-2. With the dummy fin portions 602-1 and 604-1 remaining substantially intact, the gate trench 1402 may be located over the semiconductor fin 402 (as shown in FIGS. 14A-B), while the gate trench 1404 can continuously extend across the semiconductor fins 402 and 404 (as shown in FIG. 14A).

In accordance with various embodiments, during the formation of gate trenches 1402-1404, the gate spacers 712 and 714 may be consumed. As such, the gate spacer 714 and at least portions of the gate spacer 712 (that are not covered by the mask layer 1102) may be formed thinner. As illustrated in FIGS. 14's, portions of the gate spacer 712 that are not covered by the mask layer 1102 may be consumed (sometimes referred to as "gate spacer portion 712A") to present a thickness, $t_1$, (extending along the X axis), while the portion of the gate spacer 712 that is covered by the mask layer 1102 may not be consumed (sometimes referred to as "gate spacer portion 712B") to present a thickness, $t_2$, (extending along the X axis). The gate spacer 714 may be consumed (sometimes referred to as "gate spacer portion 714A") to present a universal thickness, $t_3$, (extending along the X axis). The thickness ($t_2$) is greater than any of the thicknesses ($t_1$ or $t_3$).

As a non-limiting example, each of $t_1$ through $t_3$ may range between about 1 nanometer (nm) and about 30 nm, while a difference between $t_1$ and $t_2/t_3$ may be between about 0.3 nm and about 20 nm. In some embodiments, the gate spacer 712 can present a step-like sidewall at a junction between the gate spacer portions 712A and 712B, and the gate spacer 714 (or gate spacer portion 714A) can present a relatively smooth sidewall, as shown in FIG. 14A. However, it should be understood that the sidewalls of the gate spacers 712 and 714 can have any of various other profiles, which will be discussed with respect to FIGS. 18A-B, 19A-B, and 20A-C, while remaining within the scope of the present disclosure.

In various embodiments, the first etching process (to etch the dummy gate structures) and the second etching process (to etch the dummy fins) can each include a plasma etching process. In such a plasma etching process (including radical plasma etching, remote plasma etching, and other suitable plasma etching processes), gaseous etchants such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gaseous etchants and combinations thereof can be used with passivation gases. The passivation gases can include nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the etchants and/or the passivation gases can be diluted with gases such as argon (Ar), helium (He), neon (Ne), and other suitable dilutive gases and combinations thereof.

The above-described etching conditions may change in accordance with a material of the dummy fins 602-604. For example, when the dummy fins 602-604 include aluminum oxide and/or hafnium oxide, the etchant gas may include chlorine ($Cl_2$) and/or boron trichloride ($BCl_3$), diluted with gases such as argon (Ar). In another example, when the dummy fins 602-604 include a silicon-based material (e.g., $Si_3N_4$, SiOCN), the etchant gas may include fluoroform ($CHF_3$), difluoromethane ($CH_2F_2$), fluoromethane ($CH_3F$), with passivation gases such as oxygen ($O_2$) and diluted with gases such as argon (Ar).

Figure 15A:
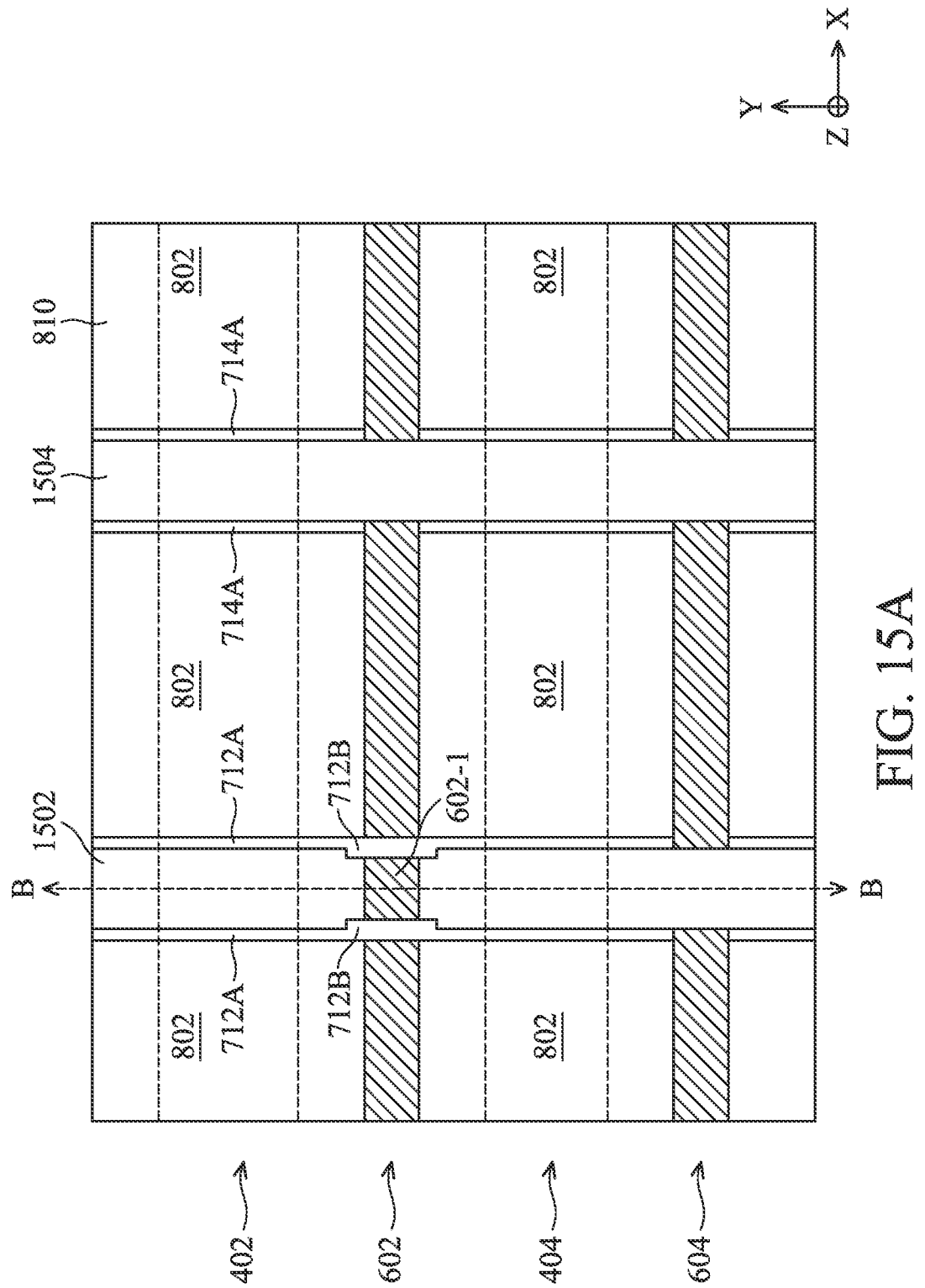
Figure 15B:
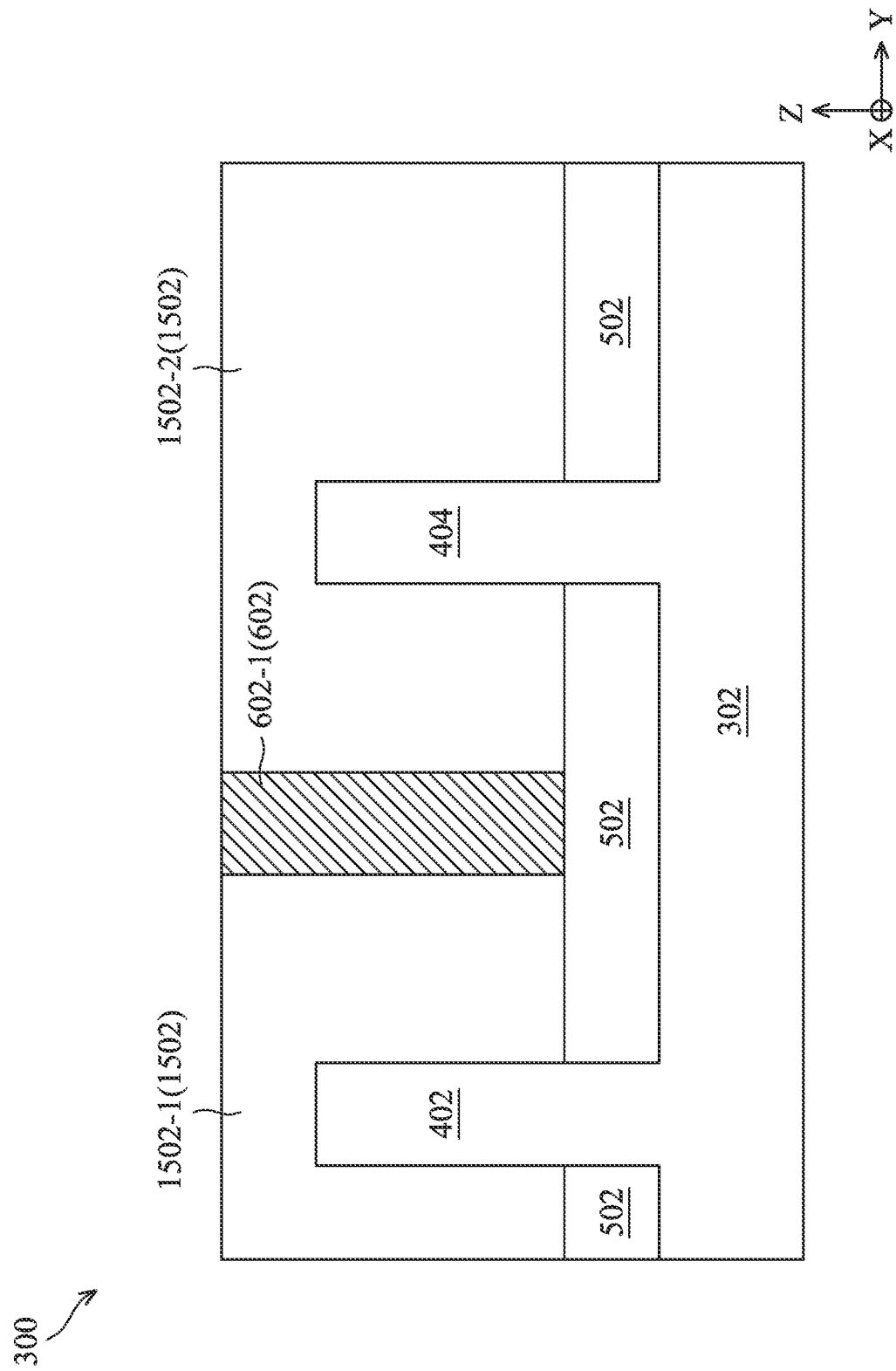

Corresponding to operation 218 of FIG. 2, FIG. 15A is a cross-sectional view of the FinFET device 300 including active gate structures 1502 and 1504 that respectively fill the gate trenches 1202 and 1204 (shown in FIGS. 12A-D) at one of the various stages of fabrication, in accordance with various embodiments. The cross-sectional view of FIG. 15A is cut along cross-section A-A, as indicated in FIG. 1. Further, FIG. 15B is a cross-sectional view of the FinFET device 300 cut in a direction along the lengthwise direction of an active/dummy gate structure of the FinFET device 300 (e.g., cross-section B-B indicated in FIG. 1 and FIG. 15A).

In various embodiments, the gate trenches 1202 and 1204 can be further extended by removing the remaining portion of the dummy gate structure 702 (that is covered by the mask layer 902, as shown in FIGS. 12's). The active gate structures 1502 and 1504 can be formed by filling the gate trenches 1202 and 1204, followed by a CMP process until a top surface of the remaining dummy fin portion is exposed. Accordingly, the active gate structures 1502 and 1504 can inherit the dimensions and profiles of the gate trenches 1202 and 1204, respectively, and the active gate structure 1502 can be cut (or otherwise separated) by the remaining dummy fin portion.

For example, the active gate structures 1502 and 1504 can each extend along a direction perpendicular to the lengthwise direction of the fins (e.g., the semiconductor fins 402-404, the dummy fins 602-604). Further, the active gate structure 1502 can include two portions, 1502-1 and 1502-2, separated by the (remaining) dummy fin portion 602-1, while the active gate structure 1504 can be formed as a continuous structure. The portion 1502-1 and 1502-2 of the active gate structure 1502 can overlay the semiconductor fins 402 and 404, respectively, and the active gate structure 1504 can overlay both the semiconductor fins 402 and 404. As mentioned above, the portions 1502-1 and 1502-2 of the active gate structure 1502 may sometimes be referred to as isolated gates, and the active gate structure 1504 may sometimes be referred to as a sharing gate.

By covering one or more portions of a dummy fin that are desired to remain (e.g., for cutting an active gate structure) with the disclosed mask layer, a gate spacer extending along opposite sidewalls of the active gate structure can have one or more corresponding portions, adjacent the covered dummy fin portions, that protrude from other portions of the gate spacer. Such a protruding portion can form a number of mesas along the sidewalls of the gate spacer, which forms a number of grooves along the sidewalls of the active gate structure accordingly. Depending on a width of the mask layer (extending along a lengthwise direction of the active gate structure), such a mesa can extend along the lengthwise direction of the active gate structure with a width similar to or wider than the dummy fin. For example in FIG. 15A, the gate spacer 712, extending along the active gate structure 1502 being cut, has the portion 712B adjacent the dummy fin portion 602-1 protrudes from the portion 712A. In comparison, the gate spacer 714A, extending along the active gate structure 1504 not being cut, is formed relatively smooth.

Figure 16A:
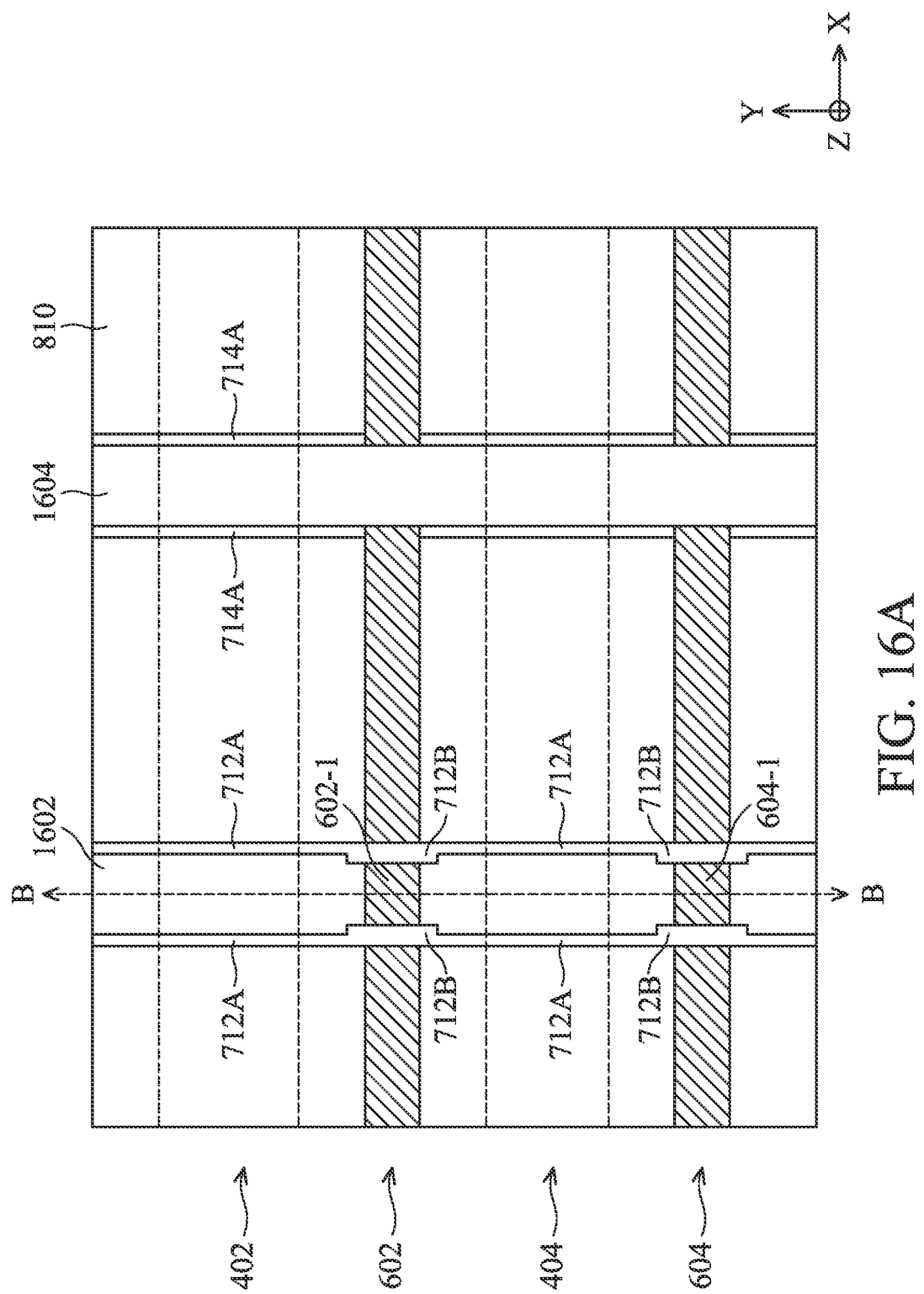
Figure 16B:
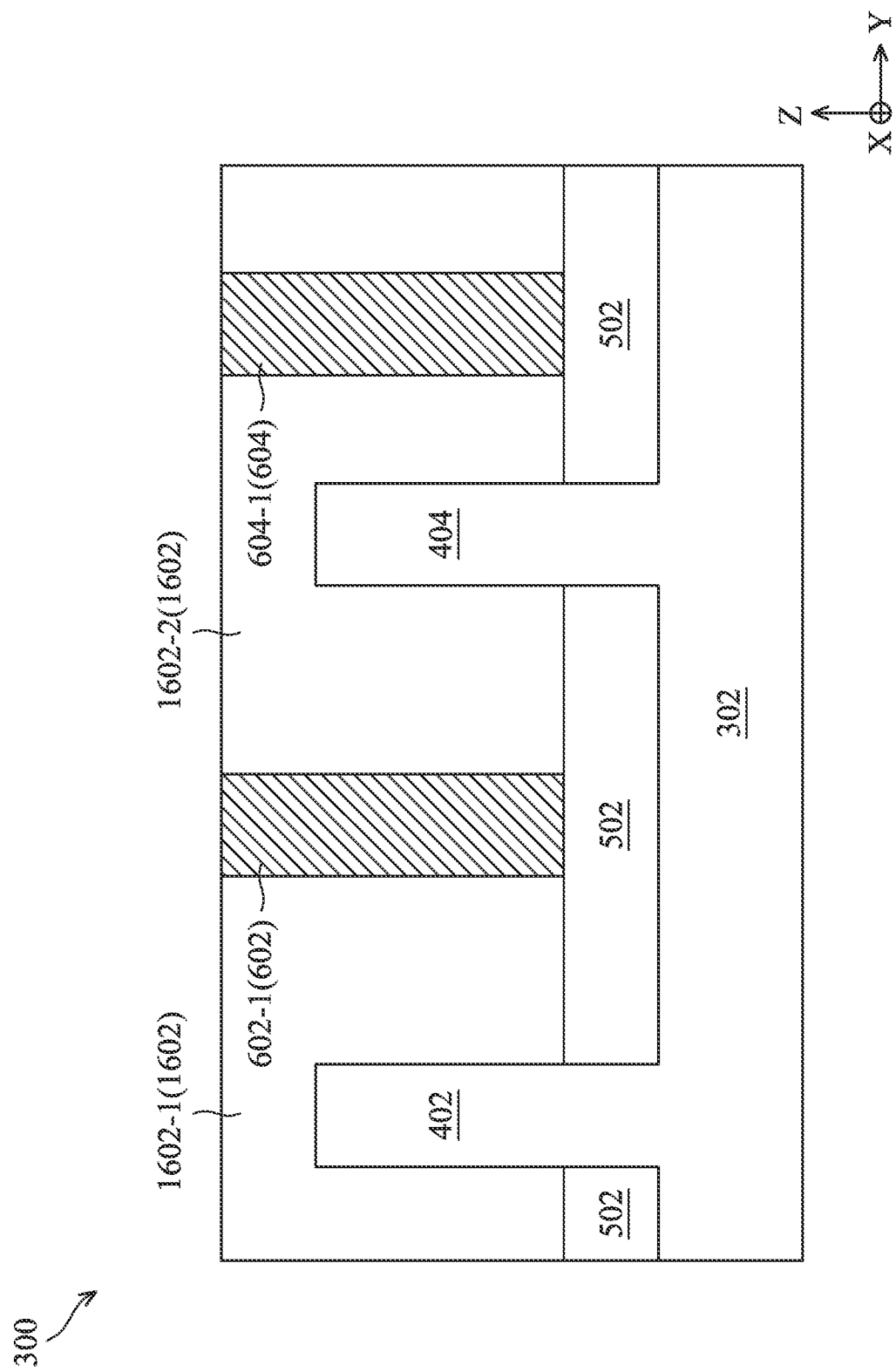

Also corresponding to operation 218 of FIG. 2, FIG. 16A is a cross-sectional view of the FinFET device 300 including active gate structures 1602 and 1604 that respectively fill the gate trenches 1302 and 1304 (shown in FIGS. 13A-D) at one of the various stages of fabrication, in accordance with various embodiments. The cross-sectional view of FIG. 16A is cut along cross-section A-A, as indicated in FIG. 1. Further, FIG. 16B is a cross-sectional view of the FinFET device 300 cut in a direction along the lengthwise direction of an active/dummy gate structure of the FinFET device 300 (e.g., cross-section B-B indicated in FIG. 1 and FIG. 16A).

In various embodiments, the gate trenches 1302 and 1304 can be further extended by removing the remaining portions of the dummy gate structure 702 (that are covered by the mask layer 1002, as shown in FIGS. 13's). The active gate structures 1602 and 1604 can be formed by filling the gate trenches 1302 and 1304, followed by a CMP process until a top surface of the remaining dummy fin portions is exposed. Accordingly, the active gate structures 1602 and 1604 can inherit the dimensions and profiles of the gate trenches 1302 and 1304, respectively, and the active gate structure 1602 can be cut (or otherwise separated) by the remaining dummy fin portions.

For example, the active gate structures 1602 and 1604 can each extend along a direction perpendicular to the lengthwise direction of the fins (e.g., the semiconductor fins 402-404, the dummy fins 602-604). Further, the active gate structure 1602 can include two portions, 1602-1 and 1602-2, separated by the (remaining) dummy fin portion 602-1, while the active gate structure 1604 can be formed as a continuous structure. The portion 1602-1 and 1602-2 of the active gate structure 1602 can overlay the semiconductor fins 402 and 404, respectively, and the active gate structure 1604 can overlay both the semiconductor fins 402 and 404. As mentioned above, the portions 1602-1 and 1602-2 of the active gate structure 1602 may sometimes be referred to as isolated gates, and the active gate structure 1604 may sometimes be referred to as a sharing gate.

By covering one or more portions of one or more dummy fins that are desired to remain (e.g., for cutting an active gate structure) with the disclosed mask layer, a gate spacer extending along opposite sidewalls of the active gate structure can have one or more corresponding portions, adjacent the covered dummy fin portions, that protrude from other portions of the gate spacer. Such a protruding portion can form a number of mesas along the sidewalls of the gate spacer, which forms a number of grooves along the sidewalls of the active gate structure accordingly. Depending on a width of the mask layer (extending along a lengthwise direction of the active gate structure), such a mesa can extend along the lengthwise direction of the active gate structure with a width similar to or wider than the dummy fin. For example in FIG. 16A, the gate spacer 712, extending along the active gate structure 1602 being cut, has the portions 712B adjacent the dummy fin portions 602-1 and 604-1, respectively, protrude from the portion 712A. In comparison, the gate spacer 714A, extending along the active gate structure 1604 not being cut, is formed relatively smooth.

Figure 17A:
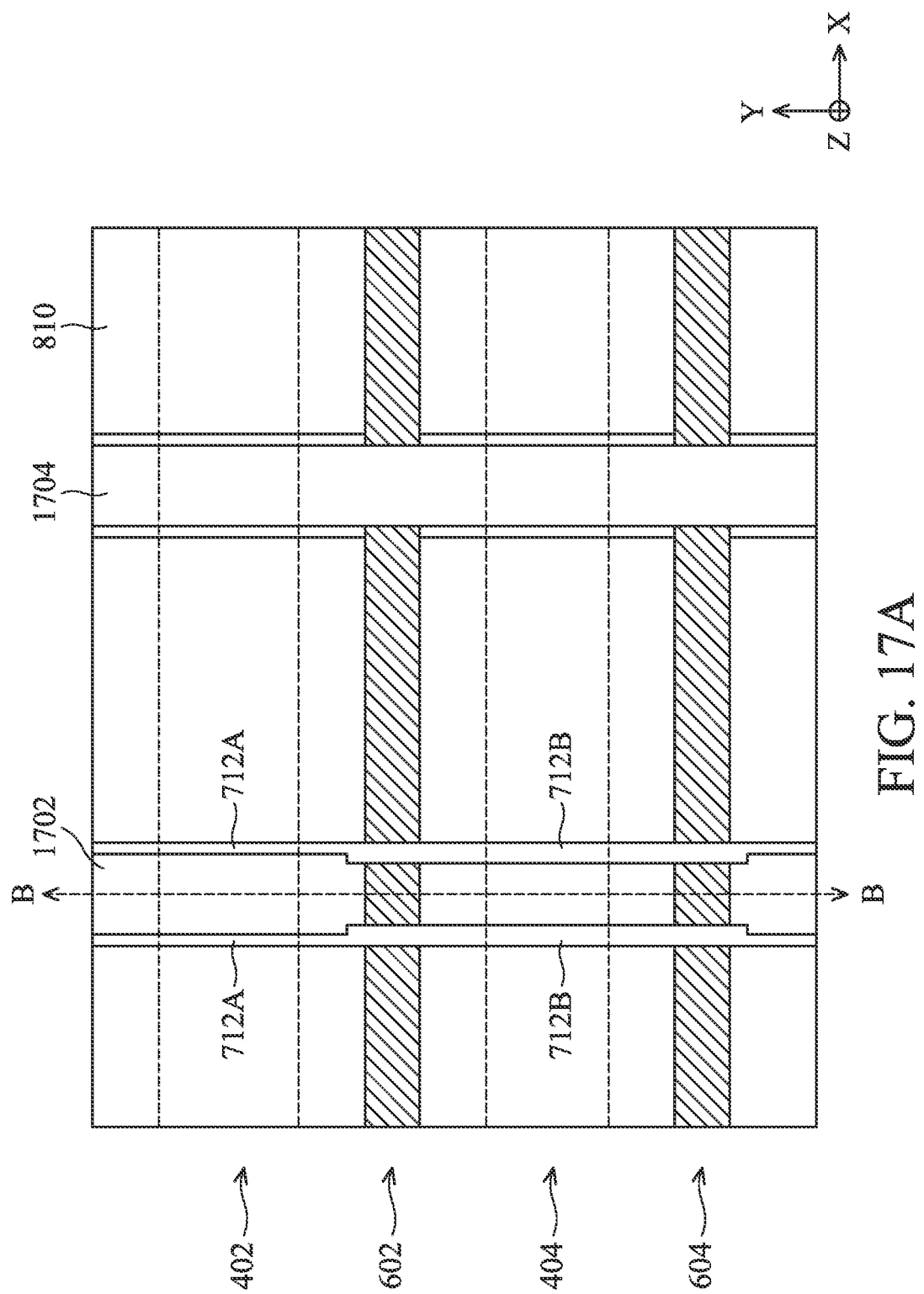
Figure 17B:
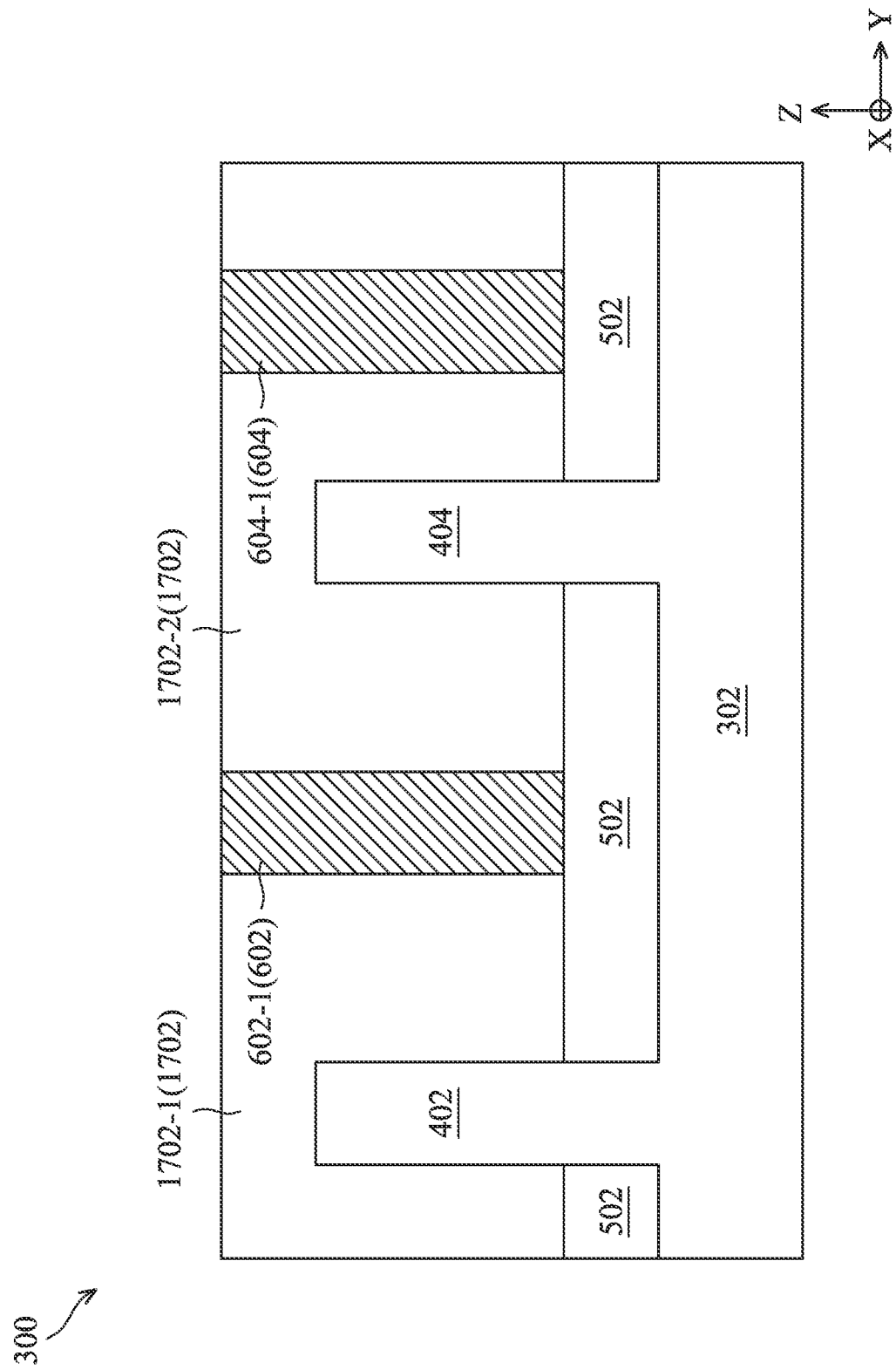

Also corresponding to operation 218 of FIG. 2, FIG. 17A is a cross-sectional view of the FinFET device 300 including active gate structures 1702 and 1704 that respectively fill the gate trenches 1402 and 1404 (shown in FIGS. 14A-D) at one of the various stages of fabrication, in accordance with various embodiments. The cross-sectional view of FIG. 17A is cut along cross-section A-A, as indicated in FIG. 1. Further, FIG. 17B is a cross-sectional view of the FinFET device 300 cut in a direction along the lengthwise direction of an active/dummy gate structure of the FinFET device 300 (e.g., cross-section B-B indicated in FIG. 1 and FIG. 17A).

In various embodiments, the gate trenches 1402 and 1404 can be further extended by removing the remaining portion of the dummy gate structure 702 (that is covered by the mask layer 1102, as shown in FIGS. 14's). The active gate structures 1702 and 1704 can be formed by filling the gate trenches 1402 and 1404, followed by a CMP process until a top surface of the remaining dummy fin portions is exposed. Accordingly, the active gate structures 1702 and 1704 can inherit the dimensions and profiles of the gate trenches 1402 and 1404, respectively, and the active gate structure 1702 can be cut (or otherwise separated) by the remaining dummy fin portions.

For example, the active gate structures 1702 and 1704 can each extend along a direction perpendicular to the lengthwise direction of the fins (e.g., the semiconductor fins 402-404, the dummy fins 602-604). Further, the active gate structure 1702 can include two portions, 1702-1 and 1702-2, separated by the (remaining) dummy fin portion 602-1, while the active gate structure 1704 can be formed as a continuous structure. The portion 1702-1 and 1702-2 of the active gate structure 1702 can overlay the semiconductor fins 402 and 404, respectively, and the active gate structure 1704 can overlay both the semiconductor fins 402 and 404. As mentioned above, the portions 1702-1 and 1702-2 of the active gate structure 1702 may sometimes be referred to as isolated gates, and the active gate structure 1704 may sometimes be referred to as a sharing gate.

By covering one or more portions of one or more dummy fins that are desired to remain (e.g., for cutting an active gate structure) with the disclosed mask layer, a gate spacer extending along opposite sidewalls of the active gate structure can have one or more corresponding portions, adjacent the covered dummy fin portions, that protrude from other portions of the gate spacer. Such a protruding portion can form a number of mesas along the sidewalls of the gate spacer, which forms a number of grooves along the sidewalls of the active gate structure accordingly. Depending on a width of the mask layer (extending along a lengthwise direction of the active gate structure), such a mesa can extend along the lengthwise direction of the active gate structure with a width similar to or wider than the dummy fin. For example in FIG. 17A, the gate spacer 712, extending along the active gate structure 1702 being cut, has the portions 712B adjacent the dummy fin portions 602-1 and 604-1, respectively, protrude from the portion 712A. In comparison, the gate spacer 714A, extending along the active gate structure 1704 not being cut, is formed relatively smooth.

The active gate structures 1502, 1504, 1602, 1604, 1702, and 1704 can each include a gate dielectric layer, a metal gate layer, and one or more other layers that are not shown for clarity. For example, each of the active gate structures may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layers each include silicon oxide, silicon nitride, or multilayers thereof. In example embodiments, the gate dielectric layers each include a high-k dielectric material, and in these embodiments, the gate dielectric layers may each have a k value greater than about 7.0, and may include a metal oxide or a silicate of Hf, Al, Zr, La, Mg, Ba, Ti, Pb, or combinations thereof. The formation methods of the gate dielectric layers may include molecular beam deposition (MBD), atomic layer deposition (ALD), PECVD, and the like. A thickness of each of the gate dielectric layers may be between about 8 angstroms (Å) and about 20 Å, as an example.

The metal gate layers may each be a P-type work function layer, an N-type work function layer, multi-layers thereof, or combinations thereof, in some embodiments. Accordingly, the metal gate layers may each be referred to as a work function layer, in some embodiments. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

Figure 18B:
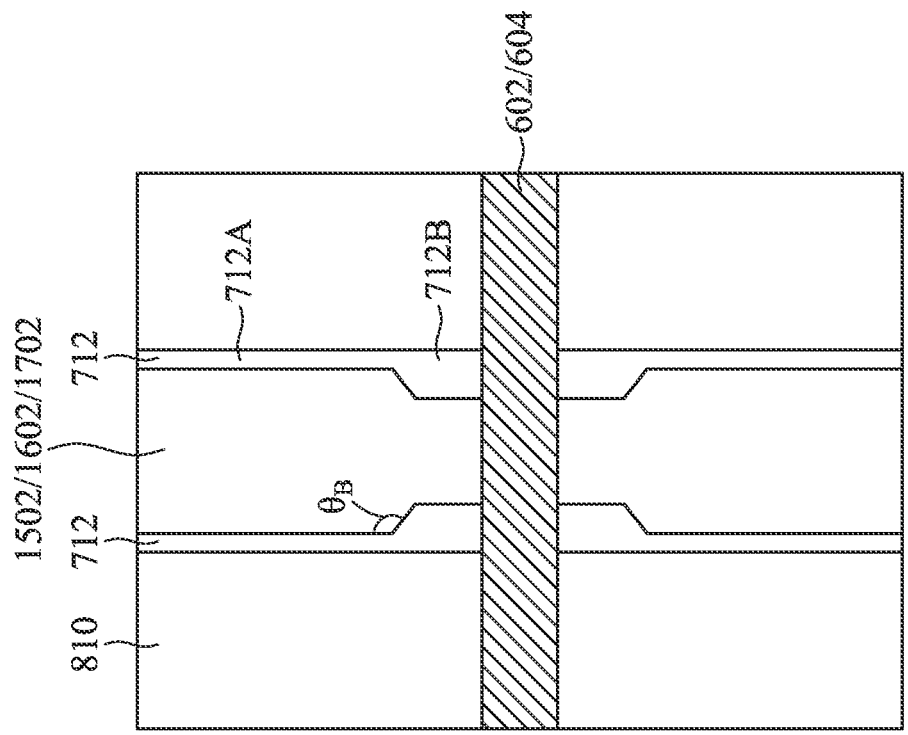
Figure 18A:
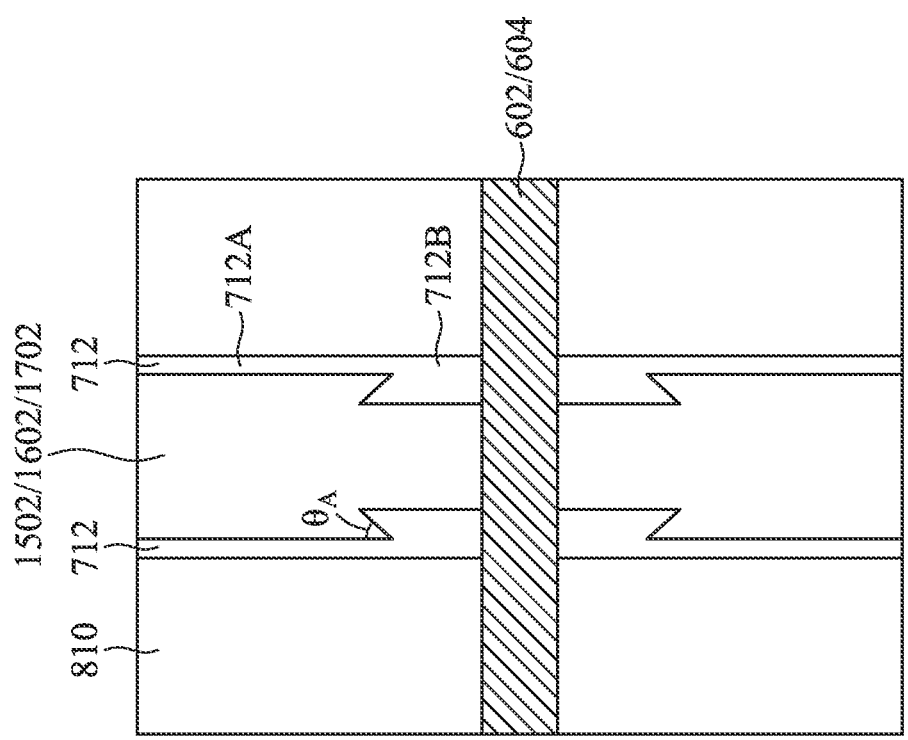

FIGS. 18A and 18B illustrate enlarged, cross-sectional views of the FinFET device 300, in other embodiments of the present disclosure. For example in FIG. 18A, the gate spacer 712 extending along the active gate structure being cut (e.g., 1502, 1602, 1702) can have a number of junctions, located between the portions 712A and 712B, that have an acute angle, OA. In FIG. 18B, the gate spacer 712 extending along the active gate structure being cut (e.g., 1502, 1602, 1702) can have a number of junctions, located between the portions 712A and 712B, that have an obtuse angle, OB.

FIGS. 19A and 19B illustrate enlarged, cross-sectional views of the FinFET device 300, in other embodiments of the present disclosure. For example in FIG. 19A, the gate spacer 714 (or 714A) extending along the active gate structure not being cut (e.g., 1504, 1604, 1704) can have a number of portions, with the dummy fins 602/604 protruding from its sidewall. In FIG. 19B, the gate spacer 714 (or 714A) extending along the active gate structure not being cut (e.g., 1504, 1604, 1704) can have a number of portions, with the dummy fins 602/604 recessing into its sidewall.

Figure 20A:
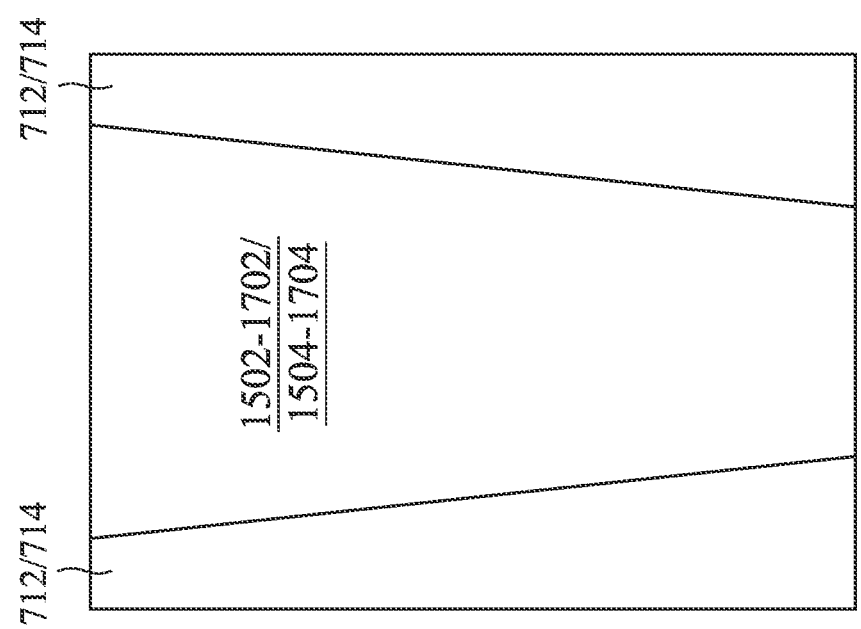
Figure 20B:
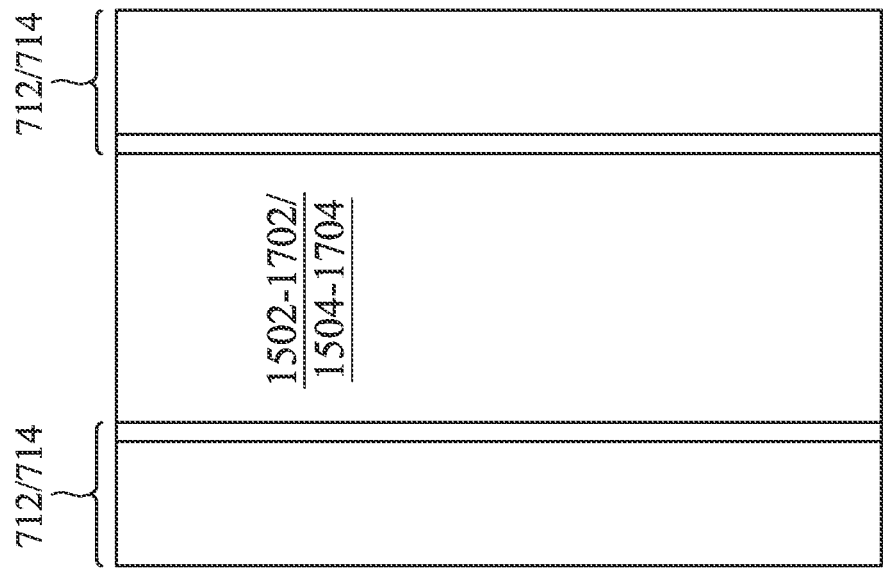
Figure 20C:
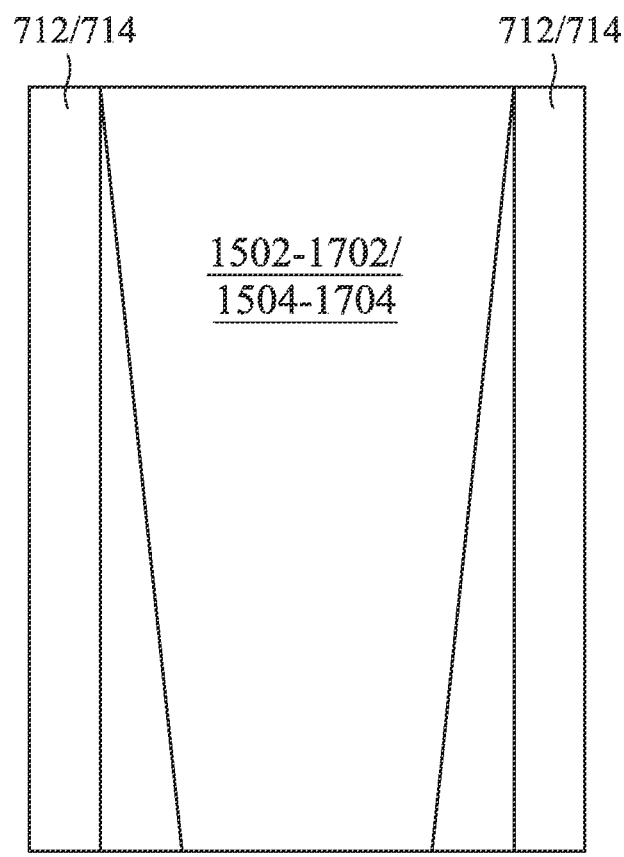

FIGS. 20A, 20B, and 20C illustrate enlarged, cross-sectional view of the FinFET device 300, in other embodiments of the present disclosure. For example in FIG. 20A, the gate spacer, either 712 or 714, that extends along an active gate structure (e.g., 1502, 1602, 1702, 1504, 1604, 1704) can have a tapered profile. In some embodiments, the gate spacer may be tapered to have a decreasing thickness, when extending away from a remaining dummy fin portion. In FIG. 20B, the gate spacer, either 712 or 714, that extends along an active gate structure (e.g., 1502, 1602, 1702, 1504, 1604, 1704) can have plural layers. Further in FIG. 20C, at least one of such plural layers can have a tapered profile, which has a decreasing thickness when extending away from a remaining dummy fin portion.

In one aspect of the present disclosure, a semiconductor device is disclosed. The semiconductor device includes a dielectric fin disposed between a first semiconductor channel and a second semiconductor channel. The dielectric fin, the first semiconductor channel, and the second semiconductor channel all extend along a first lateral direction. The semiconductor device includes a first gate structure that extends along a second lateral direction perpendicular to the first lateral direction. The first gate structure comprises a first portion and a second portion separated from each other by the dielectric fin. The semiconductor device includes a first gate spacer that extends along sidewalls of the first portion of the first gate structure. The semiconductor device includes a second gate spacer that extends along sidewalls of the second portion of the first gate structure. At least one of the first gate spacer or second gate spacer has a first portion with a first thickness and a second portion with a second thickness less than the first thickness, and wherein the first portion is closer to the dielectric fin than the second portion.

In another aspect of the present disclosure, a semiconductor device is disclosed. The semiconductor device includes a first dielectric fin extending along a first lateral direction. The semiconductor device includes a second dielectric fin extending along the first lateral direction. The semiconductor device includes a metal gate structure extending along a second lateral direction perpendicular to the first lateral direction. The metal gate structure has a plurality of portions separated from one another with the first and second dielectric fins. The semiconductor device includes a gate spacer extending along sidewalls of the metal gate structure. The gate spacer has at least a first thickness and a second thickness, and the first thickness is greater than the second thickness.

In yet another aspect of the present disclosure, a method for making a semiconductor device is disclosed. The method includes forming a dielectric fin that extends along a first lateral direction. The method includes forming a dummy gate structure across the dielectric fin. The dummy gate structure extends along a second lateral direction. The method includes forming a gate spacer that extends along sidewalls of the dummy gate structure. The method includes forming a mask layer covering a portion of the dielectric fin, with a portion of the dummy gate structure and a portion of the gate spacer disposed between the mask layer and the portion of the dielectric fin. The method includes replacing the dummy gate structure with an active gate structure. The active gate structure has a first portion and a second portion separated by the portion of the dielectric fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a dielectric fin disposed between a first semiconductor channel and a second semiconductor channel, wherein the dielectric fin, the first semiconductor channel, and the second semiconductor channel all extend along a first lateral direction;
a first gate structure that extends along a second lateral direction perpendicular to the first lateral direction, wherein the first gate structure comprises a first portion and a second portion separated from each other solely by the dielectric fin;
a first gate spacer that extends along sidewalls of the first portion of the first gate structure; and
a second gate spacer that extends along sidewalls of the second portion of the first gate structure;
wherein at least one of the first gate spacer or second gate spacer has a first portion with a first thickness and a second portion with a second thickness less than the first thickness, wherein the first portion is in contact with the dielectric fin while the second portion is not in contact with the dielectric fin, and wherein the dielectric fin extends beyond the first portion of the first gate spacer along the first lateral direction;
wherein a junction between the first portion and second portion of each of the first gate spacer and the second gate spacer is misaligned from a sidewall of the dielectric fin that faces the second direction.

2. The semiconductor device of claim 1, further comprising:
a second gate structure that extends along the second lateral direction, wherein the second gate structure straddles the dielectric fin; and
a third gate spacer that extends along sidewalls of the second gate structure, wherein the third gate spacer includes a first portion and a second portion separated by the dielectric fin.

3. The semiconductor device of claim 2, wherein the third gate spacer has a uniform thickness.

4. The semiconductor device of claim 2, wherein the second gate structure straddles both of the first and second semiconductor channels.

5. The semiconductor device of claim 1, wherein the first portion of the first gate structure straddles the first semiconductor channel, and the second portion of the first gate structure straddles the second semiconductor channel.

6. The semiconductor device of claim 1, wherein the junction between the first and second portions has a step-like profile.

7. The semiconductor device of claim 1, wherein each of the first gate spacer and second gate spacer has the first and second portions with different thicknesses, and wherein the second portions of the first and second gate spacers straddle the first and second semiconductor fins, respectively.

8. The semiconductor device of claim 1, wherein only the first gate spacer has the first and second portions with different thicknesses, and wherein the second portion of the first gate spacer straddles one of the first and second semiconductor fins.

9. The semiconductor device of claim 1, wherein a difference between the first and second thicknesses is between about 0.3 nanometers (nm) and about 20 nm.

10. A semiconductor device, comprising:
a first dielectric fin extending along a first lateral direction;
a second dielectric fin extending along the first lateral direction;
a metal gate structure extending along a second lateral direction perpendicular to the first lateral direction, wherein the metal gate structure has a plurality of portions separated from one another solely with the first and second dielectric fins; and
a gate spacer extending along sidewalls of the metal gate structure;
wherein the gate spacer has at least a first portion with a first thickness and a second portion with a second thickness, and wherein the first thickness is greater than the second thickness, wherein the first portion of the gate spacer is in contact with at least one of the first or second dielectric fin, while the second portion of the gate spacer is not in contact with any of the first or second dielectric fin, and wherein at least one of the first or second dielectric fin extends beyond the first portion of the gate spacer along the first lateral direction;
wherein a junction between the first portion and second portion of the gate spacer is misaligned from a sidewall of a corresponding one of the first and second dielectric fins that faces the second direction.

11. The semiconductor device of claim 10, wherein a difference between the first and second thicknesses is between about 0.3 nanometers (nm) and about 20 nm.

12. The semiconductor device of claim 10, wherein other portions of the gate spacer with the first thickness are located right next to opposite sidewalls of each of the first and second dielectric fins.

13. The semiconductor device of claim 12, wherein at least another portion of the gate spacer with the second thickness is located between the portions of the gate spacer with the first thickness.

14. The semiconductor device of claim 12, wherein other portions of the gate spacer with the second thickness are only located opposite one of the portions of the gate spacer with the first thickness from the first dielectric fin, and opposite another of the portions of the gate spacer with the first thickness from the second dielectric fin.

15. The semiconductor device of claim 10, further comprising a semiconductor fin disposed between the first and second dielectric fins, wherein the semiconductor fin extends along the first lateral direction, and wherein one of the portions of the metal gate structure straddles the semiconductor fin.

16. The semiconductor device of claim 15, wherein a portion of the gate spacer straddling the semiconductor fin has the second thickness.

17. The semiconductor device of claim 15, wherein a portion of the gate spacer straddling the semiconductor fin has the first thickness.

18. A semiconductor device, comprising:
a dielectric fin disposed between a first semiconductor channel and a second semiconductor channel, wherein the dielectric fin, the first semiconductor channel, and the second semiconductor channel all extend along a first lateral direction;

a gate structure that extends along a second lateral direction perpendicular to the first lateral direction, wherein the gate structure comprises a first portion and a second portion separated from each other solely by the dielectric fin;

a first gate spacer that extends along sidewalls of the first portion of the gate structure; and a second gate spacer that extends along sidewalls of the second portion of the gate structure;

wherein the first gate spacer has a first portion with a first thickness and a second portion with a second thickness less than the first thickness, the second gate spacer has a third portion with the first thickness and a fourth portion with the second thickness, wherein the second portion of the first gate spacer is located farther from the dielectric fin than the first portion of the first gate spacer along the second lateral direction, wherein the fourth portion of the second gate spacer is located farther from the dielectric fin than the third portion of the second gate spacer along the second lateral direction, and wherein the dielectric fin extends beyond the first portion of the first gate spacer and the third portion of the second gate spacer along the first lateral direction;

wherein a first junction between the first portion and second portion of the first gate spacer is misaligned from a first sidewall of the dielectric fin that faces the second direction, and wherein a second junction between the third portion and fourth portion of the second gate spacer is misaligned from a second sidewall of the dielectric fin that faces the second direction.

19. The semiconductor device of claim 18, wherein the first junction between the first and second portions of the first gate spacer has a step-like profile.

20. The semiconductor device of claim 18, wherein the second junction between the third and fourth portions of the second gate spacer has a step-like profile.

* * * * *